(12) United States Patent
Bhutta

(10) Patent No.: US 12,334,306 B2
(45) Date of Patent: Jun. 17, 2025

(54) RF IMPEDANCE MATCHING NETWORK

(71) Applicant: ASM America, Inc., Phoenix, AZ (US)

(72) Inventor: Imran Ahmed Bhutta, Moorestown, NJ (US)

(73) Assignee: ASM America, Inc., Phoenix, AZ (US)

( * ) Notice: Subject to any disclaimer, the term of this patent is extended or adjusted under 35 U.S.C. 154(b) by 731 days.

(21) Appl. No.: 17/534,924

(22) Filed: Nov. 24, 2021

(65) Prior Publication Data

US 2022/0084791 A1 Mar. 17, 2022

Related U.S. Application Data

(63) Continuation of application No. 17/182,902, filed on Feb. 23, 2021, now Pat. No. 11,189,466, which is a
(Continued)

(51) Int. Cl.
*H03H 7/38* (2006.01)
*H01G 7/00* (2006.01)
(Continued)

(52) U.S. Cl.
CPC ......... *H01J 37/32183* (2013.01); *H01G 7/00* (2013.01); *H01J 37/32935* (2013.01);
(Continued)

(58) Field of Classification Search
CPC .......... H01J 37/32183; H01J 37/32935; H01J 2237/327; H01J 2237/332;
(Continued)

(56) References Cited

U.S. PATENT DOCUMENTS 3,828,281 A 8/1974 Chambers
4,110,700 A 8/1978 Rosen et al.
(Continued)

FOREIGN PATENT DOCUMENTS

EP 0840349 5/1998
EP 0840350 5/1998
WO WO2006096589 9/2006

OTHER PUBLICATIONS

Navigator II Matching Networks with a Solid-State Technology Option, Advanced Energy Industries, Inc. 2012, Exhibit 106, pp. 1-1.
(Continued)

*Primary Examiner* — Minh D A
(74) *Attorney, Agent, or Firm* — The Belles Group, P.C.

(57) ABSTRACT

In one embodiment, an RF impedance matching circuit is disclosed. The matching circuit is coupled between a plasma chamber and an RF source. The matching circuit includes a first electronically variable capacitor (EVC) having a first variable capacitance, a terminal of the first EVC being operably coupled to the RF input, and a second EVC having a second variable capacitance, a terminal of the second EVC being operably coupled to the RF output. A control circuit determines, based on a first parameter, a first capacitance value for the first EVC and a second capacitance value for the second EVC. The control circuit then generates a control signal to alter the first and second variable capacitances accordingly. The alteration of the capacitances, while the frequency of the RF source is not altered, causes RF power reflected back to the RF source to decrease.

42 Claims, 31 Drawing Sheets

Related U.S. Application Data continuation of application No. 16/922,228, filed on Jul. 7, 2020, now Pat. No. 11,195,698, which is a continuation of application No. 16/665,778, filed on Oct. 28, 2019, now Pat. No. 10,707,057, which is a continuation of application No. 16/111,776, filed on Aug. 24, 2018, now Pat. No. 10,460,912, which is a continuation of application No. 15/637,271, filed on Jun. 29, 2017, now Pat. No. 10,431,428, which is a continuation-in-part of application No. 15/467,667, filed on Mar. 23, 2017, now Pat. No. 10,455,729, and a continuation-in-part of application No. 15/450,495, filed on Mar. 6, 2017, now Pat. No. 10,679,824, and a continuation-in-part of application No. 15/223,984, filed on Jul. 29, 2016, now Pat. No. 9,728,378, said application No. 15/450,495 is a continuation-in-part of application No. 15/196,821, filed on Jun. 29, 2016, now Pat. No. 10,699,880, said application No. 15/223,984 is a continuation-in-part of application No. 15/061,020, filed on Mar. 4, 2016, now Pat. No. 9,543,122, said application No. 15/467,667 is a continuation-in-part of application No. 14/982,244, filed on Dec. 29, 2015, now Pat. No. 10,454,453, said application No. 15/637,271 is a continuation-in-part of application No. 14/936,978, filed on Nov. 10, 2015, now Pat. No. 9,844,127, which is a continuation-in-part of application No. 14/935,859, filed on Nov. 9, 2015, now abandoned, said application No. 14/982,244 is a continuation-in-part of application No. 14/935,859, filed on Nov. 9, 2015, now abandoned, said application No. 15/637,271 is a continuation-in-part of application No. 14/788,888, filed on Jul. 1, 2015, now Pat. No. 9,697,991, and a continuation-in-part of application No. 14/702,900, filed on May 4, 2015, now Pat. No. 9,745,660, said application No. 15/061,020 is a continuation of application No. 14/700,209, filed on Apr. 30, 2015, now Pat. No. 9,345,122, said application No. 14/935,859 is a continuation-in-part of application No. 14/622,879, filed on Feb. 15, 2015, now abandoned, said application No. 14/788,888 is a continuation-in-part of application No. 14/622,879, filed on Feb. 15, 2015, now abandoned, which is a continuation-in-part of application No. 14/616,884, filed on Feb. 9, 2015, now Pat. No. 9,865,432, which is a continuation-in-part of application No. 14/594,262, filed on Jan. 12, 2015, now Pat. No. 9,496,122.

(60) Provisional application No. 62/312,070, filed on Mar. 23, 2016, provisional application No. 62/303,625, filed on Mar. 4, 2016, provisional application No. 62/185,998, filed on Jun. 29, 2015, provisional application No. 62/097,498, filed on Dec. 29, 2014, provisional application No. 62/077,753, filed on Nov. 10, 2014, provisional application No. 62/077,750, filed on Nov. 10, 2014, provisional application No. 62/019,591, filed on Jul. 1, 2014, provisional application No. 61/987,725, filed on May 2, 2014, provisional application No. 61/987,718, filed on May 2, 2014, provisional application No. 61/940,165, filed on Feb. 14, 2014, provisional application No. 61/940,139, filed on Feb. 14, 2014, provisional application No. 61/925,974, filed on Jan. 10, 2014.

(51) Int. Cl.
| | |
|---|---|
| *H01J 37/32* | (2006.01) |
| *H01L 21/02* | (2006.01) |
| *H01L 21/311* | (2006.01) |
| *H03H 11/28* | (2006.01) |
| *H05K 7/20* | (2006.01) |
| *H01L 23/473* | (2006.01) |

(52) U.S. Cl.
CPC .. *H01L 21/02274* (2013.01); *H01L 21/31116* (2013.01); *H03H 7/38* (2013.01); *H03H 11/28* (2013.01); *H05K 7/20609* (2013.01); *H01J 2237/327* (2013.01); *H01J 2237/332* (2013.01); *H01J 2237/334* (2013.01); *H01L 23/473* (2013.01)

(58) Field of Classification Search
CPC .............. H01J 2237/334; H01G 7/00; H01L 21/02274; H01L 21/31116; H01L 23/473; H03H 7/38; H03H 11/28; H05K 7/20609
See application file for complete search history.

(56) References Cited

U.S. PATENT DOCUMENTS

| | | |
|---|---|---|
| 4,679,007 A | 7/1987 | Reese et al. |
| 4,692,643 A | 9/1987 | Tokunaga et al. |
| 4,751,408 A | 6/1988 | Rambert |
| 4,929,855 A | 5/1990 | Ezzeddine |
| 5,012,123 A | 4/1991 | Ayasli et al. |
| 5,079,507 A | 1/1992 | Ishida et al. |
| 5,314,603 A | 5/1994 | Sugiyama et al. |
| 5,654,679 A | 8/1997 | Mavretic et al. |
| 5,815,047 A | 9/1998 | Sorensen et al. |
| 5,849,136 A | 12/1998 | Mintz et al. |
| 5,880,921 A | 3/1999 | Tham et al. |
| 5,889,252 A | 3/1999 | Williams et al. |
| 5,971,591 A | 10/1999 | Vona et al. |
| 6,046,641 A | 4/2000 | Chawla et al. |
| 6,137,367 A | 10/2000 | Ezzedine et al. |
| 6,252,354 B1 | 6/2001 | Collins et al. |
| 6,259,334 B1 | 7/2001 | Howald |
| 6,291,999 B1 | 9/2001 | Nishimori et al. |
| 6,305,316 B1 * | 10/2001 | DiVergilio ........ H01J 37/32174 118/723 AN |
| 6,400,012 B1 | 6/2002 | Miller et al. |
| 6,424,232 B1 | 7/2002 | Mavretic et al. |
| 6,472,822 B1 | 10/2002 | Chen et al. |
| 6,583,572 B2 | 6/2003 | Veltrop et al. |
| 6,621,372 B2 | 9/2003 | Kondo et al. |
| 6,657,395 B2 | 12/2003 | Windhorn |
| 6,677,828 B1 | 1/2004 | Harnett et al. |
| 6,703,080 B2 | 3/2004 | Reyzelman et al. |
| 6,791,274 B1 | 9/2004 | Hauer et al. |
| 6,794,951 B2 | 9/2004 | Finley |
| 6,818,562 B2 | 11/2004 | Todorow et al. |
| 6,887,339 B1 | 5/2005 | Goodman et al. |
| 6,888,313 B2 | 5/2005 | Blackburn et al. |
| 6,888,396 B2 | 5/2005 | Hajimiri et al. |
| 6,946,847 B2 | 9/2005 | Nishimori et al. |
| 6,967,547 B2 | 11/2005 | Pellegrini et al. |
| 7,004,107 B1 | 2/2006 | Raoux et al. |
| RE39,051 E | 3/2006 | Harnett |
| 7,071,786 B2 | 7/2006 | Inoue et al. |
| 7,095,178 B2 | 8/2006 | Nakano et al. |
| 7,113,761 B2 | 9/2006 | Bickham et al. |
| 7,122,965 B2 | 10/2006 | Goodman |
| 7,164,236 B2 | 1/2007 | Mitrovic et al. |
| 7,169,625 B2 | 1/2007 | Davis et al. |
| 7,199,678 B2 | 4/2007 | Matsuno |
| 7,251,121 B2 | 7/2007 | Bhutta |
| 7,298,091 B2 | 11/2007 | Pickard et al. |
| 7,298,128 B2 | 11/2007 | Bhutta |
| 7,304,438 B2 | 12/2007 | Kishinevsky |
| 7,328,126 B2 | 2/2008 | Chamness |

(56) References Cited

U.S. PATENT DOCUMENTS

| | | |
|---|---|---|
| 7,332,981 B2 | 2/2008 | Matsuno |
| 7,439,610 B2 | 10/2008 | Weigand |
| 7,480,571 B2 | 1/2009 | Howald et al. |
| 7,495,524 B2 | 2/2009 | Omae et al. |
| 7,498,908 B2 | 3/2009 | Gurov |
| 7,514,935 B2 | 4/2009 | Pankratz |
| 7,518,466 B2 | 4/2009 | Sorensen et al. |
| 7,535,312 B2 | 5/2009 | McKinzie, III |
| 7,602,127 B2 | 10/2009 | Coumou |
| 7,642,879 B2 | 1/2010 | Matsuno |
| 7,666,464 B2 | 2/2010 | Collins et al. |
| 7,714,676 B2 | 5/2010 | McKinzie, III |
| 7,728,602 B2 | 6/2010 | Valcore et al. |
| 7,745,955 B2 | 6/2010 | Kirchmeier et al. |
| 7,755,300 B2 | 7/2010 | Kishinevsky et al. |
| 7,764,140 B2 | 7/2010 | Nagarkatti et al. |
| 7,777,567 B2 | 8/2010 | Polizze |
| 7,796,368 B2 | 9/2010 | Kotani et al. |
| 7,839,223 B2 | 11/2010 | Van Zyl et al. |
| 7,852,170 B2 | 12/2010 | McKinzie, III |
| 7,863,996 B2 | 1/2011 | Cotter et al. |
| 7,868,556 B2 | 1/2011 | Xia |
| 7,872,523 B2 | 1/2011 | Sivakumar et al. |
| 7,917,104 B2 | 3/2011 | Manssen et al. |
| 7,969,096 B2 | 6/2011 | Chen |
| 8,008,982 B2 | 8/2011 | McKinzie, III |
| 8,010,084 B2 | 8/2011 | Turner |
| 8,031,926 B2 | 10/2011 | Sutko et al. |
| 8,040,068 B2 | 10/2011 | Coumou et al. |
| RE42,917 E | 11/2011 | Hauer et al. |
| 8,089,026 B2 | 1/2012 | Sellers |
| 8,102,954 B2 | 1/2012 | Coumou |
| 8,110,991 B2 | 2/2012 | Coumou |
| 8,203,859 B2 | 6/2012 | Omae et al. |
| 8,217,731 B2 | 7/2012 | McKinzie, III |
| 8,217,732 B2 | 7/2012 | McKinzie, III |
| 8,228,112 B2 | 7/2012 | Reynolds |
| 8,237,501 B2 | 8/2012 | Owen |
| 8,264,154 B2 | 9/2012 | Banner et al. |
| 8,278,909 B2 | 10/2012 | Fletcher |
| 8,289,029 B2 | 10/2012 | Coumou |
| 8,299,867 B2 | 10/2012 | McKinzie, III |
| 8,314,561 B2 | 11/2012 | Fisk et al. |
| 8,330,432 B2 | 12/2012 | Van Zyl et al. |
| 8,334,657 B2 | 12/2012 | Xia |
| 8,334,700 B2 | 12/2012 | Coumou et al. |
| 8,335,479 B2 | 12/2012 | Koya et al. |
| 8,344,559 B2 | 1/2013 | Van Zyl et al. |
| 8,344,801 B2 | 1/2013 | Owen et al. |
| 8,368,308 B2 | 2/2013 | Banna et al. |
| 8,368,469 B2 | 2/2013 | Mohammadi et al. |
| 8,395,322 B2 | 3/2013 | Coumou |
| 8,416,008 B2 | 4/2013 | Van Zyl et al. |
| 8,436,643 B2 | 5/2013 | Mason |
| 8,461,842 B2 | 6/2013 | Thuringer et al. |
| 8,466,736 B1 | 6/2013 | Reynolds |
| 8,487,706 B2 | 7/2013 | Li et al. |
| 8,502,689 B2 | 8/2013 | Chen et al. |
| 8,513,889 B2 | 8/2013 | Zhang et al. |
| 8,520,413 B2 | 8/2013 | Tran et al. |
| 8,536,636 B2 | 9/2013 | Englekirk |
| 8,552,665 B2 | 10/2013 | Larson et al. |
| 8,558,633 B2 | 10/2013 | McKinzie, III |
| 8,559,907 B2 | 10/2013 | Burgener et al. |
| 8,564,381 B2 | 10/2013 | McKinzie |
| 8,569,842 B2 | 10/2013 | Weis et al. |
| 8,576,010 B2 | 11/2013 | Yanduru |
| 8,576,013 B2 | 11/2013 | Coumou |
| 8,587,321 B2 | 11/2013 | Chen et al. |
| 8,620,236 B2 | 12/2013 | Manssen et al. |
| 8,624,501 B2 | 1/2014 | Nagarkatti et al. |
| 8,633,782 B2 | 1/2014 | Nagarkatti et al. |
| 8,638,159 B2 | 1/2014 | Ranta et al. |
| 8,649,754 B2 | 2/2014 | Burgener et al. |
| 8,659,335 B2 | 2/2014 | Nagarkatti et al. |
| 8,674,606 B2 | 3/2014 | Carter et al. |
| 8,680,928 B2 | 3/2014 | Jeon et al. |
| 8,686,796 B2 | 4/2014 | Presti |
| 8,710,926 B2 | 4/2014 | Nagarkatti et al. |
| 8,716,984 B2 | 5/2014 | Mueller et al. |
| 8,723,423 B2 | 5/2014 | Hoffman et al. |
| 8,742,669 B2 | 6/2014 | Carter et al. |
| 8,773,019 B2 | 7/2014 | Coumou et al. |
| 8,779,859 B2 | 7/2014 | Su et al. |
| 8,781,415 B1 | 7/2014 | Coumou et al. |
| 8,815,329 B2 | 8/2014 | Ilic et al. |
| 8,847,561 B2 | 9/2014 | Karlicek et al. |
| 8,884,180 B2 | 11/2014 | Ilic et al. |
| 8,884,525 B2 | 11/2014 | Hoffman et al. |
| 8,890,537 B2 | 11/2014 | Valcore, Jr. et al. |
| 8,912,835 B2 | 12/2014 | Nagarkatti et al. |
| 8,928,329 B2 | 1/2015 | Downing et al. |
| 9,083,343 B1 | 7/2015 | Li et al. |
| 9,190,993 B1 | 11/2015 | Li |
| 9,306,533 B1 | 4/2016 | Anton |
| 9,496,122 B1 | 11/2016 | Bhutta |
| 9,779,196 B2 | 10/2017 | Valcore, Jr. |
| 9,865,432 B1* | 1/2018 | Bhutta .............. H01L 21/31116 |
| 10,269,540 B1 | 4/2019 | Carter et al. |
| 10,340,879 B2 | 7/2019 | Mavretic et al. |
| 10,469,108 B2 | 11/2019 | Howald et al. |
| 10,483,090 B2 | 11/2019 | Bhutta et al. |
| 10,707,057 B2* | 7/2020 | Bhutta .............. H01L 21/02274 |
| 10,734,196 B2 | 8/2020 | Morrii et al. |
| 10,812,071 B2 | 10/2020 | Morii et al. |
| 2002/0048960 A1 | 4/2002 | Scanlan et al. |
| 2002/0060914 A1 | 5/2002 | Porter et al. |
| 2002/0185227 A1 | 12/2002 | MacGearailt |
| 2003/0007372 A1 | 1/2003 | Porter et al. |
| 2003/0046013 A1 | 3/2003 | Gerrish |
| 2006/0095232 A1 | 5/2006 | Purdy |
| 2006/0170367 A1 | 8/2006 | Bhutta |
| 2006/0198077 A1 | 9/2006 | Bhutta |
| 2006/0232471 A1 | 10/2006 | Coumou |
| 2007/0075784 A1 | 4/2007 | Pettersson et al. |
| 2007/0139122 A1 | 6/2007 | Nagarkatti et al. |
| 2008/0012548 A1 | 1/2008 | Gerhardt |
| 2008/0179948 A1 | 7/2008 | Nagarkatti et al. |
| 2008/0180179 A1 | 7/2008 | Polizzo |
| 2008/0197854 A1 | 8/2008 | Valcore et al. |
| 2008/0278721 A1 | 11/2008 | Bai et al. |
| 2009/0048792 A1 | 2/2009 | Turner |
| 2009/0207537 A1 | 8/2009 | Coumou |
| 2010/0001796 A1 | 1/2010 | Sivakumar et al. |
| 2010/0073104 A1 | 3/2010 | Cotter et al. |
| 2010/0123453 A1 | 5/2010 | Pauly et al. |
| 2010/0123502 A1 | 5/2010 | Bhutta et al. |
| 2010/0194195 A1 | 8/2010 | Coumou et al. |
| 2010/0201370 A1 | 8/2010 | Coumou et al. |
| 2010/0231296 A1 | 9/2010 | Nagarkatti et al. |
| 2011/0241781 A1 | 10/2011 | Owen et al. |
| 2011/0247696 A1 | 10/2011 | Zolock et al. |
| 2011/0291771 A1* | 12/2011 | Shannon ................ H03H 7/38 333/124 |
| 2012/0013253 A1 | 1/2012 | Coumou |
| 2012/0062322 A1 | 3/2012 | Owen |
| 2012/0188007 A1 | 7/2012 | Van Zyl et al. |
| 2012/0262064 A1 | 10/2012 | Nagarkatti et al. |
| 2013/0043854 A1 | 2/2013 | Tran et al. |
| 2013/0169359 A1 | 7/2013 | Coumou |
| 2013/0193867 A1 | 8/2013 | Van Zyl et al. |
| 2013/0207738 A1 | 8/2013 | Mason |
| 2013/0222055 A1 | 8/2013 | Coumou et al. |
| 2013/0257311 A1 | 10/2013 | Tran et al. |
| 2013/0278141 A1* | 10/2013 | Dorf ................ H01J 37/32082 315/111.41 |
| 2013/0314163 A1 | 11/2013 | Costa |
| 2013/0320853 A1 | 12/2013 | Carter et al. |
| 2014/0009248 A1 | 1/2014 | Granger-Jones |
| 2014/0028389 A1 | 1/2014 | Coumou |
| 2014/0028398 A1 | 1/2014 | Owen |
| 2014/0049250 A1 | 2/2014 | Brown et al. |
| 2014/0055034 A1 | 2/2014 | Coumou |
| 2014/0061156 A1 | 3/2014 | Brouk et al. |

(56) References Cited

U.S. PATENT DOCUMENTS

| | | |
|---|---|---|
| 2014/0062303 A1 | 3/2014 | Hoffman et al. |
| 2014/0091875 A1 | 4/2014 | Shimomoto et al. |
| 2014/0097908 A1 | 4/2014 | Fisk, II et al. |
| 2014/0117861 A1 | 5/2014 | Finley et al. |
| 2014/0117872 A1 | 5/2014 | Finley |
| 2014/0118031 A1 | 5/2014 | Rughoonundon et al. |
| 2014/0195033 A1* | 7/2014 | Lyndaker .......... H01J 37/32183 700/121 |
| 2014/0210345 A1 | 7/2014 | Hoffman |
| 2014/0210551 A1 | 7/2014 | Mueller |
| 2014/0218076 A1 | 8/2014 | Coumou et al. |
| 2014/0220913 A1 | 8/2014 | Coumou et al. |
| 2014/0231243 A1 | 8/2014 | Finley |
| 2014/0232266 A1 | 8/2014 | Finley et al. |
| 2014/0266492 A1 | 9/2014 | Radomski et al. |
| 2014/0306742 A1 | 10/2014 | Menzer et al. |
| 2014/0320013 A1 | 10/2014 | Coumou et al. |
| 2014/0367043 A1* | 12/2014 | Bishara ............ H01J 37/32165 315/111.21 |
| 2015/0115289 A1 | 4/2015 | Fursin et al. |
| 2015/0200079 A1 | 7/2015 | Bhutta |
| 2015/0303033 A1 | 10/2015 | Bhutta |
| 2015/0348854 A1 | 12/2015 | Kapoor et al. |
| 2016/0134260 A1 | 5/2016 | Bhutta et al. |
| 2016/0308560 A1 | 10/2016 | Howald et al. |
| 2017/0278677 A1 | 9/2017 | Nagami |
| 2017/0345620 A1 | 11/2017 | Coumou et al. |
| 2018/0076788 A1 | 3/2018 | Decker et al. |
| 2018/0151331 A1 | 5/2018 | Liu et al. |
| 2019/0267212 A1 | 8/2019 | Mavretic |
| 2019/0272978 A1 | 9/2019 | Bhutta et al. |
| 2019/0287764 A1 | 9/2019 | Long et al. |
| 2020/0144032 A1 | 5/2020 | Ulrich |
| 2020/0150164 A1 | 5/2020 | Ulrich |
| 2020/0185195 A1 | 6/2020 | Haga |
| 2020/0211824 A1 | 7/2020 | Morii |
| 2020/0212868 A1 | 7/2020 | Morii |
| 2020/0212869 A1 | 7/2020 | Morii |
| 2020/0212892 A1 | 7/2020 | Morii |
| 2020/0212893 A1 | 7/2020 | Morii |
| 2020/0303166 A1 | 9/2020 | Morii |
| 2020/0411285 A1 | 12/2020 | Mavretic |
| 2021/0013009 A1 | 1/2021 | Oliveti et al. |
| 2021/0020411 A1 | 1/2021 | Savas et al. |
| 2021/0082732 A1 | 3/2021 | Mutyala et al. |
| 2021/0111009 A1 | 4/2021 | Greunen et al. |
| 2021/0168081 A1* | 6/2021 | Gatchalian ......... G06Q 10/0631 |
| 2024/0194449 A1* | 6/2024 | Bhutta ................ H03H 7/40 |

OTHER PUBLICATIONS

Frenzel E. Louis, Jectronic Design, Back to Basics: Impedance Matching (Part 1), Advanced Energy Industries, Inc., Exhibit 1009, pp. 1-10.

Frenzel E. Louis, Jectronic Design, Back to Basics: Impedance Matching (Part 2), Advanced Energy Industries, Inc. Exhibit 1010, pp. 1-9.

Frenzel E. Louis, Jectronic Design, Back to Basics: Impedance Matching (Part 3), Advanced Energy Industries, Inc., Exhibit 1011, pp. 1-7.

Analog Devices, 10MHz, Four-Quadrant Multiplier/Divider AD734, Advanced Energy Industries, Inc., 2011, Exhibit 1018, pp. 1-20.

Analog Devices, Dual Ultrafast Voltage Comparator ADCMP566, Advanced Energy Industries, Inc., 2003, Exhibit 1019, pp. 1-16.

Analog Devices, 10-Bit, 105 MSPS/125 MSPS/150 MSPS, 1.8 V Dual Analog-to-Digital Converter AD9600, Advanced Energy Industries, Inc., 2007-2009, Exhibit 1020, pp. 1-72.

Analog Devices, LF-2.7 GHz RF/IF Gain and Phase Detector AD8302, Advanced Energy Industries, Inc., 2002, Exhibit 1021, pp. 1-24.

Todorow, Valentin., Impedance Matching and Matching Networks, Advanced Energy Industries, Inc., 2009, Exhibit 1008, pp. 1-27.

* cited by examiner

RF IMPEDANCE MATCHING NETWORK

CROSS REFERENCE TO RELATED APPLICATIONS

The present application is a continuation of U.S. patent application Ser. No. 17/182,902, filed Feb. 23, 2021, which is a continuation of U.S. patent application Ser. No. 16/922,228, filed Jul. 7, 2020, which is a continuation of U.S. patent application Ser. No. 16/665,778, filed Oct. 28, 2019, which is a continuation of U.S. patent application Ser. No. 16/111,776, filed Aug. 24, 2018, which is a continuation of U.S. patent application Ser. No. 15/637,271, filed Jun. 29, 2017, which is a continuation in part of U.S. patent application Ser. No. 15/467,667, filed Mar. 23, 2017, which is a continuation in part of U.S. patent application Ser. No. 14/982,244, filed Dec. 29, 2015, which is a continuation in part of U.S. patent application Ser. No. 14/935,859, filed Nov. 9, 2015, which is a continuation in part of U.S. patent application Ser. No. 14/622,879, filed Feb. 15, 2015, which is a continuation in part of U.S. patent application Ser. No. 14/616,884, filed Feb. 9, 2015, now U.S. Pat. No. 9,865,432, which is a continuation in part of U.S. patent application Ser. No. 14/594,262, filed Jan. 12, 2015, now U.S. Pat. No. 9,496,122, which claims the benefit of U.S. Provisional Patent Application No. 61/925,974, filed Jan. 10, 2014.

U.S. patent application Ser. No. 14/616,884 also claims the benefit of U.S. Provisional Patent Application No. 61/940,139, filed Feb. 14, 2014. U.S. patent application Ser. No. 14/622,879 also claims the benefit of U.S. Provisional Patent Application No. 61/940,165, filed Feb. 14, 2014. U.S. patent application Ser. No. 14/935,859 also claims the benefit of U.S. Provisional Patent Application No. 62/077,753, filed Nov. 10, 2014. U.S. patent application Ser. No. 14/982,244 also claims the benefit of U.S. Provisional Patent Application No. 62/097,498, filed Dec. 29, 2014. U.S. patent application Ser. No. 15/467,667 also claims the benefit of U.S. Provisional Patent Application No. 62/312,070 filed on Mar. 23, 2016.

U.S. patent application Ser. No. 15/637,271 is also a continuation in part of U.S. patent application Ser. No. 15/223,984, filed Jul. 29, 2016, now U.S. Pat. No. 9,728,378, which is a continuation in part of U.S. patent application Ser. No. 15/061,020, filed Mar. 4, 2016, now U.S. Pat. No. 9,543,122, which is a continuation of U.S. patent application Ser. No. 14/700,209, filed Apr. 30, 2015, now U.S. Pat. No. 9,345,122, which claims the benefit of U.S. Provisional Patent Application Ser. No. 61/987,718, filed May 2, 2014.

U.S. patent application Ser. No. 15/637,271 is also a continuation in part of U.S. patent application Ser. No. 14/702,900, filed May 4, 2015, now U.S. Pat. No. 9,745,660, which claims the benefit of U.S. Provisional Patent Application Ser. No. 61/987,725, filed May 2, 2014.

U.S. patent application Ser. No. 15/637,271 is also a continuation in part of U.S. patent application Ser. No. 14/788,888, filed Jul. 1, 2015, now U.S. Pat. No. 9,697,991, which claims the benefit of U.S. Provisional Patent Application Ser. No. 62/019,591, filed Jul. 1, 2014. U.S. patent application Ser. No. 14/788,888 is also a continuation in part of U.S. patent application Ser. No. 14/622,879, filed Feb. 15, 2015.

U.S. patent application Ser. No. 15/637,271 is also a continuation in part of U.S. patent application Ser. No. 14/936,978, filed Nov. 10, 2015, now U.S. Pat. No. 9,844,127, which claims the benefit of U.S. Provisional Patent Application Ser. No. 62/077,750, filed Nov. 10, 2014. U.S. patent application Ser. No. 14/936,978 is also a continuation in part of U.S. patent application Ser. No. 14/935,859.

U.S. patent application Ser. No. 15/637,271 is also a continuation in part of U.S. patent application Ser. No. 15/450,495, filed Mar. 6, 2017, which is a continuation in part of U.S. patent application Ser. No. 15/196,821, filed Jun. 29, 2016, which claims the benefit of U.S. Provisional Patent Application No. 62/185,998 filed on Jun. 29, 2015. U.S. patent application Ser. No. 15/450,495 also claims the benefit of U.S. Provisional Patent Application No. 62/303,625, filed Mar. 4, 2016.

The disclosures of the foregoing references are incorporated herein by reference in their entireties.

BACKGROUND

The semiconductor device fabrication process uses plasma processing at different stages of the fabrication process. Plasma processing involves energizing a gas mixture by imparting energy to the gas molecules by introducing RF (radio frequency) energy into the gas mixture. This gas mixture is typically contained in a vacuum chamber, referred to as a plasma chamber, and the RF energy is typically introduced into the plasma chamber through electrodes.

In a typical plasma process, the RF generator generates power at a radio frequency—which is broadly understood as being within the range of 3 kHz and 300 GHz—and this power is transmitted through RF cables and networks to the plasma chamber. In order to provide efficient transfer of power from the RF generator to the plasma chamber, an intermediary circuit is used to match the fixed impedance of the RF generator with the variable impedance of the plasma chamber. Such an intermediary circuit is commonly referred to as an RF impedance matching network, or more simply as an RF matching network.

The purpose of the RF matching network is to transform the variable plasma impedance to a value that more closely matches the fixed impedance of the RF generator. In many cases, particularly in semiconductor fabrication processes, the system impedance of the RF generator is fixed at 50 Ohms, and RF power is transmitted through coaxial cables which also have a fixed impedance of 50 Ohms. Unlike the impedance of the RF generator and the coaxial cables, the impedance of the plasma, which is driven by the RF power, varies. In order to effectively transmit RF power from the RF generator and the coaxial cables to the plasma chamber, the impedance of the plasma chamber must be transformed to non-reactive 50 Ohms (i.e., 50+j0). Doing so will help maximize the amount of RF power transmitted into the plasma chamber.

The typical RF matching network includes variable capacitors and a control circuit with a microprocessor to control the capacitance values of the variable capacitors. The value and size of the variable capacitors within the RF matching network are determined by the power handling capability, frequency of operation, and impedance range of the plasma chamber.

The predominant type of variable capacitor used in RF matching network applications is a Vacuum Variable Capacitor (VVC). The VVC is an electromechanical device, having two concentric metallic rings that are moved in relation to each other to change capacitance. In complex semiconductor fabrication processes using plasma chambers, where the impedance changes are often frequent, the frequent adjustments needing to be made to a VVC leads to mechanical failures, often within less than a year of use for individual VVCs. Failure of a VVC leads to downtime for fabrication equipment so that the failed VVC can be replaced. Due to a desire to eliminate points of mechanical failure in the semiconductor fabrication process, it is unsurprising that the VVCs in RF matching networks are one of the last electromechanical components that remain in wide use in the semiconductor fabrication process.

As semiconductor devices shrink in size and become more complex, the feature geometries become very small. As a result, the processing time for each individual step needed to fabricate these small features has likewise been reduced—typically in the range of 5~6 s. RF matching networks which use VVCs generally take in the range of 1~2 s to match the plasma chamber impedance to the RF generator impedance. During a significant amount of the matching process, which includes the microprocessor determining the capacitances for the VVCs needed to create the match, controlling the VVCs to the achieve the determined capacitances, and then finally time for the RF matching network circuits to stabilize with the new capacitances, the fabrication process parameters are unstable, and these unstable process parameters must be accounted for as part of the overall fabrication process. Because the matching process time is becoming a more and more significant part of the time for each fabrication process step, the period in which process parameters are unstable becomes more of a factor in the overall fabrication process.

While Electronically Variable Capacitor (EVC) technology is known (see U.S. Pat. No. 7,251,121, the disclosure of which is incorporated herein by reference in its entirety), it has yet to be developed into an industry-accepted replacement for VVCs. However, because an EVC is purely an electronic device, an EVC is not a one-for-one replacement for a VVC in an RF matching network. Further advancements are therefore needed to more fully take advantage of using EVCs as part of an RF matching network.

For example, further advancements are needed in determining the capacitances necessary for an impedance match. A typical RF matching network based on VVCs uses information gathered from a power sensor to determine whether it has matched the input impedance to the desired impedance (e.g., 50 Ohms) or not. The power sensor can be a phase/magnitude detector, a directional coupler, or a voltage/current sensor.

In the case of a phase/magnitude detector, the detector is set such that when the input impedance is tuned to the desired impedance (e.g., 50 Ohms) the error signal out of the phase/magnitude detector goes to a minimum. In this case, the control circuitry of the RF matching network is designed such that it moves the VVC capacitors to bring the error signals out of the phase/magnitude detector to minimum. Once that state is reached, the RF matching network is considered tuned.

In the case of a directional coupler, the coupler is set such that when the reflected power is minimum, its reflected port shows a minimum signal. In this case, the control circuitry of the RF matching network is designed such that it moves the VVC capacitors to bring the reflected port signal to a minimum. Once that state is reached, the RF matching network is considered tuned.

The case of a voltage/current sensor is similar to a directional coupler. In this case, the voltage and current signals along with the phase angle information between the voltage and current signals is used by the control circuitry to first calculate the impedances and then the reflected power or reflection coefficient or simply the reflected power and/or the reflection coefficient. In this case, the control circuitry of the RF matching network is designed such that it moves the VVC capacitors to bring the calculated reflected power or the calculated reflection coefficient to a minimum. Once that state is reached, the RF matching network is considered tuned. These approaches, however, are time consuming in an industry where speed is of increasing value.

Further, there is need for improved control of the capacitance provided by the EVC, which in turn provides improved control of impedance matching.

BRIEF SUMMARY

The present disclosure may be directed, in one aspect, to a radio frequency (RF) impedance matching circuit comprising an RF input configured to operably couple to an RF source providing an RF signal having a frequency; an RF output configured to operably couple to a plasma chamber; a first electronically variable capacitor (EVC) having a first variable capacitance, a terminal of the first EVC being operably coupled to the RF input; a second EVC having a second variable capacitance, the second EVC being separate and distinct from the first EVC, and a terminal of the second EVC being operably coupled to the RF output; and a control circuit operably coupled to the first and second EVCs to control the first variable capacitance and the second variable capacitance, wherein the control circuit is configured to: determine, based on a first parameter related to the plasma chamber, both a first capacitance value for the first EVC and a separate second capacitance value for the second EVC; and generate a control signal to alter the first variable capacitance and the second variable capacitance to the first capacitance value and the second capacitance value, respectively; wherein the alteration of the first variable capacitance and the second variable capacitance, while the frequency of the RF source is not altered, causes RF power reflected back to the RF source to decrease.

In another aspect, a method of matching an impedance includes coupling an impedance matching circuit between an RF source and a plasma chamber, the impedance matching circuit comprising: an RF input configured to operably couple to the RF source providing an RF signal having a frequency; an RF output configured to operably couple to the plasma chamber; a first EVC having a first variable capacitance, a terminal of the first EVC being operably coupled to the RF input; and a second EVC having a second variable capacitance, the second EVC being separate and distinct from the first EVC, and a terminal of the second EVC being operably coupled to the RF output; determining, based on a first parameter related to the plasma chamber, both a first capacitance value for the first EVC and a separate second capacitance value for the second EVC; and while the frequency of the RF source is not altered, altering the first variable capacitance and the second variable capacitance to the first capacitance value and the second capacitance value, respectively, wherein the alteration of the first variable capacitance and the second variable capacitance causes RF power reflected back to the RF source to decrease while the frequency of the RF source is not altered.

In another aspect, a method of fabricating a semiconductor includes placing a substrate in a plasma chamber configured to deposit a material layer onto the substrate or etch a material layer from the substrate, and energizing plasma within the plasma chamber by coupling RF power from an RF source into the plasma chamber to perform a deposition or etching, and while energizing the plasma carrying out the foregoing method of impedance matching.

In another aspect, a semiconductor processing tool includes a plasma chamber configured to deposit a material onto a substrate or etch a material from the substrate, as well as the foregoing impedance matching circuit.

In another aspect, an RF impedance matching circuit includes an RF input configured to operably couple to an RF source providing an RF signal having a frequency; an RF output configured to operably couple to a plasma chamber; a first electronically variable reactance element (EVRE) having a first variable reactance, a terminal of the first EVRE being operably coupled to the RF input; a second EVRE having a second variable reactance, the second EVRE being separate and distinct from the first EVRE, and a terminal of the second EVRE being operably coupled to the RF output; and a control circuit operably coupled to the first and second EVREs to control the first variable reactance and the second variable reactance, wherein the control circuit is configured to: determine, based on a first parameter, both a first reactance value for the first EVRE and a separate second reactance value for the second EVRE; and generate a control signal to alter the first variable reactance and the second variable reactance to the first reactance value and the second reactance value, respectively; wherein the alteration of the first variable reactance and the second variable reactance, while the frequency of the RF source is not altered, causes RF power reflected back to the RF source to decrease.

In another aspect, a method of matching an impedance includes coupling an impedance matching circuit between an RF source and a plasma chamber, the impedance matching circuit comprising: an RF input configured to operably couple to the RF source providing an RF signal having a frequency; an RF output configured to operably couple to the plasma chamber; a first electronically variable reactance element (EVRE) having a first variable reactance, a terminal of the first EVC being operably coupled to the RF input; and a second EVRE having a second variable reactance, the second EVRE being separate and distinct from the first EVRE, and a terminal of the second EVC being operably coupled to the RF output; determining, based on a first parameter, both a first variable reactance value for the first EVRE and a separate second variable reactance value for the second EVRE; and while the frequency of the RF source is not altered, altering the first variable reactance and the second variable reactance to the first reactance value and the second reactance value, respectively, wherein the alteration of the first variable reactance and the second variable reactance causes RF power reflected back to the RF source to decrease while the frequency of the RF source is not altered.

BRIEF DESCRIPTION OF THE DRAWINGS

The present disclosure will become more fully understood from the detailed description and the accompanying drawings, wherein.

and

Figure 24:
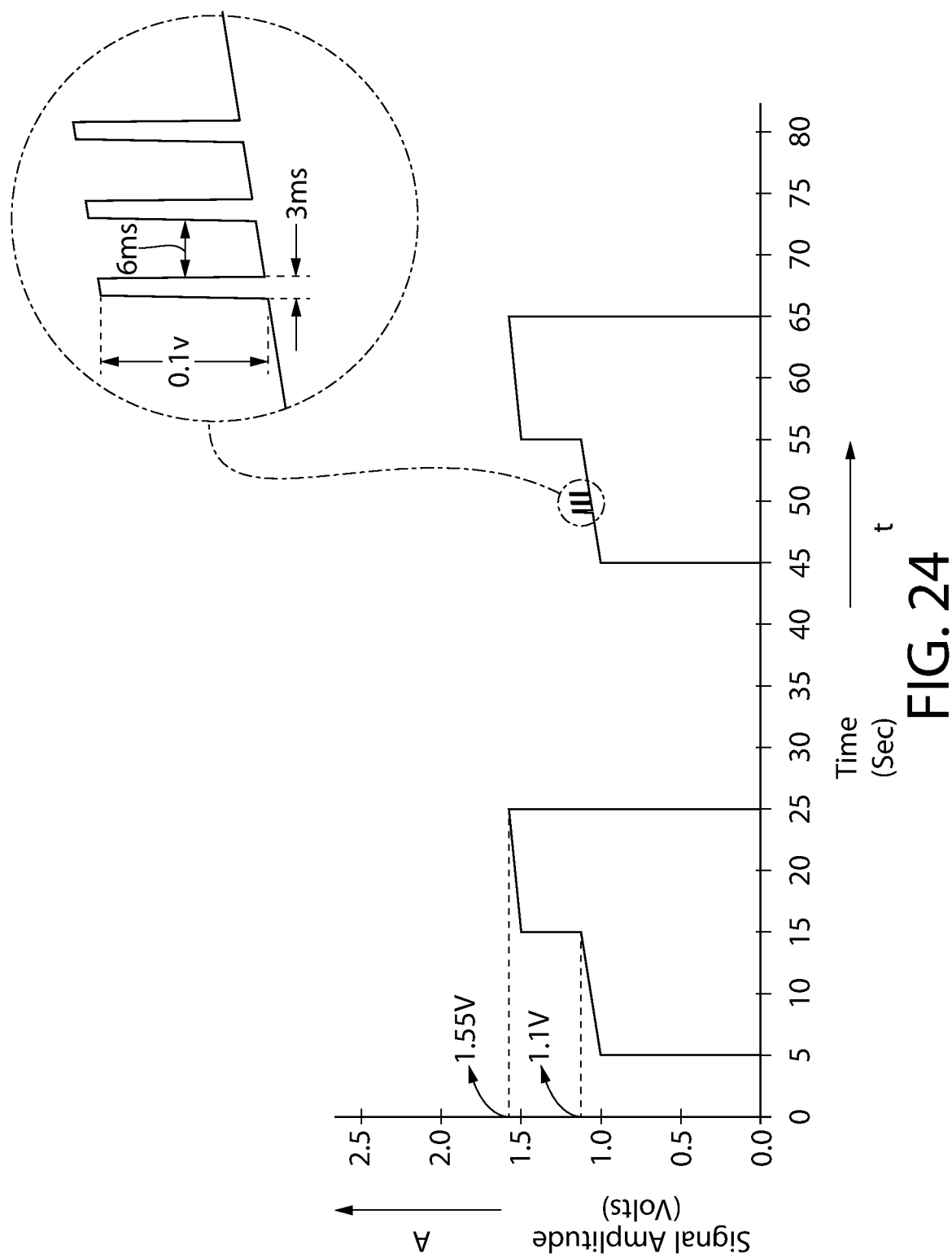

FIG. 24 is a graph of voltage over time showing evidence of arcing in a plasma chamber.

DETAILED DESCRIPTION

The following description of the preferred embodiment(s) is merely exemplary in nature and is in no way intended to limit the invention or inventions. The description of illustrative embodiments is intended to be read in connection with the accompanying drawings, which are to be considered part of the entire written description. In the description of the exemplary embodiments disclosed herein, any reference to direction or orientation is merely intended for convenience of description and is not intended in any way to limit the scope of the present invention. Relative terms such as "lower," "upper," "horizontal," "vertical," "above," "below," "up," "down," "left," "right," "top," "bottom," "front" and "rear" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," "secured" and other similar terms refer to a relationship wherein structures are secured or attached to one another either directly or indirectly through intervening structures, as well as both movable or rigid attachments or relationships, unless expressly described otherwise. The discussion herein describes and illustrates some possible non-limiting combinations of features that may exist alone or in other combinations of features. Furthermore, as used herein, the term "or" is to be interpreted as a logical operator that results in true whenever one or more of its operands are true. Furthermore, as used herein, the phrase "based on" is to be interpreted as meaning "based at least in part on," and therefore is not limited to an interpretation of "based entirely on."

As used throughout, ranges are used as shorthand for describing each and every value that is within the range. Any value within the range can be selected as the terminus of the range. In addition, all references cited herein are hereby incorporated by referenced in their entireties. In the event of a conflict in a definition in the present disclosure and that of a cited reference, the present disclosure controls.

Figure 1:
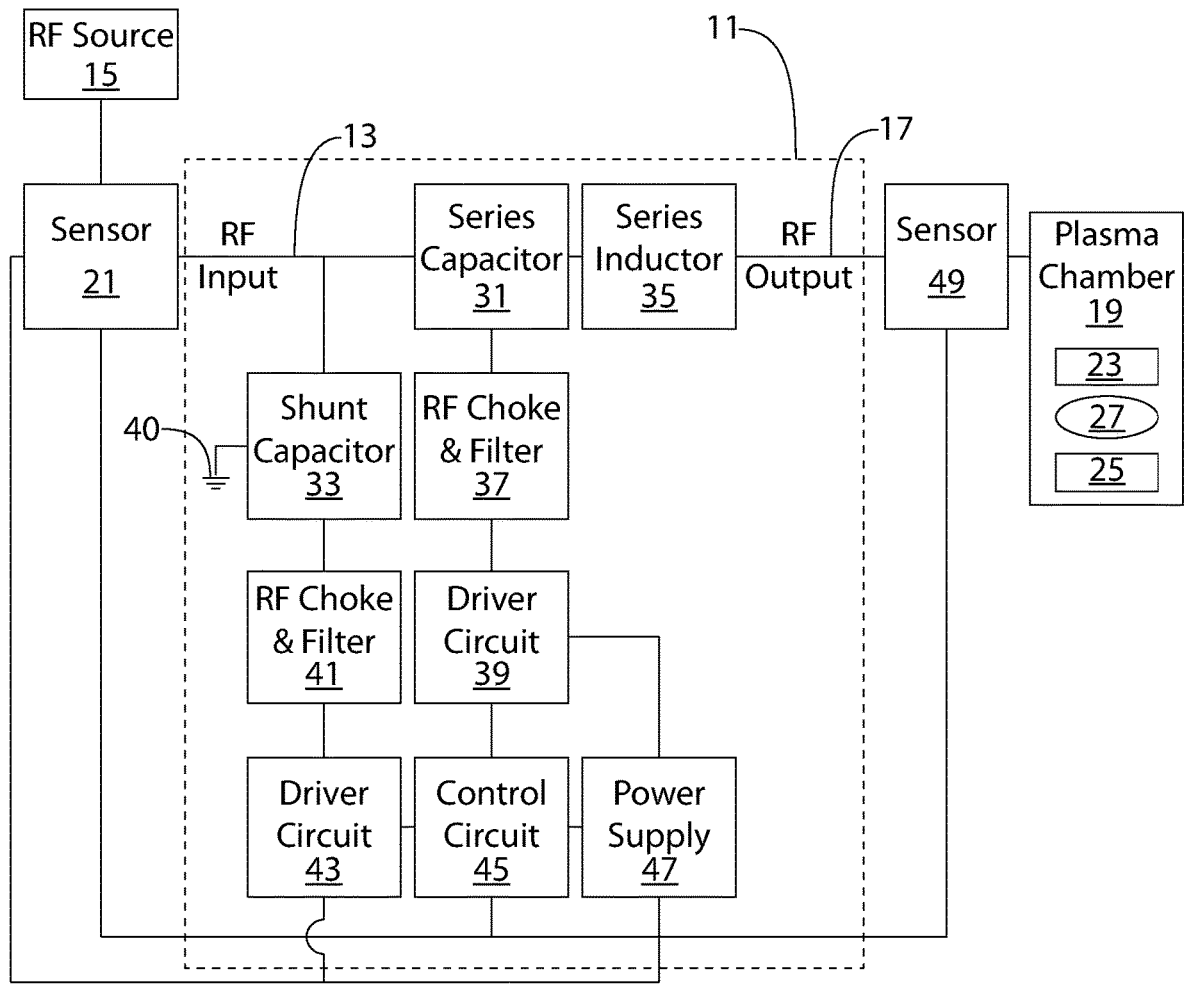
FIG. 1 is a schematic representation of an embodiment of an RF impedance matching network using EVCs incorporated into a semiconductor wafer fabrication system.

Turning in detail to the drawings, FIG. 1 illustrates an RF impedance matching network 11 having an RF input 13 connected to an RF source 15 and an RF output 17 connected to a plasma chamber 19. An RF input sensor 21 is connected between the RF impedance matching network 11 and the RF source 15 so that the RF signal output from the RF source 15 may be monitored. An RF output sensor 49 is connected between the RF impedance matching network 11 and the plasma chamber 19 so that the RF output from the impedance matching network, and the plasma impedance presented by the plasma chamber 19, may be monitored. Certain embodiments may include only one of the input sensor 21 and the output sensor 49. The functioning of these sensors 21, 49 are described in greater detail below.

The RF impedance matching network 11 serves to help maximize the amount of RF power transferred from the RF source 15 to the plasma chamber 19 by matching the impedance at the RF input 13 to the fixed impedance of the RF source 15. The matching network 11 can consist of a single module within a single housing designed for electrical connection to the RF source 15 and plasma chamber 19. In other embodiments, the components of the matching network 11 can be located in different housings, some components can be outside of the housing, and/or some components can share a housing with a component outside the matching network.

As is known in the art, the plasma within a plasma chamber 19 typically undergoes certain fluctuations outside of operational control so that the impedance presented by the plasma chamber 19 is a variable impedance. Since the variable impedance of the plasma chamber 19 cannot be fully controlled, and an impedance matching network may be used to create an impedance match between the plasma chamber 19 and the RF source 15. Moreover, the impedance of the RF source 15 may be fixed at a set value by the design of the particular RF source 15. Although the fixed impedance of an RF source 15 may undergo minor fluctuations during use, due to, for example, temperature or other environmental variations, the impedance of the RF source 15 is still considered a fixed impedance for purposes of impedance matching because the fluctuations do not significantly vary the fixed impedance from the originally set impedance value. Other types of RF source 15 may be designed so that the impedance of the RF source 15 may be set at the time of, or during, use. The impedance of such types of RF sources 15 is still considered fixed because it may be controlled by a user (or at least controlled by a programmable controller) and the set value of the impedance may be known at any time during operation, thus making the set value effectively a fixed impedance.

The RF source 15 may be an RF generator of a type that is well-known in the art, and generates an RF signal at an appropriate frequency and power for the process performed within the plasma chamber 19. The RF source 15 may be electrically connected to the RF input 13 of the RF impedance matching network 11 using a coaxial cable, which for impedance matching purposes would have the same fixed impedance as the RF source 15.

The plasma chamber 19 includes a first electrode 23 and a second electrode 25, and in processes that are well known in the art, the first and second electrodes 23, 25, in conjunction with appropriate control systems (not shown) and the plasma in the plasma chamber, enable one or both of deposition of materials onto a substrate 27 and etching of materials from the substrate 27.

The RF impedance matching network 11 includes a series variable capacitor 31, a shunt variable capacitor 33, and a series inductor 35 configured as one form an 'L' type matching network. In the context of the present description, the series variable capacitor 31, the shunt variable capacitor 33, and the series inductor 35 form what is referred to as the "impedance matching circuit." The shunt variable capacitor 33 is shown shunting to a reference potential, in this case ground 40, between the series variable capacitor 31 and the series inductor 35, and one of skill in the art will recognize that the RF impedance matching network 11 may be configured with the shunt variable capacitor 33 shunting to a reference potential at the RF input 13 or at the RF output 17. Alternatively, the RF impedance matching network 11 may be configured in other matching network configurations, such as a 'T' type configuration or a 'Π' type configuration. In certain embodiments, the variable capacitors and the switching circuit described below may be included in any configuration appropriate for an RF impedance matching network.

Each of the series variable capacitor 31 and the shunt variable capacitor 33 may be an electronic variable capacitor (EVC), as described in U.S. Pat. No. 7,251,121, the EVC being effectively formed as a capacitor array formed by a plurality of discrete capacitors. The series variable capacitor 31 is coupled in series between the RF input 13 and the RF output 17 (which is also in parallel between the RF source 15 and the plasma chamber 19). The shunt variable capacitor 33 is coupled in parallel between the RF input 13 and ground 40. In other configurations, the shunt variable capacitor 33 may be coupled in parallel between the RF output 19 and ground 40. Other configurations may also be implemented without departing from the functionality of an RF matching network. In still other configurations, the shunt variable capacitor 33 may be coupled in parallel between a reference potential and one of the RF input 13 and the RF output 19.

The series variable capacitor 31 is connected to a series RF choke and filter circuit 37 and to a series driver circuit 39. Similarly, the shunt variable capacitor 33 is connected to a shunt RF choke and filter circuit 41 and to a shunt driver circuit 43. Each of the series and shunt driver circuits 39, 43 are connected to a control circuit 45, which is configured with an appropriate processor and/or signal generating circuitry to provide an input signal for controlling the series and shunt driver circuits 39, 43. A power supply 47 is connected to each of the RF input sensor 21, the series driver circuit 39, the shunt driver circuit 43, and the control circuit 45 to provide operational power, at the designed currents and voltages, to each of these components. The voltage levels provided by the power supply 47, and thus the voltage levels employed by each of the RF input sensor 21, the series driver circuit 39, the shunt driver circuit 43, and the control circuit 45 to perform the respective designated tasks, is a matter of design choice. In other embodiments, a variety of electronic components can be used to enable the control circuit 45 to send instructions to the variable capacitors. Further, while the driver circuit and RF choke and filter are shown as separate from the control circuit 45, these components can also be considered as forming part of the control circuit 45.

In the exemplified embodiment, the control circuit 45 includes a processor. The processor may be any type of properly programmed processing device, such as a computer or microprocessor, configured for executing computer program instructions (e.g., code). The processor may be embodied in computer and/or server hardware of any suitable type (e.g., desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc. The processor of the exemplified embodiment is configured with specific algorithms to enable matching network to perform the functions described herein.

With the combination of the series variable capacitor 31 and the shunt variable capacitor 33, the combined impedances of the RF impedance matching network 11 and the plasma chamber 19 may be controlled, using the control circuit 45, the series driver circuit 39, the shunt driver circuit 43, to match, or at least to substantially match, the fixed impedance of the RF source 15.

The control circuit 45 is the brains of the RF impedance matching network 11, as it receives multiple inputs, from sources such as the RF input sensor 21 and the series and shunt variable capacitors 31, 33, makes the calculations necessary to determine changes to the series and shunt variable capacitors 31, 33, and delivers commands to the series and shunt variable capacitors 31, 33 to create the impedance match. The control circuit 45 is of the type of control circuit that is commonly used in semiconductor fabrication processes, and therefore known to those of skill in the art. Any differences in the control circuit 45, as compared to control circuits of the prior art, arise in programming differences to account for the speeds at which the RF impedance matching network 11 is able to perform switching of the variable capacitors 31, 33 and impedance matching.

Each of the series and shunt RF choke and filter circuits 37, 41 are configured so that DC signals may pass between the series and shunt driver circuits 39, 43 and the respective series and shunt variable capacitors 31, 33, while at the same time the RF signal from the RF source 15 is blocked to prevent the RF signal from leaking into the outputs of the series and shunt driver circuits 39, 43 and the output of the control circuit 45. The series and shunt RF choke and filter circuits 37, 41 are of a type known to those of skill in the art.

Figure 2A:
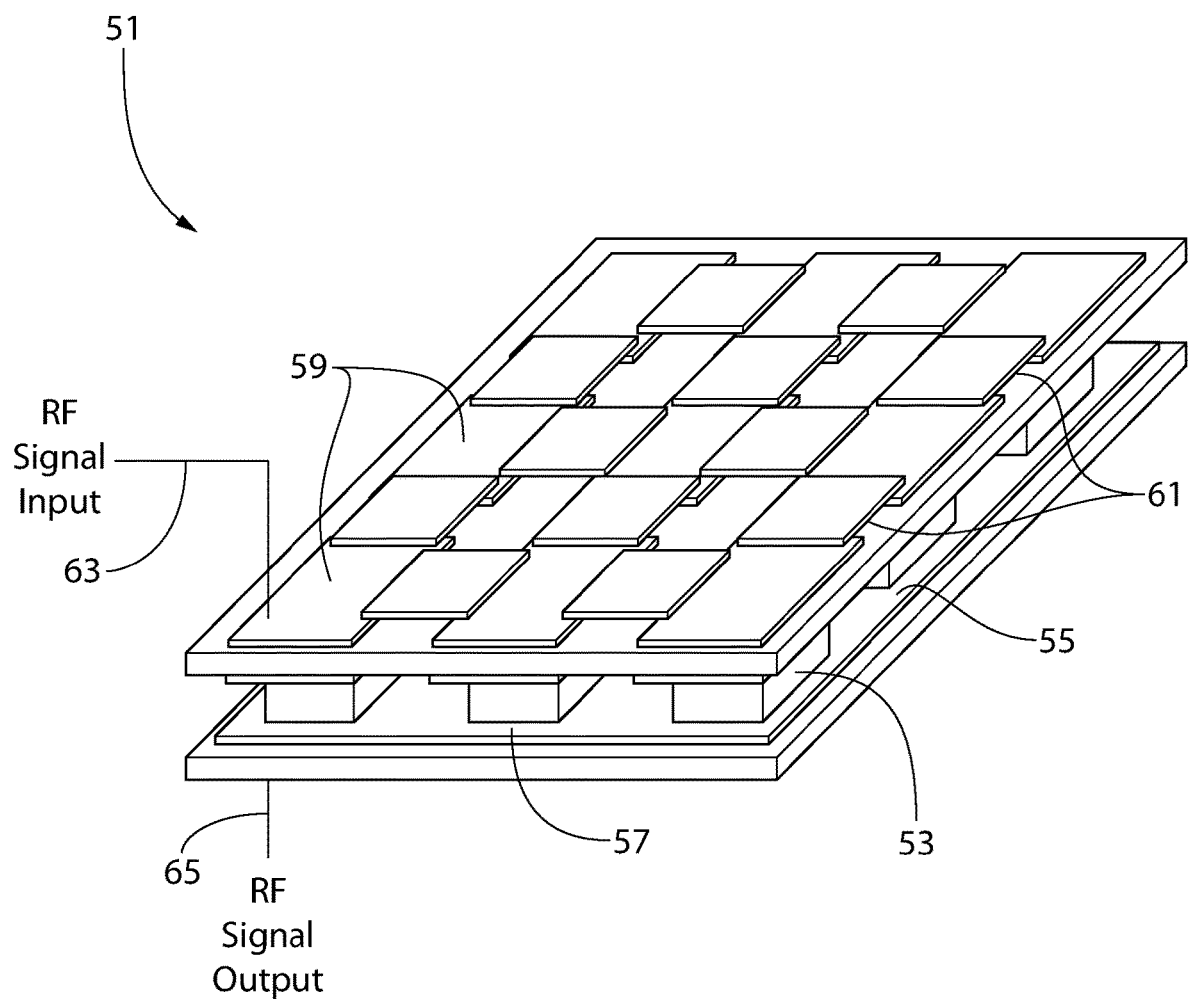
FIG. 2A illustrates an EVC for use in an RF impedance matching network.

The series and shunt variable capacitors 31, 33 may each be an electronically variable capacitor ("EVC") 51 such as is depicted in FIG. 2A. The electronically variable capacitor 51 includes a plurality of discrete capacitors 53 which form an array, and each discrete capacitor 53 has an electrode on opposite sides thereof, such as is typical of discrete capacitors that are available on the market.

Each discrete capacitor 53 has its individual bottom electrode 55 electrically connected to a common bottom electrode 57. The individual top electrode 59 of each discrete capacitor 53 is electrically connected to the individual top electrode 59 of adjacent discrete capacitors 53 through an electronic switch 61 that may be activated to electrically connect the adjacent top electrodes 59. Thus, the individual top electrodes 59 of each discrete capacitor 53 may be electrically connected to the top electrodes 59 of one or more adjacent discrete capacitors 53. The electronic switch 61 is selected and/or designed to be capable of switching the voltage and current of the RF signal. For example, the electronic switch 61 may be a PiN/NiP diode, or a circuit based on a PiN/NiP diode. Alternatively, the electronic switch 61 may be any other type of appropriate switch, such as a micro electro mechanical (MEM) switch, a solid-state relay, a field effect transistor, and the like. One embodiment of the electronic switch 61, in combination with a driver circuit, is discussed in greater detail below.

In the configuration of the electronically variable capacitor 51 shown, each individual top electrode 59 may be electrically connected to between two to four adjacent top electrodes 59, with each connection being independently regulated by a separate electronic switch 61. The RF signal input 63 is electrically connected to one of the individual top electrodes 59, and the RF signal output 65 is electrically connected to the common bottom electrode 57. Thus, the electronic circuit through which the RF signal passes may include one, some, or all of the discrete capacitors 53 by a process of independently activating one or more of the electronic switches 61 coupled to adjacent ones of the individual top electrodes 59.

In other embodiments, the electronically variable capacitor 51 may be configured to have any layout for the individual top electrodes 59, to thereby increase or decrease the number of possible electrical connections between adjacent top electrodes 59. In still other embodiments, the electronically variable capacitor 51 may have an integrated dielectric disposed between the bottom electrode 57 and a plurality of top electrodes 59.

The electronic switch 61 that is used to connect pairs of adjacent top electrodes 59 may be a PiN/NiP diode-based switch, although other types of electronic switches may be used, such as a Micro Electro Mechanical (MEM) switch, a solid-state relay, a field effect transistor, and the like. Each electronic switch 61 is switched by appropriate driver circuitry. For example, each of the series and 651 shunt driver circuits 39, 43 of FIG. 1 may include several discrete driving circuits, with each discrete driving circuit configured to switch one of the electronic switches 61 between an on state and an off state. By controlling the on and off states of each discrete capacitor 53 within the electronically variable capacitor 51, the capacitance of the electronically variable capacitor 51 may be controlled and varied. Each unique configuration of the on and off states of the plurality of discrete capacitors 53 is referred to herein as an "array configuration" of the variable capacitor 51, and each array configuration is associated with a capacitance of the electronically variable capacitor 51. In certain embodiments, each array configuration results in a unique capacitance for the electronically variable capacitor 51, so that there is a direct correlation between each array configuration and the capacitance value of the electronically variable capacitor 51.

Figure 2B:
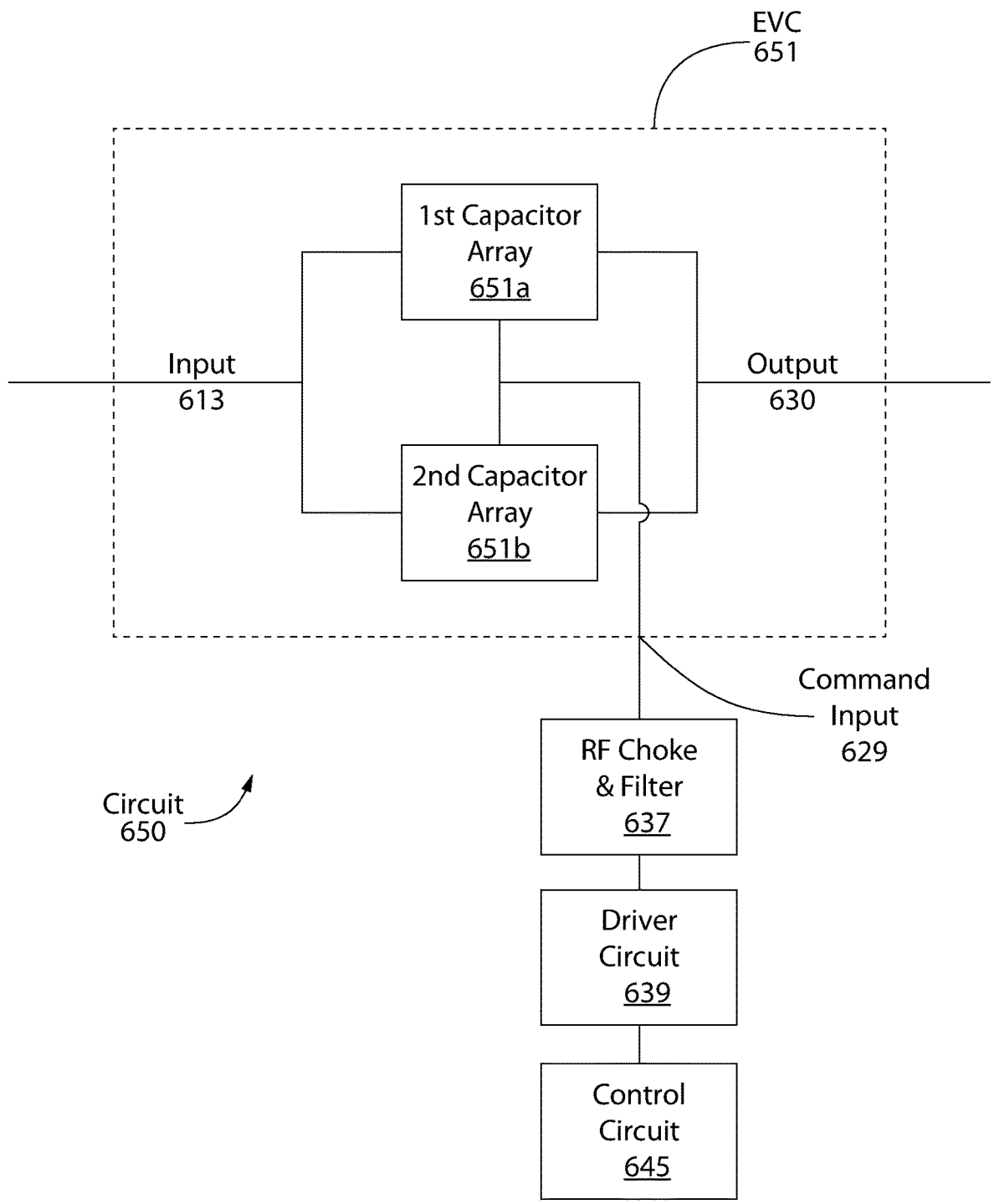
FIG. 2B is a schematic representation of an embodiment of an electronic circuit for providing a variable capacitance.

FIG. 2B shows an electronic circuit 650 for providing a variable capacitance according to one embodiment. The circuit 650 utilizes an EVC 651 that includes two capacitor arrays 651a, 651b. The first capacitor array 651a has a first plurality of discrete capacitors, each having a first capacitance value. The second capacitor array 651b has a second plurality of discrete capacitors, each having a second capacitance value. The first capacitance value is different from the second capacitance value such that the EVC 651 can provide coarse and fine control of the capacitance produced by the EVC 651. The first capacitor array and the second capacitor array are coupled in parallel between a signal input 613 and a signal output 630. The capacitor arrays 651a, 651b and their discrete capacitors may be arranged in manner similar to that shown in FIG. 2A, or in an alternative manner.

The first and second capacitance values can be any values sufficient to provide the desired overall capacitance values for the EVC 651. In one embodiment, the second capacitance value is less than or equal to one-half (½) of the first capacitance value. In another embodiment, the second capacitance value is less than or equal to one-third (⅓) of the first capacitance value. In yet another embodiment, the second capacitance value is less than or equal to one-fourth (¼) of the first capacitance value.

The electronic circuit 650 further includes a control circuit 645. The control circuit 645 is operably coupled to the first capacitor array 651a and to the second capacitor array 651b by a command input 629, the command input 629 being operably coupled to the first capacitor array 651a and to the second capacitor array 651b. In the exemplified embodiment, the command input 629 has a direct electrical connection to the capacitor arrays 651a, 651b, though in other embodiments this connection can be indirect. The coupling of the control circuit 645 to the capacitor arrays 651a, 651b will be discussed in further detail below.

The control circuit 645 is configured to alter the variable capacitance of the EVC 651 by controlling on and off states of (a) each discrete capacitor of the first plurality of discrete capacitors and (b) each discrete capacitor of the second plurality of discrete capacitors. The control circuit 645 can have features similar to those described with respect to control circuit 45 of FIG. 1. For example, the control circuit 645 can receive inputs from the capacitor arrays 651a, 651b, make calculations to determine changes to capacitor arrays 651a, 651b, and delivers commands to the capacitor arrays 651a, 651b for altering the capacitance of the EVC 651.

Figure 2C:
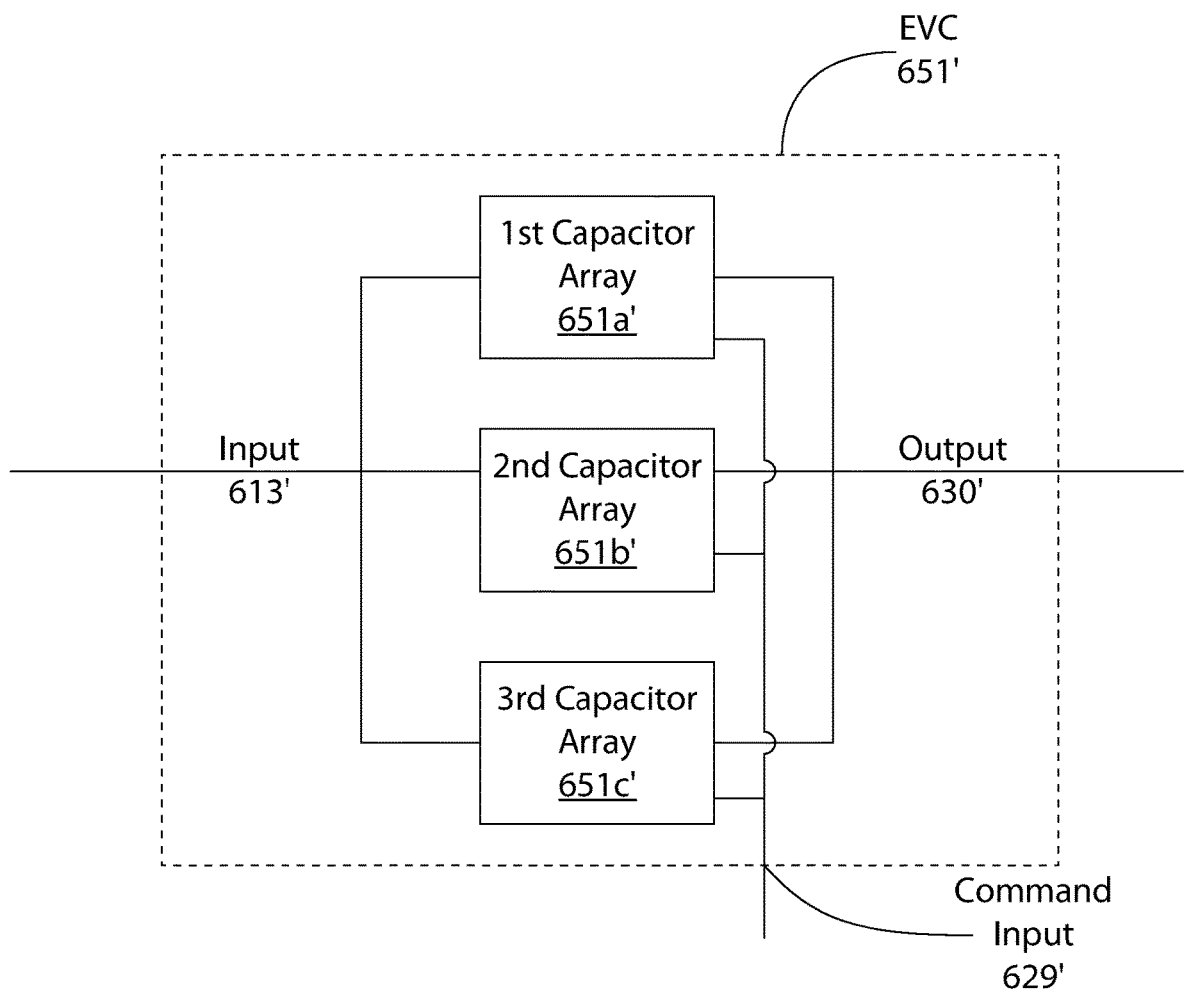
FIG. 2C is a schematic representation of an embodiment of an EVC having three capacitor arrays.

Similar to EVC 51 discussed with respect to FIG. 2A, the EVC 651 of FIGS. 2B and 2C can include a plurality of electronic switches. Each electronic switch can be configured to activate and deactivate one or more discrete capacitors.

As with the control circuit 45 of FIG. 1, the control circuit 645 can also be connected to a driver circuit 639 and an RF choke and filter circuit 637. The control circuit 645, driver circuit 639, and RF choke and filter circuit 637 can have capabilities similar to those discussed with regard to FIG. 1. In the exemplified embodiment, the driver circuit 639 is operatively coupled between the control circuit 645 and the first and second capacitor arrays 651a, 651b. The driver circuit 639 is configured to alter the variable capacitance based upon a control signal received from the control circuit 645. The RF filter 637 is operatively coupled between the driver circuit 639 and the first and second capacitor arrays 651a, 651b. In response to the control signal sent by the control unit 645, the driver circuit 639 and RF filter 637 are configured to send a command signal to the command input 629. The command signal is configured to alter the variable capacitance by instructing at least one of the electronic switches to activate or deactivate (a) at least one the discrete capacitors of the first plurality of discrete capacitors or (b) at least one of the discrete capacitors of the second plurality of discrete capacitors.

In the exemplified embodiment, the driver circuit 639 is configured to switch a high voltage source on or off in less than 15 μsec, the high voltage source controlling the electronic switches of each of the first and second capacitor arrays for purposes of altering the variable capacitance. The EVC 651, however, can be switched by any of the means or speeds discussed in the present application.

The control circuit 645 can be configured to calculate coarse and fine capacitance values to be provided by the respective capacitor arrays 651a, 651b. In the exemplified embodiment, the control circuit 645 is configured to calculate a coarse capacitance value to be provided by controlling the on and off states of the first capacitor array 651a. Further, the control circuit is configured to calculate a fine capacitance value to be provided by controlling the on and off states of the second capacitor array 651b. In other embodiments, the capacitor arrays 651a, 651b can provide alternative levels of capacitance.

In other embodiments, the EVC can utilize additional capacitor arrays. FIG. 2C shows an embodiment of an EVC 651' in which a third capacitor array 651c' is utilized to provide an additional degree of control over the variable capacitance. Like the EVC 651 of FIG. 2B, the EVC 651' of FIG. 2C includes an input 613', an output 630', and a command input 629'. Similar to the first and second capacitor arrays 651a', 651b', the third capacitor array 651c' can have a third plurality of discrete capacitors. Each discrete capacitor of the third plurality of discrete capacitors can have a third capacitance value, this value being different from both the first capacitance value and the second capacitance value. The first capacitor array 651a', second capacitor array 651b', and third capacitor array 651c' can be coupled in parallel between the signal input 613' and the signal output 630'. A control circuit can be operably coupled to the third capacitor array 651c' and be further configured to alter the variable capacitance by controlling on and off states of each discrete capacitor of the third plurality of discrete capacitors. Additional capacitor arrays enable an EVC to utilize several different capacitance values in controlling the overall EVC capacitance. In other embodiments, the third plurality of discrete capacitors can be replaced with a single discrete capacitor, or an alternative device for varying the overall capacitance of the EVC 651'.

The first, second, and third capacitance values of EVC 651' can be any values sufficient to provide the desired overall capacitance values for EVC 651'. In one embodiment, the second capacitance value is less than or equal to one-half (½) of the first capacitance value, and the third capacitance value is less than or equal to one-half (½) of the second capacitance value. In another embodiment, the second capacitance value is less than or equal to one-third (⅓) of the first capacitance value, and the third capacitance value is less than or equal to one-third (⅓) of the second capacitance value.

The EVCs 651, 651' of FIGS. 2B and 2C, respectively, can be used in most systems requiring a varying capacitance. For example, the EVCs 651, 651' can be used as a series EVC and/or a shunt EVC in a matching network, such as the RF matching network 11 discussed above with respect to FIG. 1. It is often desired that the differences between the capacitance values allow for both a sufficiently fine resolution of the overall capacitance of the circuit and a wide range of capacitance values to enable a better impedance match at the input of a RF matching network, and EVCs 651, 651' allow this.

The EVCs 651, 651' can also be used in a system or method for fabricating a semiconductor, a method for controlling a variable capacitance, and/or a method of controlling an RF impedance matching network. Such methods can include altering at least one of the series variable capacitance and the shunt variable capacitance to the determined series capacitance value and the shunt capacitance value, respectively. This altering can be accomplishing by controlling, for each of the series EVC and the shunt EVC, on and off states of each discrete capacitor of each plurality of discrete capacitors. In other embodiments, the EVC 651, 651' and circuit 650 can be used in other methods and systems to provide a variable capacitance.

As discussed above, an EVC is a type of variable capacitor that can use multiple switches, each used to create an open or short circuit, with individual series capacitors to change the capacitance of the variable capacitor. The switches can be mechanical (such as relays) or solid state (such as PIN diodes, transistors, or other switching devices). The following is a discussion of methods for setting up an EVC or other variable capacitor to provide varying capacitances.

In what is sometimes referred to as an "accumulative setup" of an EVC or other variable capacitor, the approach to linearly increase the capacitor value from the minimum starting point (where all switches are open) is to incrementally increase the number of fine tune capacitors that are switched into the circuit. Once the maximum number of fine tune capacitors is switched into circuit, a coarse tune capacitor is switched in, and the fine tune capacitors are switched out. The process starts over with increasing the number of fine tune capacitors that are switched into circuit, until all fine and coarse tune capacitors are switched in, at which point another coarse tune capacitor is switched in and the fine tune capacitors are switched out. This process can continue until all the coarse and fine capacitors are switched in.

In this embodiment, all of the fine tune capacitors have the same or a substantially similar value, and all the coarse tune capacitors have the same or a substantially similar value. Further, the capacitance value of one coarse tune capacitor about equals the combined capacitance value of all fine tune capacitors plus an additional fine tune capacitor into the circuit, thus enabling a linear increase in capacitance. The embodiments, however, are not so limited. The fine tune capacitors (and coarse capacitors) need not have the same or a substantially similar value. Further, the capacitance value of one coarse tune capacitor need not equal the combined capacitance value of all fine tune capacitors plus an additional fine tune capacitor. In one embodiment, the coarse capacitance value and the fine capacitance value have a ratio substantially similar to 10:1. In another embodiment, the second capacitance value is less than or equal to one-half ($1/2$) of the first capacitance value. In another embodiment, the second capacitance value is less than or equal to one-third ($1/3$) of the first capacitance value. In yet another embodiment, the second capacitance value is less than or equal to one-fourth ($1/4$) of the first capacitance value.

An example of the aforementioned embodiment in an ideal setting would be if the fine tune capacitors were equal to 1 pF, and the coarse tune capacitors were equal to 10 pF. In this ideal setup, when all switches are open, the capacitance is equal to 0 pF. When the first switch is closed, there is 1 pF in the circuit. When the second switch is closed there is 2 pF in the circuit, and so on, until nine fine tune switches are closed, giving 9 pF. Then, the first 10 pF capacitor is switched into circuit and the nine fine tune switches are opened, giving a total capacitance of 10 pF. The fine tune capacitors are then switched into circuit from 11 pF to 19 pF. Another coarse tune capacitor can then be switched into circuit and all fine tune capacitors can be switched out of circuit giving 20 pF. This process can be repeated until the desired capacitance is reached.

This can also be taken one step further. Using the previous example, having nine 1 pF capacitors and also nine 10 pF capacitors, the variable capacitor circuit can have even larger values, 100 pF, to switch in and out of circuit. This would allow the previous capacitor array to go up to 99 pF, and then the 100 pF capacitor can be used for the next increment. This can be repeated further using larger increments, and can also be used with any counting system. According to the accumulative setup, increasing the total capacitance of a variable capacitor is achieved by switching in more of the coarse capacitors or more of the fine capacitors than are already switched in without switching out a coarse capacitor that is already switched in. Further, when the variable total capacitance is increased and the control circuit does not switch in more of the coarse capacitors than are already switched in, then the control circuit switches in more fine capacitors than are already switched in without switching out a fine capacitor that is already switched in.

Figure 2D:
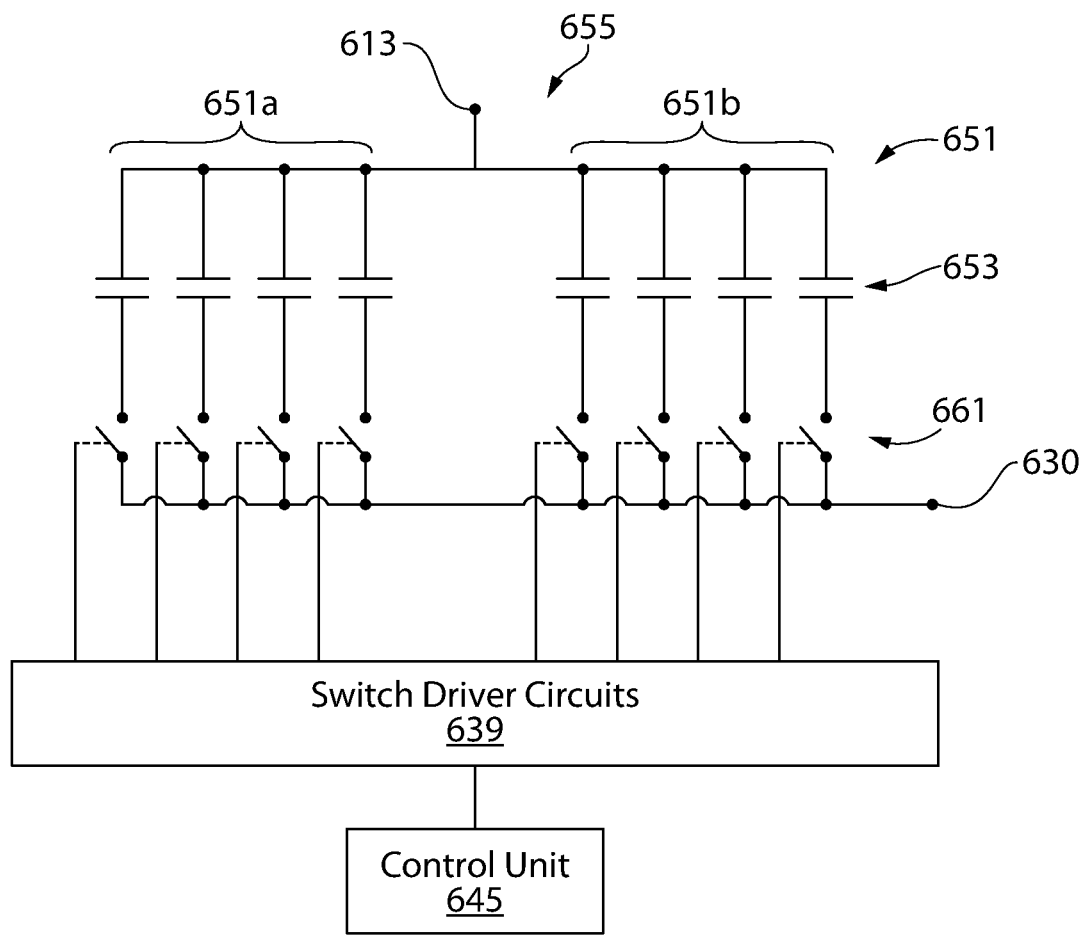
FIG. 2D is a schematic representation of an embodiment of a variable capacitance system.

FIG. 2D is a schematic of a variable capacitance system 655 according to an accumulative setup. Where this figure uses reference numbers identical to those of FIG. 2B, it is understood that the relevant components can have features similar to those discussed in FIG. 2B. The variable capacitance system 655 comprises a variable capacitor 651 for providing a varying capacitance. The variable capacitor 651 has an input 613 and an output 630. The variable capacitor 651 includes a plurality of discrete capacitors 653 operably coupled in parallel. The plurality of capacitors 653 includes first (fine) capacitors 651*a* and second (coarse) capacitors 651B. Further, the variable capacitor 651 includes a plurality of switches 661. Of the switches 661, one switch is operably coupled in series to each of the plurality of capacitors to switch in and out each capacitor, thereby enabling the variable capacitor 651 to provide varying total capacitances. The variable capacitor 651 has a variable total capacitance that is increased when discrete capacitors 653 are switched in and decreased when the discrete capacitors 653 are switched out.

The switches 661 can be coupled to switch driver circuits 639 for driving the switches on and off. The variable capacitance system 655 can further include a control unit 645 operably coupled to the variable capacitor 651. Specifically, the control unit 645 can be operably coupled to the driver circuits 639 for instructing the driver circuits 639 to switch one or more of the switches 661, and thereby turn one or more of the capacitors 653 on or off. In one embodiment, the control unit 645 can form part of a control unit that controls a variable capacitor, such as a control unit that instructs the variable capacitors of a matching network to change capacitances to achieve an impedance match. The driver circuits 639 and control unit 645 can have features similar to those discussed above with reference to FIG. 2B, and thus can also utilize an RF choke and filter as discussed above.

In one embodiment, the control circuit 645 is configured to determine a desired coarse capacitance for the coarse capacitors; determine a desired fine capacitance for the fine capacitors; and after calculating the desired coarse capacitance and the desired fine capacitance, alter the total variable capacitance by switching in or out at least one of the fine capacitors; and switching in or out at least one of the coarse capacitors. In other embodiments, coarse tuning and fine tuning can occur at different stages.

In the exemplified embodiment, the first capacitors 651*a* are fine capacitors each having a capacitance value substantially similar to a fine capacitance value, and the second capacitors 651*b* are coarse capacitors each having a capacitance value substantially similar to a coarse capacitance value, the coarse capacitance value being greater than the fine capacitance value. For purposes of this application, capacitances and other values are considered to be substantially similar if one value is not 15 percent (15%) greater than or less than another value.

The variable capacitance system 655 can form part of an impedance matching network, including but not limited to, the impedance matching network 11 of FIG. 1. Thus, in one embodiment, the impedance matching network can comprise an RF input 13 configured to operably couple to an RF source 15, and an RF output 17 configured to operably couple to a plasma chamber 19 having a variable capacitance. In other embodiments, the variable capacitance system 655 can form part of other types of matching networks, such as a pi matching network. The matching network can use two, three, or more EVCs or other variable capacitors.

The variable capacitance system can also form part of a method for controlling an impedance matching network (such as the impedance matching network 11 of FIG. 1). The method can include providing the RF impedance matching network comprising; determining an increased total capacitance to be provided by one of the EVCs; and increasing the variable total capacitance of the one EVC by switching in more of the coarse capacitors or more of the fine capacitors than are already switched in without switching out a coarse capacitor that is already switched in.

Further, the variable capacitance system can form part of a method and system for fabricating a semiconductor (see FIG. 1). The method can include placing a substrate in a plasma chamber configured to deposit a material layer onto the substrate or etch a material layer from the substrate; and energizing plasma within the plasma chamber by coupling RF power from an RF source into the plasma chamber to perform a deposition or etching. Further, the method can include, while energizing the plasma, providing the RF matching network between the plasma chamber and the RF source; determining an increased total capacitance to be provided by one of the EVCs; and increasing the variable total capacitance of the one EVC by switching in more of the coarse capacitors or more of the fine capacitors than are already switched in without switching out a coarse capacitor that is already switched in.

Using the variable capacitance system discussed above with an impedance matching network can provide several advantages over other approaches. An alternative to the above approach would be to have all the capacitor values be different, with the first value equal to the minimum desired change in capacitance. Then each successive capacitor value is increased to double the change in capacitance from the previous up until the maximum desired capacitor value, when all capacitors are switched in. This approach can result in using less capacitors to switch in and out of circuit to achieve the same resolution and range. A potential problem with this setup, however, is that, once the capacitor reaches a certain value, the voltage and/or current on that particular capacitor or the current on the switch can be higher than the specification allows for. This forces the EVC to use multiple capacitors in parallel for each switch of lower value. This problem is particularly acute where high voltages and/or currents are being used. The accumulative setup discussed above avoids putting this degree of stress on its capacitors and switches by switching in additional capacitors, rather than replacing lower-capacitance capacitors with higher-capacitance capacitors.

Switching Circuit

Figure 3A:
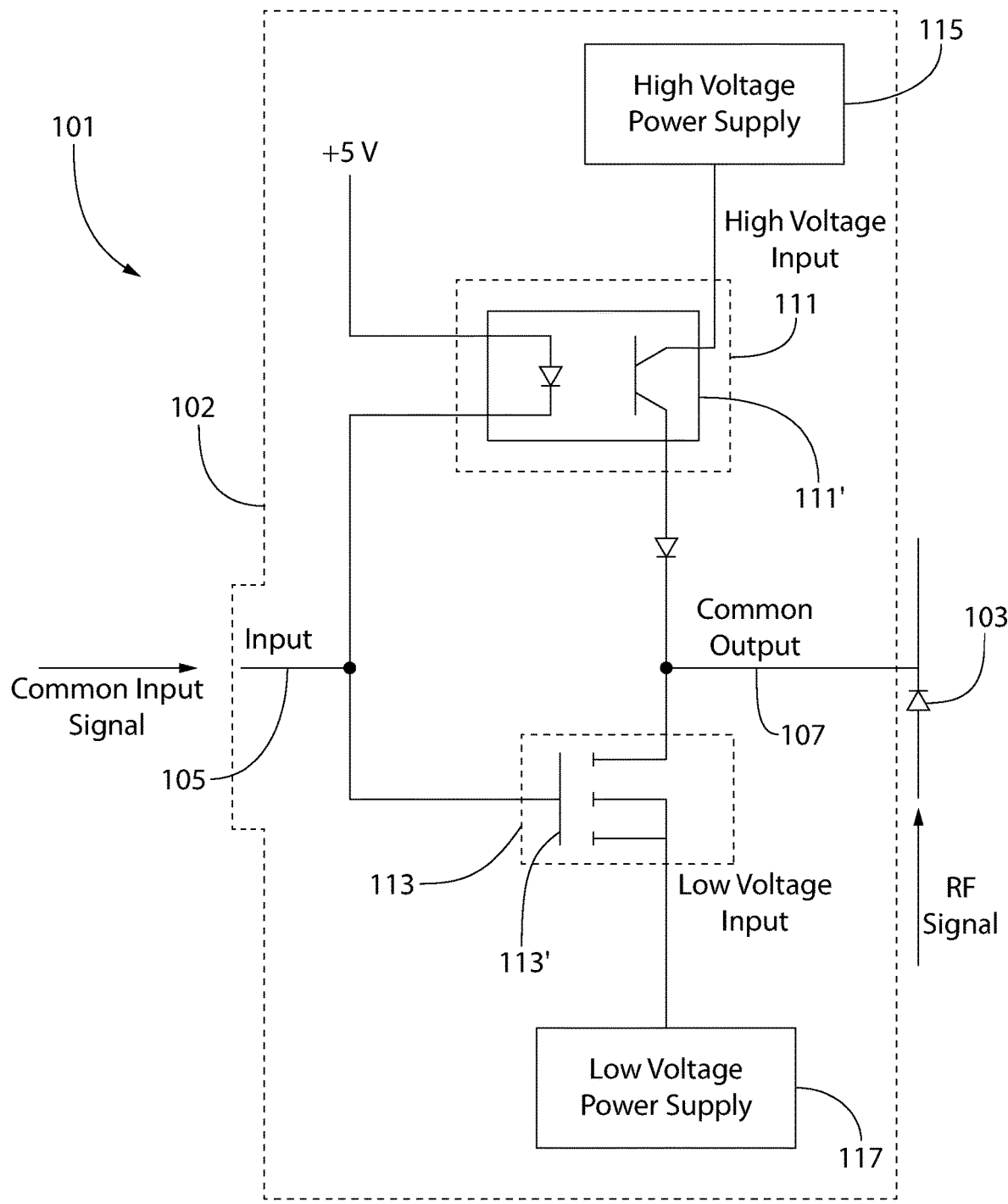
FIG. 3A illustrates a first switching circuit for use with an EVC.

FIG. 3A shows an embodiment of a high voltage switching circuit 101, which is shown including a driver circuit 102 and a PiN/NiP diode 103 as an electronic switch. Although this switching circuit is shown with the driver circuit 102 integrated with the PiN/NiP diode 103, one of skill in the art will understand that in practice, the PiN/NiP diode 103, or any other type of electronic switch, may be integrated with the discrete capacitors in an EVC that is part of an RF impedance matching network, with the RF choke and filter circuit connected between the output of the driver circuit 102 and the PiN/NiP diode 103.

The switching circuit 101 may be used for switching one of the discrete capacitors in an EVC between an 'ON' state and an 'OFF' state. One of skill in the art will recognize that the use of the PiN/NiP diode 103 in this embodiment is exemplary, and that the switching circuit 101 may include other types of circuitry that does not include the PiN/NiP diode 103, yet still provides some of the same fast switching advantages of the PiN/NiP diode 103 for switching one of the discrete capacitors in an EVC. One of skill in the art will also recognize that certain components of the driver circuit 102 may be replaced with other components that perform the same essential function while also greater allowing variability in other circuit parameters (e.g., voltage range, current range, and the like).

This driver circuit 102 has an input 105 which receives a common input signal for controlling the voltage on the common output 107 that is connected to and drives the PiN/NiP diode 103. The voltage on the common output 107 switches the PiN/NiP diode 103 between the 'ON' state and the 'OFF' state, thus also switching 'ON' and 'OFF' the discrete capacitor to which the PiN/NiP diode 103 is connected. The state of the discrete capacitor, in this exemplary embodiment, follows the state of the state of the PiN/NiP diode 103, such that when the PiN/NiP diode 103 is 'ON', the discrete capacitor is also 'ON', and likewise, when the PiN/NiP diode 103 is 'OFF', the discrete capacitor is also 'OFF'. Thus, statements herein about the state of the PiN/NiP diode 103 inherently describe the concomitant state of the connected discrete capacitor of the EVC.

The input 105 is connected to both a first power switch 111 and into a second power switch 113. As depicted, the first power switch 111 is an optocoupler phototransistor 111', and the second power switch 113 is a MOSFET 113'. A high voltage power supply 115 is connected to the first power switch 111, providing a high voltage input which is to be switchably connected to the common output 107. A low voltage power supply 117 is connected to the second power switch 113, providing a low voltage input which is also to be switchably connected to the common output 107. In the configuration of the driver circuit 102 shown, the low voltage power supply 117 may supply a low voltage input which is about −5 V. Such a low voltage, with a negative polarity, is sufficient to provide a forward bias for switching the PiN/NiP diode 103. For other configurations of the driver circuit 102, a higher or lower voltage input may be used, and the low voltage input may have a positive polarity, depending upon the configuration and the type of electronic switch being controlled.

The common input signal asynchronously controls the 'on' and 'off' states of the first power switch 111 and the second power switch 113, such that when the first power switch 111 is in the 'on' state, the second power switch 113 is in the 'off' state, and similarly, when the first power switch is in the 'off' state, the second power switch 113 is in the 'on' state. In this manner, the common input signal controls the first power switch 111 and the second power switch 113 to asynchronously connect the high voltage input and the low voltage input to the common output for purposes of switching the PiN/NiP diode 103 between the 'ON' state and the 'OFF' state.

The input 105 may be configured to receive any type of appropriate control signal for the types of switches selected for the first power switch 111 and the second power switch 113, which may be, for example, a +5 V control signal. Of course, to maintain simplicity of the overall driver circuit 102 and avoid incurring additional manufacturing costs, the first and second power switches 111, 113 are preferably selected so that they may directly receive the common input signal without requiring additional circuitry to filter or otherwise transform the common input signal.

The switching circuit 101 has design features which make it particularly useful for switching between a high voltage input and a low voltage input on the common output quickly and without the need to float the drive circuit, with respect to the high voltage input, or require use of special gate charging circuits due to isolation of the input signal from the high voltage input. Another advantage of the switching circuit 101 is that it provides the ability to switch the common output between voltage modes quickly, within the time frame of about 15 μsec or less. The simplicity of the switching circuit 101 should considerably reduce manufacturing costs, especially when compared to other circuits performing similar functionality, and it should also significantly reduce space requirements for the circuit, and again, especially as compared to other circuits performing similar functionality. These advantages make the switching circuit 101 particularly advantageous with the incorporated PiN/NiP diode 103.

One of the ways in which these advances are realized is the first power switch 111 being a monolithic circuit element, such as the optocoupler phototransistor 111'. A monolithic element reduces both cost and space requirements. When an optocoupler phototransistor 111' is used as the monolithic element, it can perform the necessary high voltage switching quickly, and it serves to isolate the high voltage input from the common input signal. Other, as yet unrealized advantages may also be present through the use of an optocoupler phototransistor 111'.

An optocoupler phototransistor 111' serves well as the first power switch 111 for use in conjunction with the PiN/NiP diode 103 because of the low current requirements for the PiN/NiP diode 103 when in the 'OFF' state. During the 'OFF' state, the PiN/NiP diode 103 is reverse biased, and thus non-conducting, and as such the 'OFF' state current requirement falls within the current handling capability of most optocoupler phototransistors. In addition, in implementations when one or both of the voltage requirements or the current requirements exceed the specifications for a single optocoupler phototransistor, additional optocoupler phototransistors may be added into the circuit in series or in parallel to increase the voltage and/or current handling capabilities of the switching circuit.

To further highlight the advantages of the switching circuit 101, its operation is detailed when the first power switch 111 is an optocoupler phototransistor 111' and the second power switch 113 is an appropriate MOSFET 113'. In this example, the common input signal may be a 5 V control signal which is alternated between a first voltage level and a second voltage level that serve to switch both the optocoupler phototransistor 111' and the MOSFET 113' between 'on' and 'off' states. The manner of implementing a 5 V control signal is well known to those of skill in the art.

When the PiN/NiP diode 103 is to be turned to the 'OFF' state, the optocoupler phototransistor 111' is turned to the 'on' state by applying the first voltage level from the common input signal across the photodiode inputs of the optocoupler phototransistor 111'. Turning the optocoupler phototransistor 111' to the 'on' state connects high voltage input to the common output 107, thereby reverse biasing the PiN/NiP diode 103. At the same time, during this 'OFF' state of the PiN/NiP diode 103, application of the first voltage level from the common input signal to the MOSFET 113' places the MOSFET 113' in the 'off' state, thereby disconnecting low voltage input from the common output 107.

When the PiN/NiP diode 103 is to be turned to the 'ON' state, the optocoupler phototransistor 111' is turned to the 'off' state by applying the second voltage level from the common input signal across the photodiode inputs of the optocoupler phototransistor 111'. Turning the optocoupler phototransistor 111' to the 'off' state disconnects high voltage input from the common output 107. At the same time, application of the second voltage level from the common input signal to the MOSFET 113' places the MOSFET 113' in the 'on' state, thereby connecting the low voltage input to the common output 107. With the MOSFET 113' in the 'on' state, and the optocoupler phototransistor 111' to the 'off' state, only the low voltage input is connected to the common output 107, so that the PiN/NiP diode 103 is forward biased and placed in the 'ON' state.

As indicated above, the optocoupler phototransistor 111' provides the advantage that the common input signal is electrically isolated, through the internal optical switch (not shown) of the optocoupler phototransistor 111', from the switched high voltage, thus alleviating the need to float the drive circuit (such as when a MOSFET is used to switch the high voltage). Use of the optocoupler phototransistor 111' provides the additional advantage that the driver circuit 102 can quickly switch the common output 107 between the high voltage input and the low voltage input, with the switching occurring within the time frame of about 15 μsec or less. This fast switching time helps reduce switching loss, thereby reducing stress on the PiN/NiP diode itself, and introduces improvements in the semiconductor fabrication process by reducing the amount of time it takes for the RF impedance matching network to create an impedance match between the RF source and the plasma chamber.

The use of optocoupler phototransistors in the driver circuit 102 also provides advantages for switching a high voltage input in the range of 500 V-1000 V. Higher or lower voltages may also be switched with this driver circuit 102. The high voltage input may therefore differ from the low voltage input by at least two or three orders of magnitude, or more. Advantageously, when the switching circuit 101 incorporates the PiN/NiP diode 103, the high voltage input and the low voltage input may have opposite polarities.

Figure 3B:
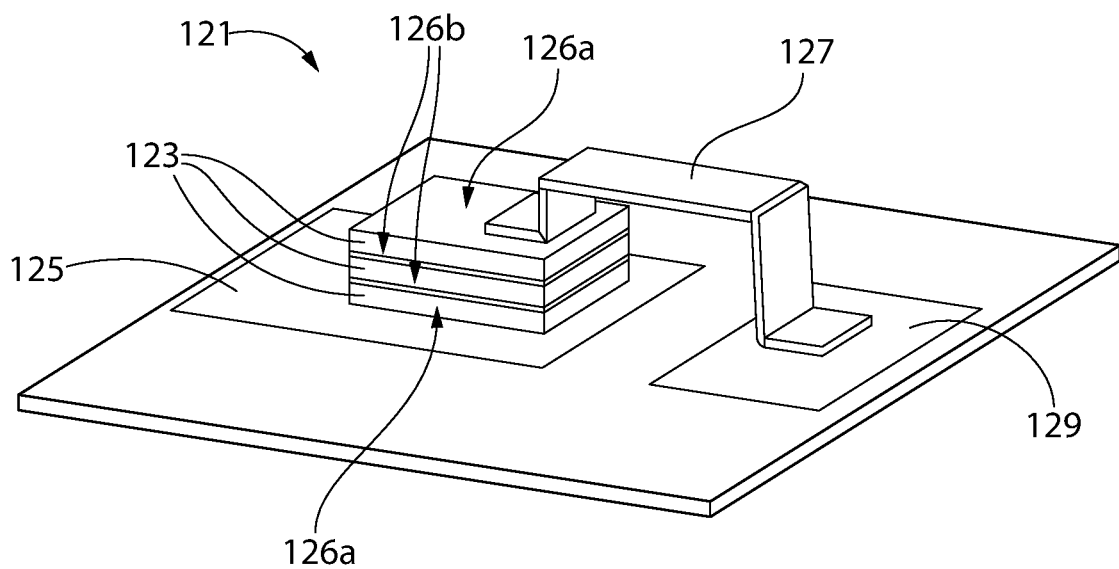
FIG. 3B illustrates a first multiple-diode arrangement which may be used as an electronic switch in the switching circuit of FIG. 3A.
Figure 3C:
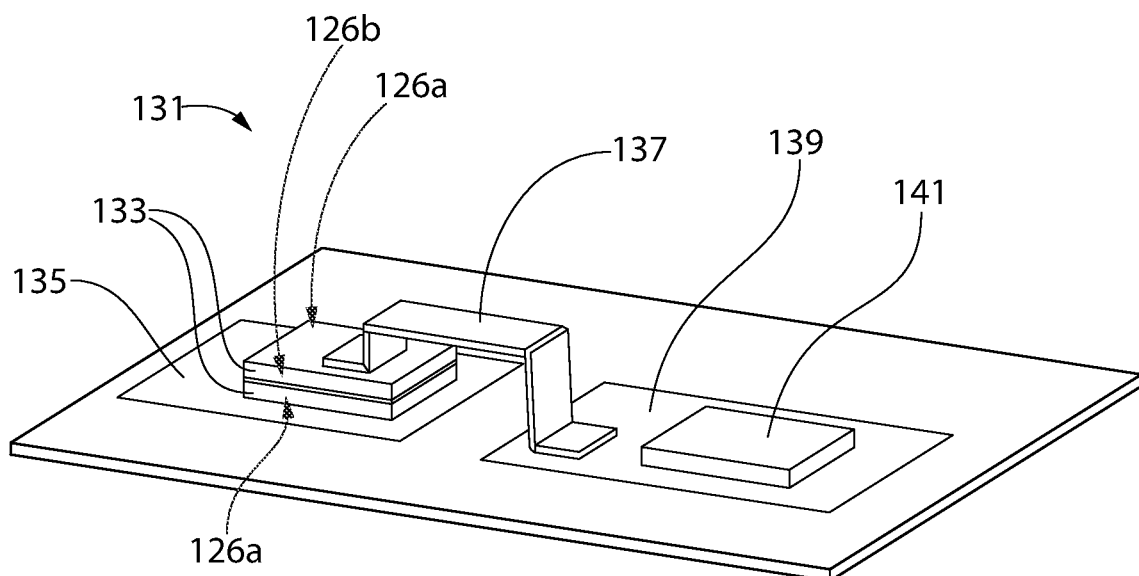
FIG. 3C illustrates a second multiple-diode arrangement which may be used as an electronic switch in the switching circuit of FIG. 3A.

In certain embodiments, the switching circuit 101 may include a multiple-diode arrangement, examples of which are shown in FIGS. 3B-C. In such embodiments, the common output 107 of the driver circuit 102 is used to switch each diode in the multiple-diode arrangement. A switching circuit 101 including a multiple-diode arrangement is particularly advantageous when the RF signal output from the RF source approaches 1,000 V or more. For example, in order to switch an RF signal having a 1,000 V peak amplitude (which is the equivalent of a 2,000 V peak-to-peak amplitude), the high voltage power supply 115 of the driver circuit 102 may provide a high voltage input of −1,200 V. This voltage for the high voltage power supply 115 provides the needed voltage to reverse bias the PiN/NiP diode while also providing upper and lower margins for blocking the RF signal, each of the upper and lower margins being about 10% of the RF signal peak voltage. In such embodiments, the −1,200 V reverse bias voltage places the use of the PiN/NiP diode well within the typical operational range of a single PiN/NiP diode. In general, the operational range of a PiN/NiP diode may be defined by the breakdown voltage, such that the minimum breakdown voltage for PiN/NiP diode within the switching circuit 101 is defined by:

$$BV_{min} = V_{UM} + V_{LM} + 2 \times V_{RF\text{-}Peak},$$

where $BV_{min}$ is the minimum required breakdown voltage of the PiN/NiP diode; $V_{UM}$ is the desired upper margin provided in the high voltage input; $V_{LM}$ is the desired lower margin provided in the high voltage input; and $V_{RF\text{-}peak}$ is the peak voltage of the RF signal. Since PiN/NiP diodes are generally available on the market having breakdown voltages of up to 4,000 V, when the peak voltage of the RF signal is less than about 1,800 V, a single PiN/NiP diode suffices as the electronic switch. However, in certain uses, the peak voltage of the RF signal output from the RF source may be in excess of 1,800 V, even approaching 5,000 V or more. In such instances, a single PiN/NiP diode does not suffice as the electronic switch. For example, in a use in which the peak voltage of the RF signal is about 4,600 V, the necessary breakdown voltage for a single PiN/NiP diode would be about 9,200 V. However, such a single PiN/NiP diode is not available on the market.

In order to have an operating switching circuit in uses where the RF signal output from the RF source may be in excess of 1,800 V, multiple PiN/NiP diodes may be placed in series as part of the switching circuit 101, with the common output 107 reverse biasing the series of PiN/NiP diodes as if the multiple PiN/NiP diodes were a single, monolithic PiN/NiP diode. In other words, the multiple PiN/NiP diodes connected in series may be directly substituted for the single PiN/NiP diode 103 of FIG. 3A without any further modification to the switching circuit 101. By using multiple PiN/NiP diodes connected in series, the breakdown voltage of the multiple PiN/NiP diodes is higher than the breakdown voltage of a single PiN/NiP diode. Advantageously, multiple bare die PiN/NiP diodes may be formed into a stack of diodes for use in this manner.

The PiN/NiP diode stack 121 shown in FIG. 3B may be used as part of the switching circuit 101. The stack 121 includes several bare die PiN/NiP diodes 123 stacked together and directly coupled to a first conductive surface 125. Each bare die PiN/NiP diode 123 includes a cathode end and an anode end, and within the stack 121 the cathode end of one bare die PiN/NiP diode 123 is directly coupled to the anode end of an adjacent bare die PiN/NiP diode 123. The direct coupling between the adjacent bare die PiN/NiP diodes 123 may be achieved by soldering. The cathode or anode of the bottom bare die PiN/NiP diode 123 in the stack 121 serves as the cathode/anode for the entire stack 121, and the cathode or anode of the top bare die PiN/NiP diode 123 in the stack 121 serves as the anode/cathode, respectively, for the entire stack 121. The cathode/anode of the top bare die PiN/NiP diode 123 in the stack 121 is coupled by a strap or wirebond 127 to a second conductive surface 129. In certain embodiments, the first conductive surface 125 may connect the stack 121 to the top electrode 59 of the EVC 51, and the second conductive surface may connect the stack 121 to the driver circuit 103. In certain embodiments, the first and second conductive surfaces 125, 129 may be contact pads on the substrate 60 of the EVC 51. In certain other embodiments, the first conductive surface 125 may be the top electrode 59 of an EVC 51.

The alternative embodiment of the PiN/NiP diode stack 131 shown in FIG. 3C may also be used as part of the switching circuit 101. The stack 131 includes several bare die PiN/NiP diodes 133 stacked together and directly coupled to a first conductive surface 135. Each bare die PiN/NiP diode 133 includes a cathode end and an anode end, and within the stack 131 the cathode end of one bare die PiN/NiP diode 133 is directly coupled to the anode end of an adjacent bare die PiN/NiP diode 133. The direct coupling between the adjacent bare die PiN/NiP diodes 133 may again be achieved by soldering. The cathode or anode of the bottom bare die PiN/NiP diode 133 in the stack 131 serves as the cathode/anode for the entire stack 131, and the cathode or anode of the top bare die PiN/NiP diode 133 in the stack 131 serves as the anode/cathode, respectively, for the entire stack 131. The cathode/anode of the top bare die PiN/NiP diode 133 in the stack 131 is coupled by a strap or wirebond 137 to a second conductive surface 139, to which another bare die PiN/NiP diode 141 is directly coupled. In certain embodiments, this other bare die PiN/NiP diode 141 may also be formed by a stack of bare die PiN/NiP diode diodes. The cathode/anode of the bare die PiN/NiP diode 141 that is not coupled to the second conductive surface 139 may be coupled to the driver circuit 103. In certain embodiments, the first conductive surface 135 may connect the stack 131 to the top electrode 59 of the EVC 51. In certain embodiments, the first and second conductive surfaces 135, 139 may be contact pads on the substrate 60 of the EVC 51. In certain other embodiments, the first conductive surface 135 may be the top electrode 59 of an EVC 51.

Figure 4:
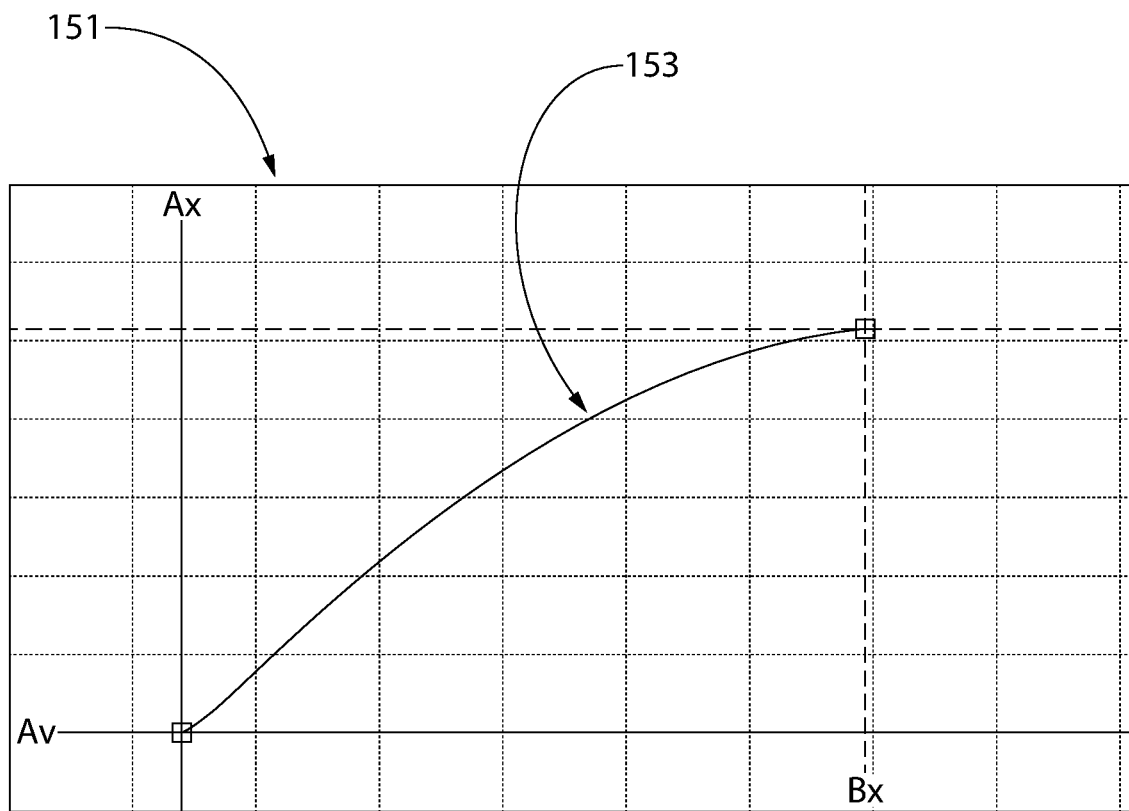
FIG. 4 is a graphical representation showing the timing capabilities of a driver circuit to switch to high voltage on the common output.
Figure 5:
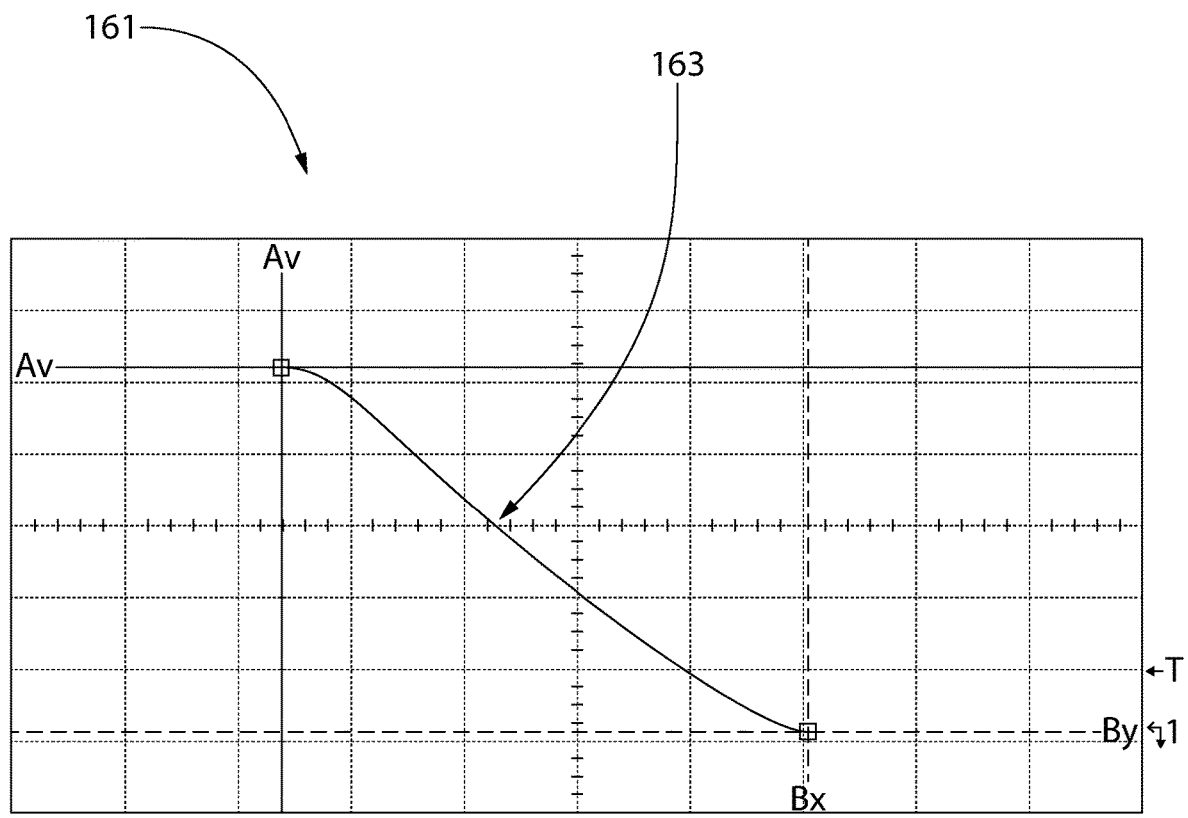
FIG. 5 is a graphical representation showing the timing capabilities of a driver circuit to switch to low voltage on the common output.

The ability of the driver circuit 102 to provide quick switching capabilities is exemplified by the graphs 151, 161 of FIGS. 4 and 5. The voltage curve 153 of FIG. 4 shows the voltage on the common output 107 of the driver circuit 102 in order to switch the connected PiN/NiP diode 103 to the 'OFF' state. As is shown by the voltage curve 153, the driver circuit 102 is capable of switching to connect the high voltage input, which in this example is approximately 1,000 V, to the common output 107 within about 11 μsec. The voltage curve 163 of FIG. 5 shows the voltage on the common output 107 of the driver circuit 102 in order to switch the connected PiN/NiP diode 103 to the 'ON' state. As is shown by the voltage curve 163, the driver circuit 102 is capable of switching to connect the low voltage input, which in this example is approximately −12 V, to the common output 107 within about 9 μsec. Thus, an RF impedance matching network which includes EVCs and switching circuits, as described above, shows significant improvements as compared to an RF impedance matching network which includes VVCs.

Figure 6A:
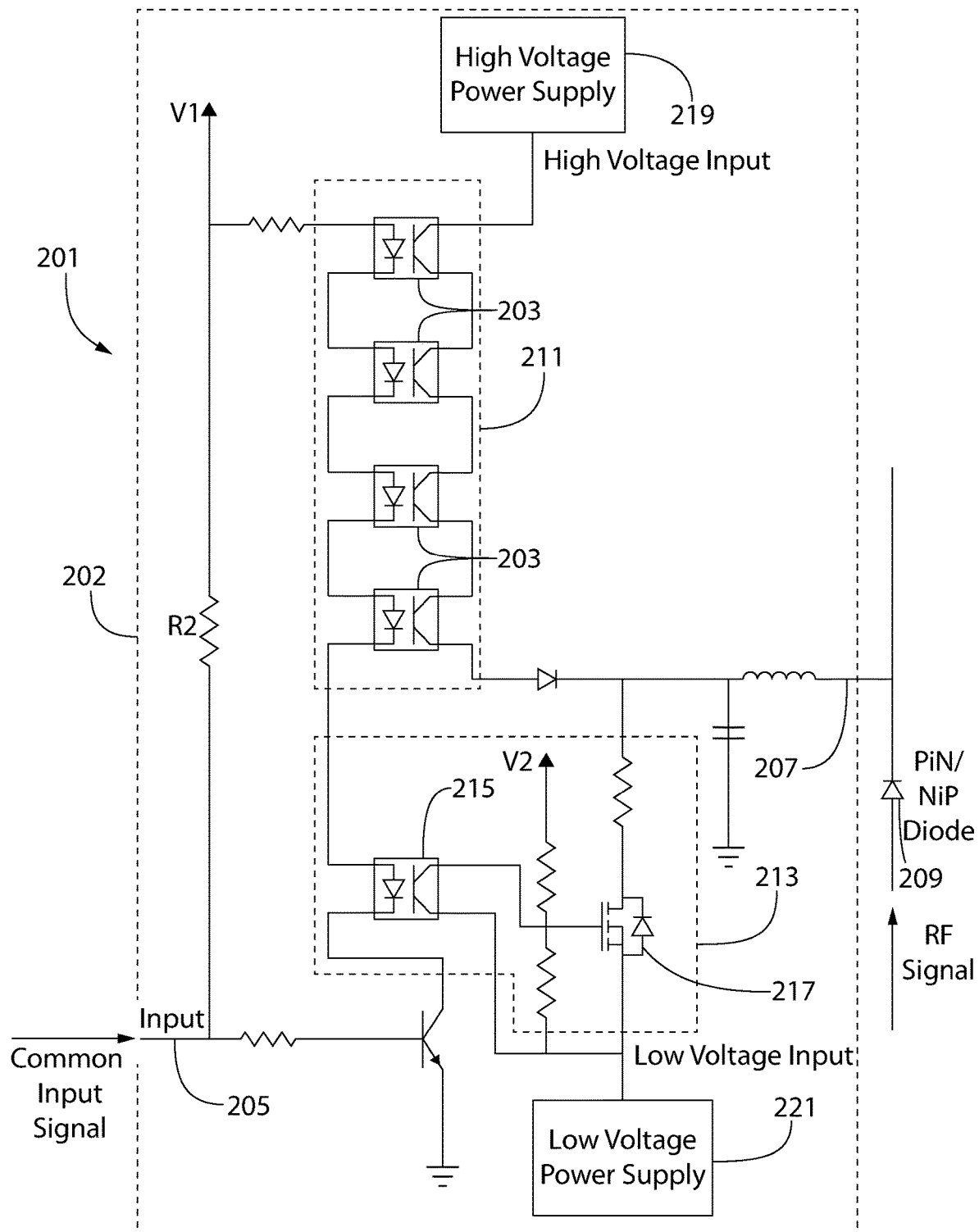
FIG. 6A illustrates a second switching circuit for use with an EVC.

A switching circuit 201 which includes a driver circuit 202 having multiple optocoupler phototransistors 203 to increase the high voltage capabilities is shown in FIG. 6A. Like the driver circuit 102 of FIG. 3A, this driver circuit 202 includes an input 205 which receives a common input signal for controlling the voltage on the common output 207. The switching circuit 201 includes a PiN/NiP diode 209 connected to the common output 207, and the voltage on the common output 207 may be used to switch the PiN/NiP diode 209 between 'ON' state and 'OFF' states. The input 205 is connected to both a first power switch 211, which includes the optocoupler phototransistors 203, and to a second power switch 213, which includes another optocoupler phototransistor 215 and a MOSFET 217. Also like the switching circuit 101 of FIG. 3A, the common output 207 of the driver circuit 202 may be used to switch a multiple-diode arrangement. In certain embodiments, the multiple-diode arrangement may be those depicted in FIGS. 3B and 3C. In certain other embodiments, other types of multiple-diode arrangements may be used.

A high voltage power supply 219 is connected to the first power switch 211, providing a high voltage input which is to be switchably connected to the common output 207. A low voltage power supply 221 is connected to the second power switch 213, providing a low voltage input which is also to be switchably connected to the common output 207.

The optocoupler phototransistors 203 of the first power switch 211 are connected in series to each other in order to enable the first power switch 211 to switch higher voltages onto the common output 207 in the same manner as discussed above with a single optocoupler phototransistor. With appropriate selection of the optocoupler phototransistors 203, the first power switch 211, as shown, is capable of switching about 1000 V or more from the high voltage power supply 219 to the common output 207. Additional optocoupler phototransistors may be added in series for the first power switch 211 to increase the high voltage switching capabilities. One of skill in the art will recognize that one or more optocoupler phototransistors may be connected in parallel to each other to increase the current load capabilities of the first power switch 211. One optocoupler phototransistor may be used to switch low voltages through the design rating of the optocoupler phototransistor, with more optocoupler phototransistors being added to switch higher voltages.

The optocoupler phototransistor 215 of the second power switch 213 receives the common input signal, like the optocoupler phototransistors 203 of the first power switch 211. This optocoupler phototransistor 215 is connected to the MOSFET 217 and places the MOSFET 217 in the 'off' state by connecting the source to the gate when the common input signal places the first power switch 211 in the 'on' state. In this configuration, when the MOSFET 217 is in the 'on' state, the second power switch 213 is also in the 'on' state, connecting the low power input to the common output 207. Likewise, when the MOSFET 217 is in the 'off' state, the second power switch 213 is also in the 'off' state, so that the low power input is disconnected from the common output 207. When the first power switch is in the 'off' state, optocoupler phototransistor 215 disconnects the gate from the source, so that the MOSFET 217 placed in the 'on' state by the gate being connected to the voltage V2, which is an appropriate voltage for controlling the gate of the MOSFET 217.

Figure 6B:
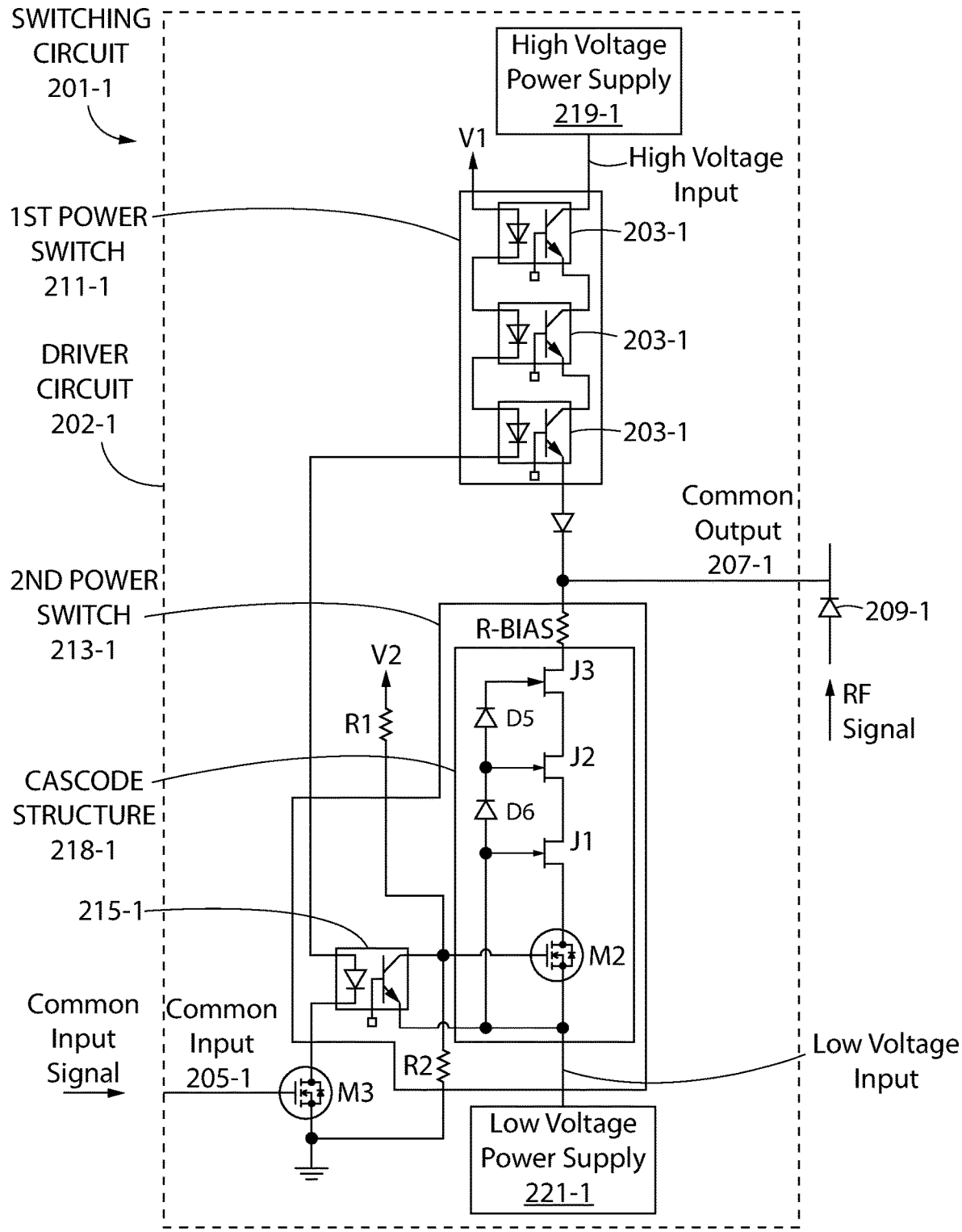
FIG. 6B illustrates a third switching circuit for use with an EVC.

FIG. 6B shows a switching circuit 201-1 according to yet another embodiment of the invention. In this embodiment, the switching circuit 201-1 can utilize a cascode structure 218-1 to increase high voltage capabilities and increase switching speed while providing a simple control scheme.

In the exemplified embodiment, the switching circuit 201-1 includes a driver circuit 202-1 (sometimes referred to as a control circuit) and a PiN/NiP diode 209-1. As in other embodiments, the driver circuit 202-1 includes an input 205-1 that receives a common input signal for controlling the voltage on the common output 207-1. The PiN/NiP diode 209-1 is connected to the common output 207-1, and the voltage on the common output 207-1 may be used to switch the PiN/NiP diode 209-1 between 'ON' and 'OFF' states. The common input 205-1 is connected to both a first power switch 211-1 and a second power switch 213-1.

As with switching circuits 101 and 201, switching circuit 201-1 may be used for switching one of the discrete capacitors in an EVC between an 'ON' state and an 'OFF' state. One of skill in the art will recognize that the use of the PiN/NiP diode 209-1 in this embodiment is exemplary, and that the switching circuit 201-1 may include other types of circuitry that does not include the PiN/NiP diode 209-1, yet still provides some of the same advantages of the PiN/NiP diode 209-1 for switching one of the discrete capacitors in an EVC. One of skill in the art will also recognize that certain components of the driver circuit 202-1 may be replaced with other components that perform the same essential function while also greater allowing variability in other circuit parameters (e.g., voltage range, current range, and the like). One of skill in the art will also recognize that certain commonly known components have been omitted from discussion for clarity.

The PiN/NiP diode 209-1 is configured to receive an RF signal. In the exemplified embodiment, the RF signal is a high voltage RF signal (e.g., 1000 V peak amplitude, 3000 V peak amplitude, or 4000 V peak amplitude). Accordingly, a high voltage power supply (e.g., 1200 VDC for a 1000V peak amplitude RF signal) is required to reverse bias the PiN/NiP diode 209-1 and thereby turn the switching circuit 201-1 'OFF'. The high voltage of the high voltage power supply 219-1 can be two orders of magnitude or more greater than the low voltage of the low voltage power supply 221-1.

The high voltage power supply 219-1 is connected to the first power switch 211-1, providing a high voltage input which is to be switchably connected to the common output 207-1. A low voltage power supply 221-1 is connected to the second power switch 213-1, providing a low voltage input which is also to be switchably connected to the common output 207-1. In the configuration of the driver circuit 202-1 shown, the low voltage power supply 221-1 may supply a low voltage input which is about −5 V. Such a low voltage, with a negative polarity, is sufficient to provide a forward bias for switching the PiN/NiP diode 209-1. For other configurations of the driver circuit 202-1, a higher or lower voltage input may be used, and the low voltage input may have a positive polarity, depending upon the configuration and the type of electronic switch being controlled.

The common input signal asynchronously controls the 'on' and 'off' states of the first power switch 211-1 and the second power switch 213-1, such that when the first power switch 211-1 is in the 'on' state, the second power switch 213-1 is in the 'off' state, and similarly, when the first power switch 211-1 is in the 'off' state, the second power switch 213-1 is in the 'on' state. In this manner, the common input signal controls the first power switch 211-1 and the second power switch 213-1 to asynchronously connect the high voltage input and the low voltage input to the common output for purposes of switching the PiN/NiP diode 209-1 between the 'ON' state and the 'OFF' state.

The common input 205-1 may be configured to receive any type of appropriate control signal for the types of switches selected for the first power switch 211-1 and the second power switch 213-1, which may be, for example, a +5 V control signal.

The switching circuit 201-1 has design features which make it particularly useful for switching between a high voltage input and a low voltage input on the common output quickly and without the need to float the drive circuit, with respect to the high voltage input, or require use of special gate charging circuits due to isolation of the input signal from the high voltage input. Another advantage of the switching circuit 201-1 is that it can provide the ability to switch the common output between voltage modes quickly, within the time frame of about 5 μsec or less. The simplicity of the switching circuit 201-1 should considerably reduce manufacturing costs, especially when compared to other circuits performing similar functionality, and it should also significantly reduce space requirements for the circuit, and again, especially as compared to other circuits performing similar functionality. These advantages make the switching circuit 201-1 particularly advantageous with the incorporated PiN/NiP diode 209-1.

Similar to first power switches 111 and 211, first power switch 211-1 can utilize at least one optocoupler phototransistor 203-1. (The terms optocoupler and optocoupler phototransistor are used interchangeably herein.) In the exemplified embodiment, three optocoupler phototransistors 203-1 are utilized. The high voltage power supply 219-1 is connected to the collector port of the topmost optocoupler phototransistor 203-1. Advantages of the use of optocoupler phototransistors in the first power switch are discussed above. The optocoupler phototransistors 203-1 of the first power switch 211-1 are connected in series to each other to enable the first power switch 211-1 to switch higher voltages onto the common output 207 in a manner similar to that discussed above. With appropriate selection of the optocoupler phototransistors 203-1, the first power switch 211-1 is capable of switching 1000 V or more from the high voltage power supply 219-1 to the common output 207-1. In other embodiments, additional optocoupler phototransistors may be added in series for the first power switch 211-1 to increase the high voltage switching capabilities. In yet other embodiments, fewer optocoupler phototransistors may be used, including use of a single optocoupler phototransistor.

The second power switch 213-1 can include a cascode structure 218-1 designed to increase the blocking voltage capability of the switching circuit 201-1. The cascode structure 218-1 includes multiple JFETs J1, J2, J3 in series. These JFETs are connected in series with a low-voltage MOSFET M2. As a non-limiting example, the JFETs can be 1700 VDC JFETs, while and the MOSFET can be a 30V MOSFET. Specifically, the MOSFET M2 is connected in series between the JFETs J1, J2, J3 and the low voltage power supply. Between each of the JFET gates is a diode D5, D6. In other embodiments, a single JFET (rather than multiple JFETs) can be utilized for the cascode structure. A voltage source V2 is connected to the gate of MOSFET M2. The voltage source V2 is also connected to optocoupler phototransistor 215-1 (sometimes referred to as input optocoupler 215-1). When the optocoupler phototransistor 215-1 is turned on, the optocoupler phototransistor 215-1 can essentially short the gate of MOSFET M2 to the source of MOSFET M2, turning MOSFET M2 'off'. It is noted that the JFETs, MOSFETs, and optocoupler phototransistors can be replaced with other appropriate transistors or switches. Accordingly, a JFET such as one of JFETs J1, J2, J3 can be referred to as a first transistor, and a MOSFET such as MOSFET M2 can be referred to as a second transistor.

When the PiN/NiP diode 209-1 is in the 'ON' state, the first power switch 211-1 is in the 'off' state and the second power switch 213-1 is in the 'on' state. In the exemplified embodiment, the PiN/NiP diode 209-1 is put in the 'ON' state by applying a first common input signal of +0 V at the common input 205-1. When the +0 V first common input signal is applied, input MOSFET M3 (which can be another type of transistor, such as a BJT, and is sometimes referred to as the input transistor) is turned 'off'. Consequently, no current flows through the photodiode inputs of the optocoupler phototransistors 203-1, 215-1. Thus, the optocoupler transistors 203-1, 215-1 are turned 'off', common output 207-1 does not receive high voltage from the high voltage power supply 219-1, and the diode 209-1 is not reverse biased.

At the same time, since optocoupler 215-1 is 'off', the gate of MOSFET M2 can receive a voltage from voltage V2. R1 and R2 form a voltage divider for voltage V2, so that the gate of MOSFET M2 receives a divided voltage from V2. In the exemplified embodiment, voltage V2 is +5 V. The receipt of divided voltage V2 at the gate of MOSFET M2 causes MOSFET M2 to switch 'on', which turns 'on' the first JFET J1 since the gate of first JFET J1 is then connected to its source. Next, the second JFET J2 can start conducting and turn 'on', since the voltage on the gate of JFET J5 is $-V_F$ (the forward voltage drop of diode D6). The same process can be repeated for turning 'on' the remaining JFETs (third JFET J3), until the voltage of the low voltage power supply 221-1 appears at the common output 207-1, thereby providing the necessary biasing voltage to forward bias PiN/NiP diode 209-1.

With the MOSFET M2 in the 'on' state, and the optocoupler phototransistors 203-1, 215-1 in the 'off' state, only the low voltage input is connected to the common output 209-1, so that the PiN/NiP diode 209-1 is forward biased and placed in the 'ON' state. When the optocouplers 203-1 of the first power switch are switched off, a voltage drop from the high voltage (of high voltage power supply 219-1) to the low voltage (of the low voltage power supply 221-1) occurs across the plurality of optocouplers.

By contrast, when the PiN/NiP diode 209-1 is in the 'OFF' state, the first power switch 211-1 is in the 'on' state and the second power switch 213-1 is in the 'off' state. In the exemplified embodiment, the PiN/NiP diode 209-1 is put in the 'ON' state by applying a second common input signal of +5 V at the common input 205-1. When the +5 V first common input signal is applied, input MOSFET M3 is turned 'on'. Consequently, current flows through the photodiode inputs of the optocoupler phototransistors 203-1, 215-1. Thus, the optocoupler transistors 203-1, 215-1 are turned 'on', and common output 207-1 receives high voltage from the high voltage power supply 219-1 to reverse bias diode 209-1.

At the same time, the gate of MOSFET M2 does not receive voltage V2, because optocoupler 215-1 is 'on', and therefore diverts voltage from the gate of MOSFET M2. Since the gate of MOSFET M2 does not receive voltage V2, MOSFET M2 switches 'off', which causes JFETS J1, J2, J3 to turn off, thereby preventing the low voltage of the low voltage power supply 221-1 to appear at the common output 207-1.

In this state, where the first power switch 211-1 is switched 'on' and the second power switch 213-1 is switched 'off', the high voltage power source can cause a large voltage across the MOSFET M2 and the JFETs J1, J2, J3. One benefit of this structure is that the MOSFET M2 can be a low-voltage MOSFET (e.g., 30 V), while the JFETs J1, J2, J3 can be higher-voltage JFETS (e.g., 1700 V) for handling the high voltage from the high voltage power source. For different applications, the MOSFET M2 can remain the same (in number and type), while the number or type of JFETs can be adjusted to handle the voltage requirements. Building a higher voltage switch can be achieved by simply adding one or more JFETs in series with the existing JFETs. There is no need to alter the switch configuration or how the switch needs to be driven. In this manner, the cascode structure increases the blocking voltage capability of the switching circuit.

With MOSFET M2 in the 'off' state, and the optocoupler phototransistors 203-1, 215-1 in the 'on' state, only the high voltage input is connected to the common output 209-1, so that the PiN/NiP diode 209-1 is reverse biased and placed in the 'ON' state.

Figure 7:
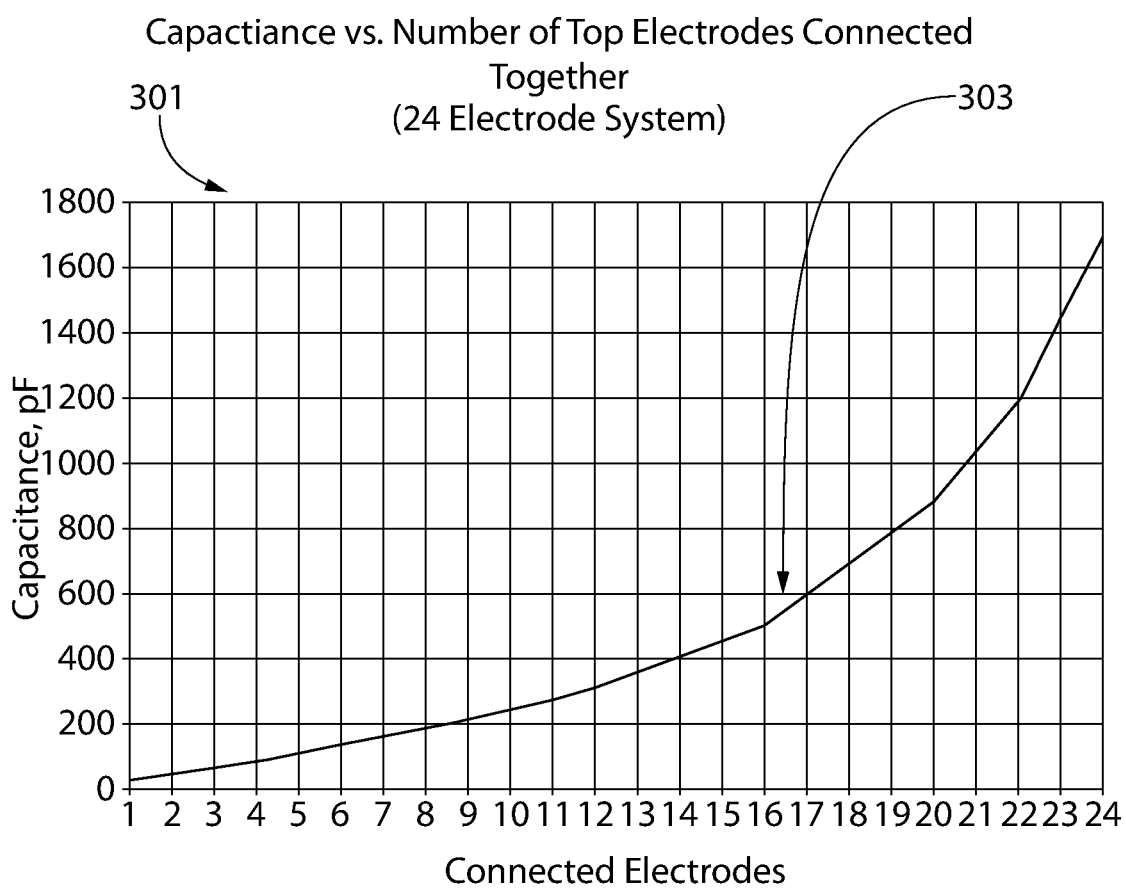
FIG. 7 is a graph showing the capacitance range of an EVC.

The non-linear capacitance range of a single EVC switched by a switching circuit is shown in the graph 301 of FIG. 7. The single EVC used to generate the capacitance curve 303 has 24 discrete capacitors in the manner described above, with the top electrodes of the discrete capacitors being selectively connected to arrive at the capacitance curve 303 shown. As can be seen, the single EVC may provide a capacitance ranging from only one active discrete capacitor (i.e., none of the top electrodes of any of the discrete capacitors are connected, so that the RF signal only flows through a single discrete capacitor) to all 24 discrete capacitors being active (i.e., all the top electrodes of all the discrete capacitors are connected). Any number of the 24 discrete capacitors may be connected, so that the capacitance of the single EVC may range from a low capacitance, with one active discrete capacitor as part of the array configuration, to a high capacitance, with all 24 discrete capacitors active as part of the array configuration. The low capacitance and the high capacitance are a matter of design choice for the EVC. In the capacitance curve shown, the low capacitance is about 25 pF, while the high capacitance is over 1,600 pF. The number of discrete capacitance values that is achievable between the low capacitance and the high capacitance is also a matter of design choice for the EVC, as more or fewer discrete capacitors may be included as part of the EVC. The only significant constraints on an EVC are the mechanical limitations posed by specific implementations (e.g., size or weight restrictions on the EVC). Mechanical limitations aside, an EVC does not appear to have any issues for achieving high value capacitance (e.g., 200,000 pF or higher).

Figure 8:
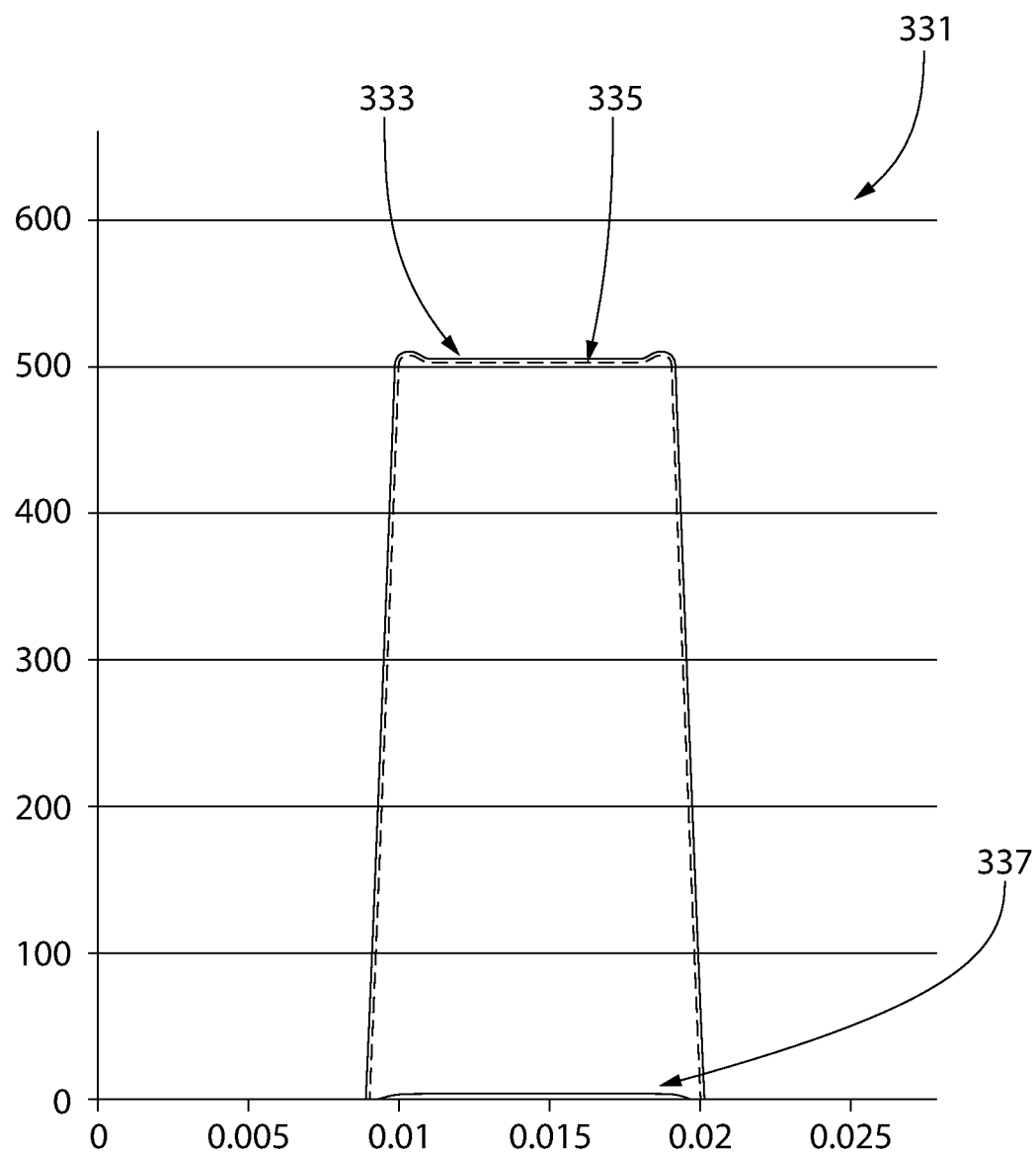
FIG. 8 is a graph showing the stable delivered power and the low reflected power that an impedance matching network including EVCs may provide during tuning.

The stable delivered power of an RF impedance matching network incorporating EVCs is shown in the graph 331 of FIG. 8, which does not show or take into account switching capabilities of an EVC controlled by a switching circuit. There are three curves shown in this graph 331: the output power 333 of the RF signal output from the RF source, which is about 500 V; the delivered power 335 to the plasma chamber; and the reflected power 337 back to the RF source. The output power 333 is a little over 500 V, while the reflected power 337 is in the range of about 10 V, so that the delivered power 335 to the plasma chamber is about 500 V. Not only is the delivered power 335 about 98% of the output power 333, but the delivered power 335, as can be seen, is substantially stable, without significant fluctuations. Both the percentage of delivered power 335 and the stability of the delivered power 335 represent significant improvements over an RF impedance matching network that is based on VVCs.

Figure 9:
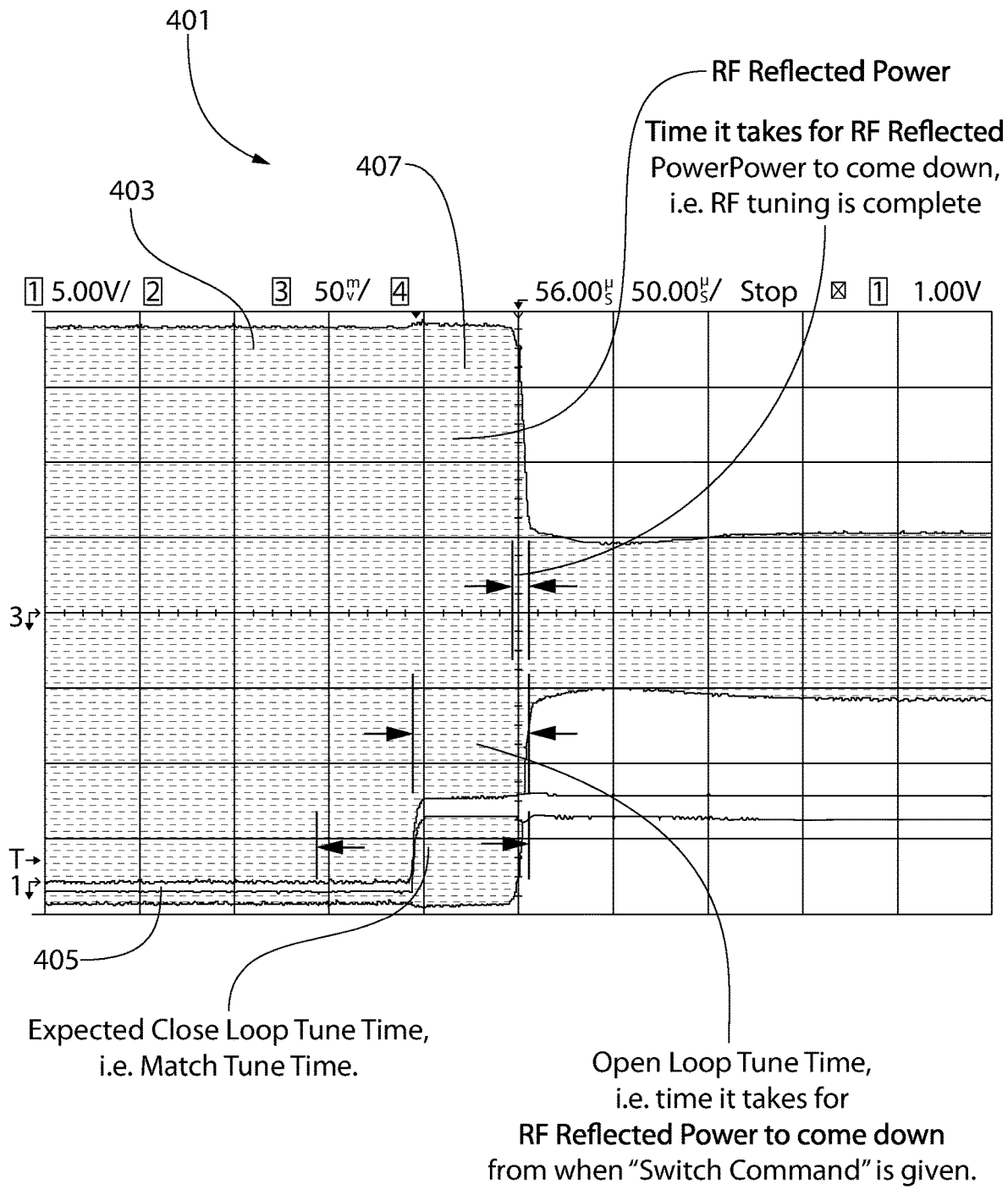
FIG. 9 is a graphical representation showing the reflected RF power profile through an RF impedance matching network using EVCs and showing the voltage supplied to the driver circuit for the EVCs.

When the switching capabilities of an EVC controlled by a switching circuit, in the manner described above, are incorporated into an RF impedance matching network, high speed switching is enabled for the RF impedance matching network. FIG. 9 is a graph 401 having voltage along the two y-axes and time along the x-axis to show the speed at which an RF impedance matching network using EVCs performs impedance matching (also referred to as the "match tune process"). A representation of an RF power profile 403 is shown, taken at the RF input of an RF impedance matching network, and the y-axis for the RF power profile has 50 mV divisions. A representation of the voltage of the common input signal 405 for driver circuits is also shown in the lower portion of the graph 401, the common input signal 405 originating from the control circuit of the RF impedance matching network, and the y-axis for the common input signal 405 has 5 V divisions. The x-axis has 50 μsec divisions, with the 56 μsec point marked in approximately the middle of the graph and the t=0 point as marked.

Initially, a significant amount of reflected power 407 is shown in the left portion of the RF power profile 403 (i.e., before the 56 μsec mark). This reflected power represents inefficiencies in the RF power being transferred between the RF source and the plasma chamber as a result of an impedance mismatch. At about t=−36 μsec, the match tune process begins. The first approximately 50 μsec of the match tune process is consumed by measurements and calculations performed by the control circuit in order to determine new values for the variable capacitances of one or both of the series and shunt EVCs.

Figure 10A:
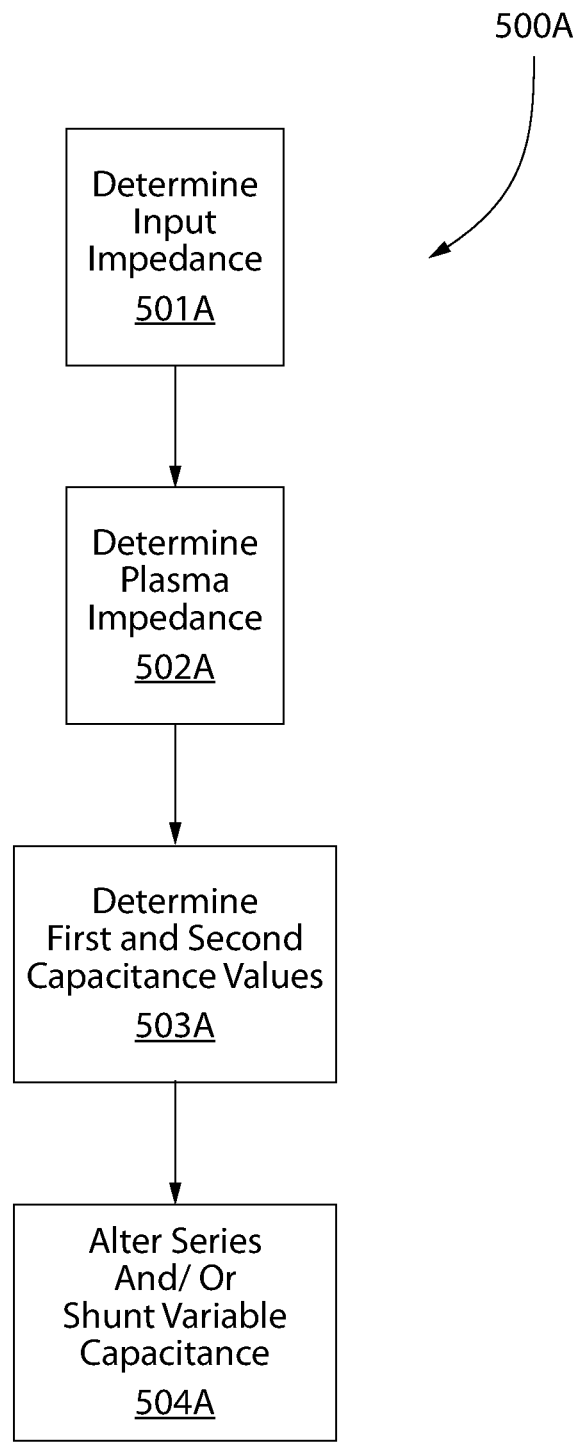
FIG. 10A is a flow chart showing an embodiment of a process for matching an impedance.

FIG. 10A is a flow chart showing a process 500A for matching an impedance according to one embodiment. Similar to the matching networks discussed above, the matching network 11 of the exemplified process includes the following (shown in FIG. 1): an RF input 13 configured to operably couple to an RF source 15, the RF source 15 having a fixed RF source impedance (e.g., 50 Ohms); an RF output 17 configured to operably couple to a plasma chamber 19, the plasma chamber 19 having a variable plasma impedance; a series electronically variable capacitor ("series EVC") 31 having a series variable capacitance, the series EVC 31 electrically coupled in series between the RF input 13 and the RF output 17; a shunt electronically variable capacitor ("shunt EVC") 33 having a shunt variable capacitance, the shunt EVC 33 electrically coupled in parallel between a ground 40 and one of the RF input 13 and the RF output 17; an RF input sensor 21 operably coupled to the RF input 13, the RF input sensor 21 configured to detect an RF input parameter at the RF input 13; an RF output sensor 49 operably coupled to the RF output, the RF output sensor configured to detect an RF output parameter; and a control circuit 45 operatively coupled to the series EVC 31 and to the shunt EVC 33 to control the series variable capacitance and the shunt variable capacitance. The steps of the exemplified process 500A can be carried out as part of the manufacture of a semiconductor, where a substrate 27 is placed in a plasma chamber 19 configured to deposit a material layer onto the substrate 27 or etch a material layer from the substrate 27, and plasma is energized within the plasma chamber 19 by coupling RF power from the RF source 15 into the plasma chamber 19 to perform a deposition or etching.

In the first step of the exemplified process 500A of FIG. 10A, an input impedance at the RF input 13 is determined (step 501A). The input impedance is based on the RF input parameter detected by the RF input sensor 21 at the RF input 13. The RF input sensor 21 can be any sensor configured to detect an RF input parameter at the RF input 13. The input parameter can be any parameter measurable at the RF input 13, including a voltage, a current, or a phase at the RF input 13. In the exemplified embodiment, the RF input sensor 21 detects the voltage, current, and phase at the RF input 13 of the matching network 11. Based on the RF input parameter detected by the RF input sensor 21, the control circuit 45 determines the input impedance.

Next, the control circuit 45 determines the plasma impedance presented by the plasma chamber 19 (step 502A). In one embodiment, the plasma impedance determination is based on the input impedance (determined in step 501A), the capacitance of the series EVC 31, and the capacitance of the shunt EVC 33. In other embodiments, the plasma impedance determination can be made using the output sensor 49 operably coupled to the RF output, the RF output sensor 49 configured to detect an RF output parameter. The RF output parameter can be any parameter measurable at the RF output 17, including a voltage, a current, or a phase at the RF output 17. The RF output sensor 49 may detect the output parameter at the RF output 17 of the matching network 11. Based on the RF output parameter detected by the RF output sensor 21, the control circuit 45 may determine the plasma impedance. In yet other embodiments, the plasma impedance determination can be based on both the RF output parameter and the RF input parameter.

Once the variable impedance of the plasma chamber 19 is known, the control circuit 45 can determine the changes to make to the variable capacitances of one or both of the series and shunt EVCs 31, 33 for purposes of achieving an impedance match. Specifically, the control circuit 45 determines a first capacitance value for the series variable capacitance and a second capacitance value for the shunt variable capacitance (step 503A). These values represent the new capacitance values for the series EVC 31 and shunt EVC 33 to enable an impedance match, or at least a substantial impedance match. In the exemplified embodiment, the determination of the first and second capacitance values is based on the variable plasma impedance (determined in step 502A) and the fixed RF source impedance.

Once the first and second capacitance values are determined, the control circuit 45 generates a control signal to alter at least one of the series variable capacitance and the shunt variable capacitance to the first capacitance value and the second capacitance value, respectively (step 504A). This is done at approximately t=−5 μsec. The control signal instructs the switching circuit 101 (FIG. 3A) to alter the variable capacitance of one or both of the series and shunt EVCs 31, 33.

This alteration of the EVCs 31, 33 takes about 9-11 μsec total, as compared to about 1-2 sec of time for an RF matching network using VVCs. Once the switch to the different variable capacitances is complete, there is a period of latency as the additional discrete capacitors that make up the EVCs join the circuit and charge. This part of the match tune process takes about 55 μsec. Finally, the RF power profile 403 is shown decreasing, at just before t=56 μsec, from about 380 mV peak-to-peak to about 100 mV peak-to-peak. This decrease in the RF power profile 403 represents the decrease in the reflected power 407, and it takes place over a time period of about 10 μsec, at which point the match tune process is considered complete.

The altering of the series variable capacitance and the shunt variable capacitance can comprise sending a control signal to the series driver circuit 39 and the shunt driver circuit 43 to control the series variable capacitance and the shunt variable capacitance, respectively, where the series driver circuit 39 is operatively coupled to the series EVC 31, and the shunt driver circuit 43 is operatively coupled to the shunt EVC 43. When the EVCs 31, 33 are switched to their desired capacitance values, the input impedance may match the fixed RF source impedance (e.g., 50 Ohms), thus resulting in an impedance match. If, due to fluctuations in the plasma impedance, a sufficient impedance match does not result, the process of 500A may be repeated one or more times to achieve an impedance match, or at least a substantial impedance match.

Using an RF matching network 11, such as that shown in FIG. 1, the input impedance can be represented as follows:

$$Z_{in} = \frac{(Z_P + Z_L + Z_{series})Z_{shunt}}{Z_P + Z_L + Z_{series} + Z_{shunt}}$$

where $Z_{in}$ is the input impedance, $Z_P$ is the plasma impedance, $Z_L$ is the series inductor impedance, $Z_{series}$ is the series EVC impedance, and $Z_{shunt}$ is the shunt EVC impedance. In the exemplified embodiment, the input impedance ($Z_{in}$) is determined using the RF input sensor 21. The EVC impedances ($Z_{series}$ and $Z_{shunt}$) are known at any given time by the control circuitry, since the control circuitry is used to command the various discrete capacitors of each of the series and shunt EVCs to turn ON or OFF. Further, the series inductor impedance ($Z_L$) is a fixed value. Thus, the system can use these values to solve for the plasma impedance ($Z_P$).

Based on this determined plasma impedance ($Z_P$) and the known desired input impedance ($Z'_{in}$) (which is typically 50 Ohms), and the known series inductor impedance ($Z_L$), the system can determine a new series EVC impedance ($Z'_{series}$) and shunt EVC impedance ($Z'_{shunt}$).

$$Z'_{in} = \frac{(Z_P + Z_L + Z'_{series})Z'_{shunt}}{Z_P + Z_L + Z'_{series} + Z'_{shunt}}$$

Based on the newly calculated series EVC variable impedance ($Z'_{series}$) and shunt EVC variable impedance ($Z'_{shunt}$), the system can then determine the new capacitance value (first capacitance value) for the series variable capacitance and a new capacitance value (second capacitance value) for the shunt variable capacitance. When these new capacitance values are used with the series EVC 31 and the shunt EVC 33, respectively, an impedance match may be accomplished.

This exemplified method of computing the desired first and second capacitance values and reaching those values in one step is significantly faster than moving the two EVCs step-by-step to bring either the error signals to zero, or to bring the reflected power/reflection coefficient to a minimum. In semiconductor plasma processing, where a faster tuning scheme is desired, this approach provides a significant improvement in matching network tune speed.

Figure 10B:
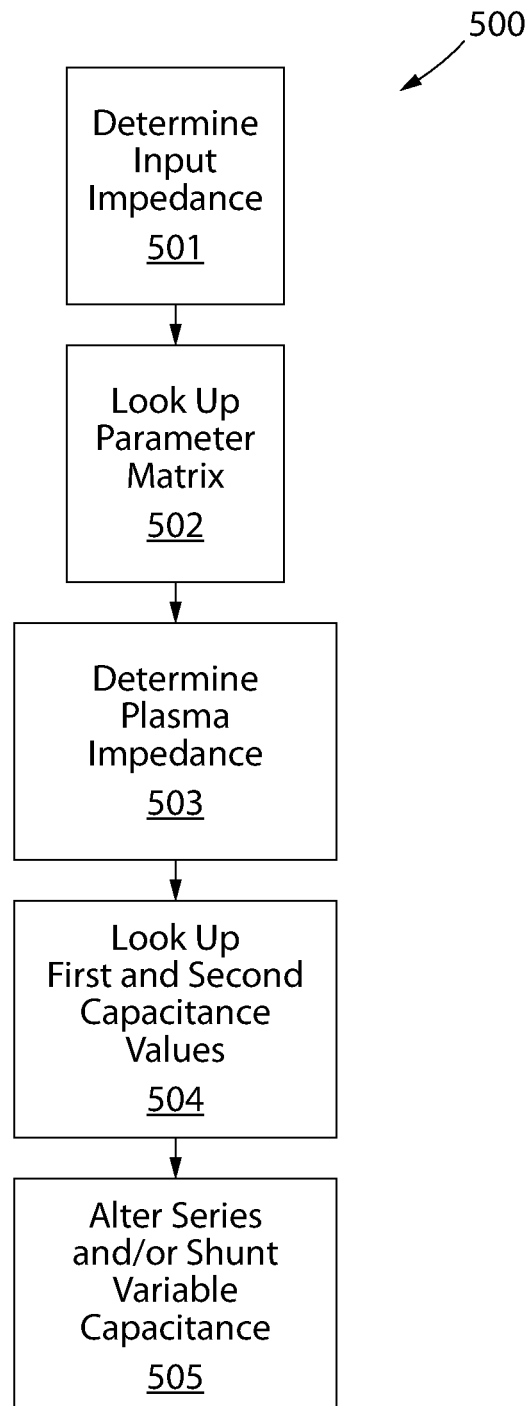
FIG. 10B is a flow chart showing another embodiment of a process for matching an impedance.

FIG. 10B is a flow chart showing a process 500 for matching an impedance according to one embodiment. Similar to the matching networks discussed above, the matching network 11 of the exemplified process includes the following (shown in FIG. 1): an RF input 13 configured to operably couple to an RF source 15, the RF source 15 having a fixed RF source impedance (e.g., 50 Ohms); an RF output 17 configured to operably couple to a plasma chamber 19, the plasma chamber 19 having a variable plasma impedance; a series electronically variable capacitor ("series EVC") 31 having a series array configuration, the series EVC 31 electrically coupled in series between the RF input 13 and the RF output 17; a shunt electronically variable capacitor ("shunt EVC") 33 having a shunt array configuration, the shunt EVC 33 electrically coupled in parallel between a ground 40 and one of the RF input 13 and the RF output 17; an RF input sensor 21 operably coupled to the RF input 13, the RF input sensor 21 configured to detect an RF input parameter at the RF input 13; an RF output sensor 49 operably coupled to the RF output 17, the RF output sensor 49 configured to detect an RF output parameter; and a control circuit 45 operatively coupled to the series EVC 31 and to the shunt EVC 33 to control the series array configuration and the shunt array configuration. The steps of the exemplified process 500 can be carried out as part of the manufacture of a semiconductor, where a substrate 27 is placed in a plasma chamber 19 configured to deposit a material layer onto the substrate 27 or etch a material layer from the substrate 27, and plasma is energized within the plasma chamber 19 by coupling RF power from the RF source 15 into the plasma chamber 19 to perform a deposition or etching.

In the exemplified process 500 of FIG. 10A, the control circuit 45 is configured and/or programmed to carry out each of the steps. As one of two initial steps, RF parameters are measured at the RF input 13 by the RF input sensor 21, and the input impedance at the RF input 13 is calculated (step 501) using the measured RF parameters. For this exemplified process 500, the forward voltage and the forward current are measured at the RF input 13. In certain other embodiments, the RF parameters may be measured at the RF output 17 by the RF output sensor 49, although in such embodiments, different calculations may be required than those described below. In still other embodiments, RF parameters may be measured at both the RF input 13 and the RF output 17.

The impedance matching circuit, coupled between the RF source 15 and the plasma chamber 19, may be characterized by one of several types of parameter matrices known to those of skill in the art. An S-parameter matrix and a Z-parameter matrix are two examples of such parameter matrices. Other examples include, but are not limited to, a Y-parameter matrix, a G-parameter matrix, an H-parameter matrix, a T-parameter matrix, and an ABCD-parameter matrix. Those of skill in the art will recognize also that these various parameter matrices may be mathematically converted from one to the other for an electrical circuit such as a matching network. The second initial step of the exemplified process 500 is to look up (step 502) the parameter matrix for the existing configuration of the impedance matching circuit in a parameter look-up table. The existing configuration of the impedance matching circuit is defined by existing operational parameters of the impedance matching circuit, particularly the existing array configurations for both of the series EVC 31 and the shunt EVC 33. In order to achieve an impedance match, the existing configuration of the impedance matching circuit is altered to a new configuration of the impedance matching circuit as part of the exemplified process 500.

The parameter look-up table includes a plurality of parameter matrices, with each parameter matrix being associated with a particular configuration of the series EVC 31 and the shunt EVC 33. The parameter look-up table may include one or more of the aforementioned types of parameter matrices. In the exemplified process 500, the parameter look-up table includes at least a plurality of S-parameter matrices. In certain embodiments, the parameter look-up table may include at least a plurality of Z-parameter matrices. In embodiments in which the parameter look-up table includes multiple types of parameter matrices, the different types of parameter matrices are associated within the parameter look-up table in such a way so as to eliminate the need for mathematical conversions between the different types of parameter matrices. For example, the T-parameter matrix may be included as part of the parameter look-up table, with each T-parameter matrix associated with the associated S-parameter matrix that would result from conversion between the two matrices.

The input impedance calculation (step 501) and the parameter matrix look up (step 502) may be performed in any order. With the input impedance calculated (step 501) and the parameter matrix for the existing configuration of the impedance matching circuit identified within the parameter look-up table (step 502) done, the plasma or load impedance may then be calculated (step 503) using the calculated input impedance and the parameter matrix for the existing configuration. Next, from the calculated plasma impedance, the match configurations for the series EVC 31 and the shunt EVC 33 that would achieve an impedance match, or at least a substantial impedance match, between the RF source 15 and the plasma chamber 19 are looked up (step 504) in an array configuration look-up table. These match configurations from the array configuration look-up table are the array configurations which will result in new capacitance values for the series EVC 31 and shunt EVC 33, with an impedance match being achieved with the new array configurations and associated new capacitance values. The array configuration look-up table is a table of array configurations for the series EVC 31 and the shunt EVC 33, and it includes each possible array configuration of the series EVC 31 and the shunt EVC 33 when used in combination. As an alternative to using an array configuration look-up table, the actual capacitance values for the EVCs 31, 33 may be calculated during the process—however, such real-time calculations of the capacitance values are inherently slower than looking up the match configurations in the array configuration look-up table. After the match configurations for the series EVC 31 and the shunt EVC 33 are identified in the array configuration look-up table, then one or both of the series array configuration and the shunt array configuration are altered (step 505) to the respective identified match configurations for the series EVC 31 and the shunt EVC 33.

The altering (step 505) of the series array configuration and the shunt array configuration may include the control circuit 45 sending a control signal to the series driver circuit 39 and the shunt driver circuit 43 to control the series array configuration and the shunt array configuration, respectively, where the series driver circuit 39 is operatively coupled to the series EVC 31, and the shunt driver circuit 43 is operatively coupled to the shunt EVC 43. When the EVCs 31, 33 are switched to the match configurations, the input impedance may match the fixed RF source impedance (e.g., 50 Ohms), thus resulting in an impedance match. If, due to fluctuations in the plasma impedance, a sufficient impedance match does not result, the process of 500 may be repeated one or more times to achieve an impedance match, or at least a substantial impedance match.

The look-up tables used in the process described above are compiled in advance of the RF matching network being used in conjunction with the plasma chamber 19. In creating the look-up tables, the RF matching network 11 is tested to determine at least one parameter matrix of each type and the load impedance associated with each array configuration of the series EVC 31 and the shunt EVC 33 prior to use with a plasma chamber. The parameter matrices resulting from the testing are compiled into the parameter look-up table so that at least one parameter matrix of each type is associated with a respective array configuration of the EVCs 31, 33. Similarly, the load impedances are compiled into the array configuration look-up table so that each parameter matrix is associated with a respective array configuration of the EVCs 31, 33. The pre-compiled look-up tables may take into consideration the fixed RF source impedance (e.g., 50 Ohms), the power output of the RF source, and the operational frequency of the RF source, among other factors that are relevant to the operation of the RF matching network. Each look-up table may therefore have tens of thousands of entries, or more, to account for all the possible configurations of the EVCs 31, 33. The number of possible configurations is primarily determined by how many discrete capacitors make up each of the EVCs 31, 33. In compiling the look-up tables, consideration may be given to possible safety limitations, such as maximum allowed voltages and currents at critical locations inside the matching network, and this may serve to exclude entries in one or more of the look-up tables for certain configurations of the EVCs 31, 33.

As is known in the art, the S-parameter matrix is composed of components called scatter parameters, or S-parameters for short. An S-parameter matrix for the impedance matching circuit has four S-parameters, namely $S_{11}$, $S_{12}$, $S_{21}$, and $S_{22}$, each of which represents a ratio of voltages at the RF input 13 and the RF output 17. All four of the S-parameters for the impedance matching circuit are determined and/or calculated in advance, so that the full S-parameter matrix is known. The parameters of the other types of parameter matrices may be similarly determined and/or calculated in advance and incorporated into the parameter matrix. For example, a Z-parameter matrix for the impedance matching circuit has four Z-parameters, namely $Z_{11}$, $Z_{12}$, $Z_{21}$, and $Z_{22}$.

By compiling the parameter look-up table in this manner, the entire time cost of certain calculations occurs during the testing phase for the RF matching network, and not during actual use of the RF matching network 11 with a plasma chamber 19. Moreover, because locating a value in a look-up table can take less time than calculating that same value in real time, using the look-up table can aid in reducing the overall time needed to achieve an impedance match. In a plasma deposition or etching process which includes potentially hundreds or thousands of impedance matching adjustments throughout the process, this time savings can help add directly to cost savings for the overall fabrication process.

From the beginning of the match tune process, which starts with the control circuit determining the variable impedance of the plasma chamber and determining the series and shunt match configurations, to the end of the match tune process, when the RF power reflected back toward the RF source decreases, the entire match tune process of the RF impedance matching network using EVCs has an elapsed time of approximately 110 μsec, or on the order of about 150 μsec or less. This short elapsed time period for a single iteration of the match tune process represents a significant increase over a VVC matching network. Moreover, because of this short elapsed time period for a single iteration of the match tune process, the RF impedance matching network using EVCs may iteratively perform the match tune process, repeating the two determining steps and the generating another control signal for further alterations to the array configurations of one or both of the electronically variable capacitors. By iteratively repeating the match tune process, it is anticipated that a better impedance match may be created within about 2-4 iterations of the match tune process. Moreover, depending upon the time it takes for each repetition of the match tune process, it is anticipated that 3-4 iterations may be performed in 500 μsec or less. Given the 1-2 sec match time for a single iteration of a match tune process for RF impedance matching networks using VVCs, this ability to perform multiple iterations in a fraction of the time represents a significant advantage for RF impedance matching networks using EVCs.

Those of skill in the art will recognize that several factors may contribute to the sub-millisecond elapsed time of the impedance matching process for an RF impedance matching network using EVCs. Such factors may include the power of the RF signal, the configuration and design of the EVCs, the type of matching network being used, and the type and configuration of the driver circuit being used. Other factors not listed may also contribute to the overall elapsed time of the impedance matching process. Thus, it is expected that the entire match tune process for an RF impedance matching network having EVCs should take no more than about 500 μsec to complete from the beginning of the process (i.e., measuring by the control circuit and calculating adjustments needed to create the impedance match) to the end of the process (the point in time when the efficiency of RF power coupled into the plasma chamber is increased due to an impedance match and a reduction of the reflected power). Even at a match tune process on the order of 500 μsec, this process time still represents a significant improvement over RF impedance matching networks using VVCs.

Table 1 presents data showing a comparison between operational parameters of one example of an EVC versus one example of a VVC. As can be seen, EVCs present several advantages, in addition to enabling fast switching for an RF impedance matching network:

TABLE 1

| Parameter | EVC | Typical 1000 pF Vacuum Capacitors |
| --- | --- | --- |
| Capacitance | 20 pF~1400 pF | 15 pF~1000 pF |
| Reliability | High | Low |
| Response Time | ~500 μsec | 1 s~2 s |
| ESR | ~13 mW | ~20 mW |
| Voltage | 7 kV | 5 kV |
| Current Handling Capability | 216 A rms | 80 A rms |
| Volume | 4.5 in³ | 75 in³ |

As is seen, in addition to the fast switching capabilities made possible by the EVC, EVCs also introduce a reliability advantage, a current handling advantage, and a size advantage. Additional advantages of the RF impedance matching network using EVCs and/or the switching circuit itself for the EVCs include:

The disclosed RF impedance matching network does not include any moving parts, so the likelihood of a mechanical failure reduced to that of other entirely electrical circuits which may be used as part of the semiconductor fabrication process. For example, the typical EVC may be formed from a rugged ceramic substrate with copper metallization to form the discrete capacitors. The elimination of moving parts also increases the resistance to breakdown due to thermal fluctuations during use.

The EVC has a compact size as compared to a VVC, so that the reduced weight and volume may save valuable space within a fabrication facility.

The design of the EVC introduces an increased ability to customize the RF matching network for specific design needs of a particular application. EVCs may be configured with custom capacitance ranges, one example of which is a non-linear capacitance range. Such custom capacitance ranges can provide better impedance matching for a wider range of processes. As another example, a custom capacitance range may provide more resolution in certain areas of impedance matching. A custom capacitance range may also enable generation of higher ignition voltages for easier plasma strikes.

The short match tune process (~500 μsec or less) allows the RF impedance matching network to better keep up with plasma changes within the fabrication process, thereby increasing plasma stability and resulting in more controlled power to the fabrication process.

The use of EVCs, which are digitally controlled, non-mechanical devices, in an RF impedance matching network provides greater opportunity to fine tune control algorithms through programming.

EVCs exhibit superior low frequency (kHz) performance as compared to VVCs.

Figure 10C:
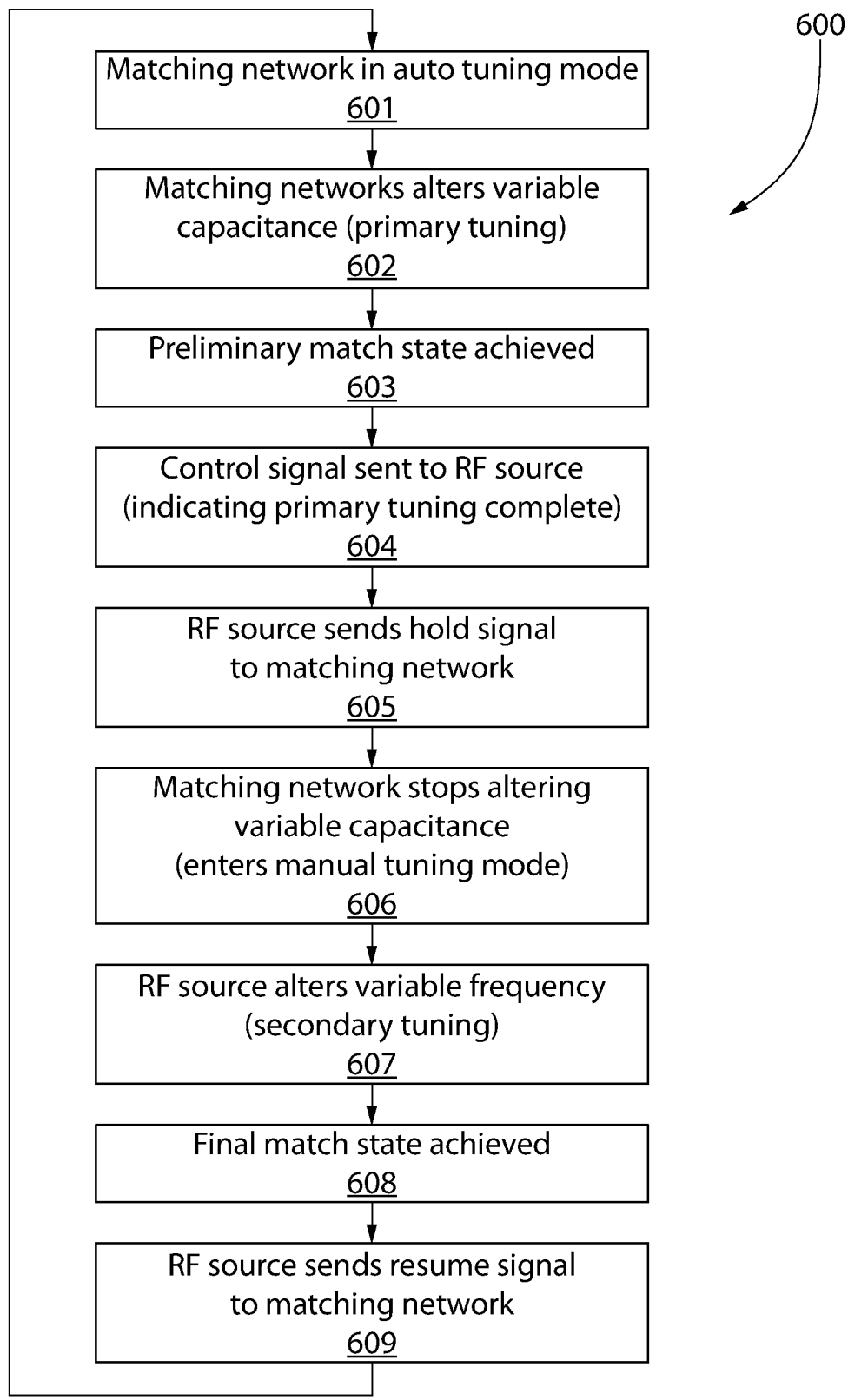
FIG. 10C is flow chart showing another embodiment of a process for matching an impedance.

FIG. 10C is a flow chart showing a process 600 for matching an impedance according to another embodiment. Since EVCs can provide only discretized capacitance values, a matching network that varies only EVCs to create an impedance match can only match based on these discretized values. For example, if a plasma impedance occurs such that the series and/or shunt capacitance values needed to bring the input impedance of the matching network to a desired non-reactive 50 Ohms lies in-between the discretized values, the EVC-based matching network will not be able to tune the input impedance of the matching network to the non-reactive 50 Ohms. The process 600 of FIG. 10C addresses such a circumstance by also altering a frequency of the RF source (sometimes referred to as the "RF generator") to carry out the impedance match.

The RF source, matching network, and plasma chamber of process 600 can be configured similarly to the system of FIG. 1. Accordingly, reference will be made to the components of the system of FIG. 1, though this figure represents just one embodiment of the invention.

As with previously discussed embodiments, the matching network 11 of process 600 can include an RF input 13 configured to receive an RF signal from an RF source 15, and an RF output 17 configured to operably couple to a plasma chamber 19. The matching network can further include at least one EVC 31, 33, and a control circuit 45 for instructing the at least one EVC 31, 33 to alter its variable capacitance. The RF source 15 (including its control circuitry) and the RF matching network 11 can be in the same enclosure or separate enclosures.

In the process 600, the matching network 11 is initially in an auto tuning mode (step 601). In this mode, the matching network 11 can be configured to carry out automated tuning by altering at least one capacitance value in a manner similar to that described in the foregoing embodiments. In this mode, the process 600 performs tuning referred to as primary tuning (step 602). In the exemplified embodiment, the primary tuning includes altering the series and/or shunt capacitance values in an attempt to achieve an impedance match. In the exemplified embodiment, the desired input impedance (the desired impedance at the input of the matching network 11) is a fixed, non-reactive 50 Ohm, sometimes referred to as the RF source impedance. In other embodiments, the desired input impedance can be any other impedance value, and can be variable.

In the exemplified embodiment, the primary tuning will bring the input impedance relatively close to a non-reactive 50 Ohms, the matching network 11 being limited by the discretized capacitance values of the EVCs 31, 33. At this stage, a preliminary match is achieved (step 603). The preliminary match state will have an associated first reflection parameter value at the RF source output 15a (the RF source output 15a being connected to the matching network input 13). In the exemplified embodiment, the first reflection parameter value is a reflected power value. In other embodiments, the first reflection parameter value can be any reflection-related parameter associated with the preliminary match state. For example, the first reflection parameter value can be the reflection coefficient, which represents the ratio of the amplitude of the reflected wave to the incident wave, and is sometimes referred to as gamma. The first reflection parameter can be measured by sensor 21 at the RF source output 15a. In other embodiments, reflected power can be measured by a sensor or comparable device that is located proximate to the matching network input 13.

In one embodiment, the alteration of variable capacitance in auto tuning mode can include the steps of adjusting the variable capacitance, determining an intermediate reflection parameter value, and then reducing and/or increasing the variable capacitance based on the intermediate reflection parameter value. This process can be repeated such that there are several intermediate reflection parameter values, the adjustment of the one or more variable capacitances being based on these intermediate reflection parameter values. In other embodiments, the invention can omit the use of intermediate reflection parameter values.

Once the preliminary match state is achieved, the matching network 11 can provide a control signal to the RF source 15 indicating that primary tuning is complete and that a preliminary match has been achieved (step 604). The control signal can be any signal sufficient to provide indication that the preliminary match has been achieved.

In response, the RF source 15 can send a hold signal to the matching network 11 (step 605), the hold signal placing the matching network 11 in a manual tuning mode (step 606). In manual tuning mode, the matching network 11 will stop performing automated tuning (and therefore will not alter the variable capacitances) as long as the hold signal is present. In other embodiments, the matching network 11 can automatically enter manual tuning mode when the preliminary match has been achieved, and can return to auto tuning mode when receiving an instruction from the RF source 15.

Next, the variable frequency of the RF source 15 can be adjusted to perform secondary tuning (step 607). This secondary tuning can fine tune the input impedance of the matching network 1 to the desired non-reactive 50 Ohm, or other desired impedance, and can minimize the reflected power at the output of the RF source 15, thereby also decreasing the reflection coefficient. The RF source 15 can have standard control circuitry by which the frequency is varied and the signals discussed above are sent, received, and processed. The frequency can be altered by providing a command to a frequency generation circuit that forms part of the RF source, such as a Direct Digital Synthesizer.

Once the RF source 15 has completed altering the frequency for the secondary tuning, a final match state is achieved (step 608). The final match state will have an associated second reflection parameter value at the RF source output 15a. As with the first reflection parameter value, in the exemplified embodiment, the second reflection parameter value is a reflected power value. In other embodiments, the second reflection parameter value can be any reflection-related parameter associated with the preliminary match state, such as the reflection coefficient (discussed above). The second reflection parameter can be measured by a sensor 21 at the RF source output 15a. Since the final match state causes a more finely tuned match than the preliminary match state, the second reflection parameter value will be less than the first reflection parameter value.

The alteration of the variable RF source frequency can include reducing and/or increasing the variable RF source frequency based on an intermediate reflection parameter value. In one embodiment, the alteration of the variable source frequency includes reducing the variable RF source frequency by a first amount and determining the intermediate reflection parameter value at the RF source output. If the intermediate reflection parameter value decreases, the variable RF source frequency is again reduced by the first amount and a new intermediate reflection parameter value is measured. This process can repeat until the intermediate reflection parameter value increases. When the intermediate reflection parameter value increases, the variable source frequency can be increased by a second amount (the second amount being less than the first amount), and then a new intermediate reflection parameter value is determined. If the new intermediate reflection parameter value decreases, the variable source frequency is again increased by the second amount, and a new intermediate reflection parameter value is determined. This process can repeat until the new intermediate reflection parameter value increases or is zero, at which stage the process can stop or the variable source frequency can be returned to its previous value.

The invention is not limited to any one embodiment for tuning the frequency or variable capacitance. For example, the invention can use any variety of methods to step up and/or down the frequency in different increments based on the resulting reflected power. Further, the process 600 can have a minimum reflected parameter value (e.g., a minimum reflected power or minimum reflection coefficient). When the minimum reflected parameter value is achieved, the tuning can stop, regardless of whether the process is in primary or secondary tuning.

Returning to the exemplified embodiment, once the final match state is achieved, the RF source 15 can send a signal (sometimes referred to as a "resume signal") to the matching network 11 to place the matching network 11 back into auto tuning mode (step 609). The matching network 11 can then be ready for the next variation of the plasma impedance. Thus, when a plasma impedance of the plasma chamber 15 changes, the control circuit 45 can repeat the instruction to alter the variable capacitance and/or the instruction to alter the variable RF source frequency.

In other embodiments, the process 600 will not resume tuning until the reflection parameter value exceeds a predetermined value. Such a tuning restart threshold can be applied to the primary tuning, the secondary tuning, or both. Further, thresholds can be set such that, for small reflected power level raises, only secondary tuning is done (altering the RF source frequency), while, for larger reflected power levels, primary tuning is first carried out (altering capacitances), followed by secondary tuning (altering the RF source frequency).

Combining an EVC-based RF matching network with a variable frequency RF source provides several advantages for fast and precise RF matching. For example, with all components being electronic, the system has higher reliability than those using VVC technology, which are prone to mechanical failures. Further, the primary and second tuning can be performed quickly to enable matching within 500 μsec. Further, the combined EVC matching network and variable RF source can decrease the reflected power to the RF source to essentially 0 Watts.

Enclosure Cooling System

In systems such as the matching networks and semiconductor manufacturing systems discussed above, heat can be generated that compromises system operation. The embodiments discussed below can be utilized to help cool such systems, as well as other types of systems.

In one embodiment, the embodiments can enhance the cooling capacity of a water-cooling heat sink by adding a heat exchanger to the heat sink and mounting a fan directly over or adjacent to the heat exchanger. By this design, when electrical components heat the air within an enclosure, the fan can blow the heated air onto the heat exchanger of the heat sink. The heat sink can transfer the heat to cool water running through a tube (e.g., a copper pipe) in the heat sink. The heated water can then be removed from the heat sink at a water output, thereby removing heat from the enclosure. Since the heat that is built up is removed by the heat sink by way of the cool water, the generator enclosure can be totally sealed to the outside atmosphere. This in turn eliminates the outgassing concern from damaged components and assemblies and prevents contamination of the fab.

Figure 11:
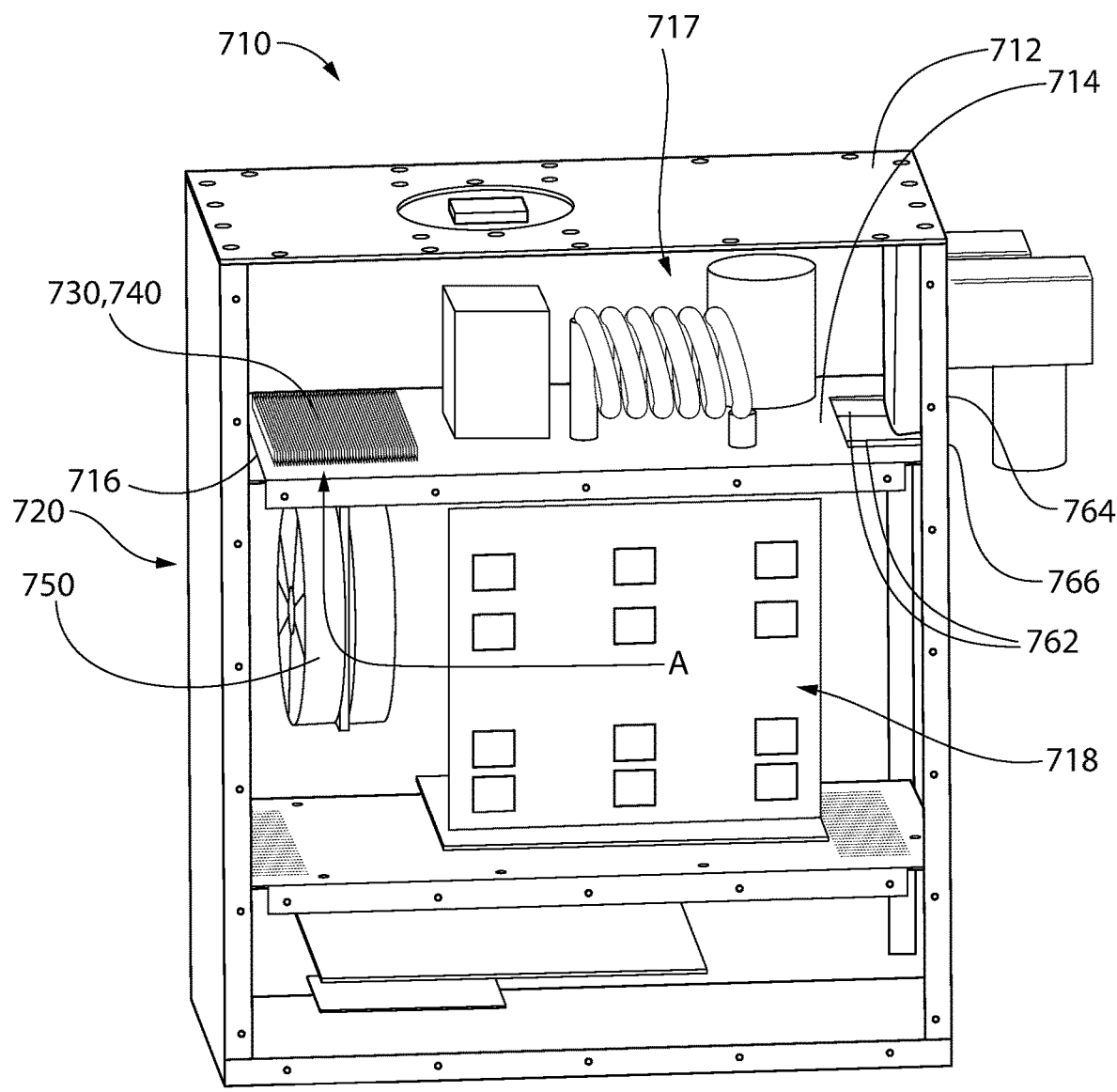
FIG. 11 shows a cooling system according to one embodiment.

FIG. 11 show a system 710 according to one embodiment of the invention. In the exemplified embodiment, the system 710 includes a matching network, such as the matching networks discussed above. In other embodiments, the system can be any system generating heat, including an RF generator, or a combination RF generator and matching network. In the exemplified embodiment, the system 710 includes electrical components 717, 718 for a matching network, and the matching networks forms part of a semiconductor manufacturing system, such as the systems discussed above.

The exemplified system 710 includes an enclosure 712 and a cooling system 720. FIG. 11 shows a side view of the system 710 where a side panel of the enclosure 712 is removed. Within the enclosure 712 are shelf electrical components 717 located on a component shelf 714, as well as other electrical components 718. The exemplified enclosure 712 (when the front side panel is in place) is sealed so as to prevent air and exhaust from escaping the enclosure. While no enclosure is completely sealed to prevent the escape of all air and exhaust, the enclosure is designed to reasonably prevent most air and exhaust from escaping. This can prevent outgassing and contamination of the surrounding environment, which is particularly helpful in a semiconductor fab.

The cooling system 720 includes a heat sink 730 and a fan 750 enclosed by the enclosure 712 for causing air flow A. In the exemplified embodiment, the heat sink 730 is within the enclosure 712, though in other embodiments a portion of the heat sink may be outside the enclosure 712. The fan 750 can direct hot air A from the first electrical components 718 to the heat exchanger 740 of the heat sink 730. The fan 750 can be mounted on or adjacent to the heat sink. As used herein, the term "fan" refers to any device for pushing air within the system to be cooled.

Cool water enters the heat sink 730 at the water input 764. The cool water travels through a tube 762 in the heat sink 730. Heat is transferred from the heat exchanger 740 to the water flowing through the heat exchanger 740, and the heated water is removed from the heat sink 730 at the water output 766, thereby removing heat from the enclosure 712. It is noted that, while the exemplified embodiment utilizes water traveling through the tube, other liquids can be utilized instead of water.

Figure 12:
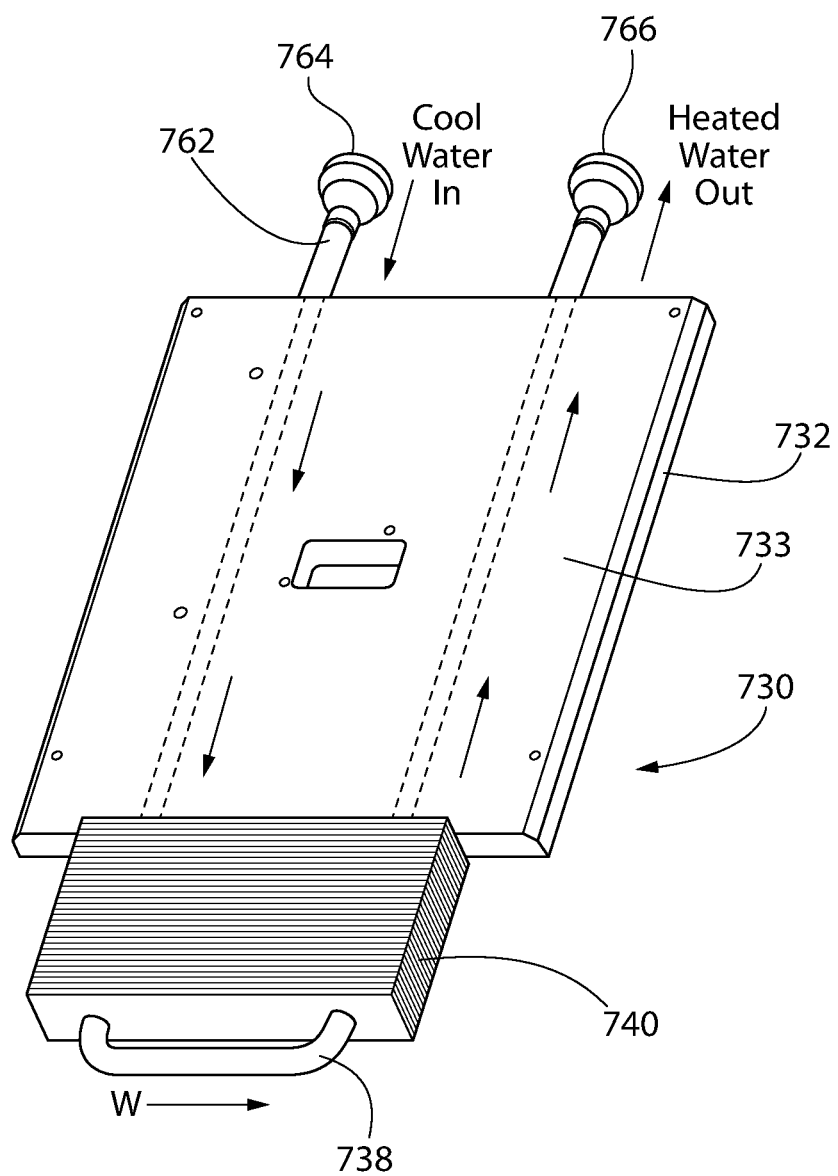
FIGS. 12-14 show views of a heat sink according to one embodiment.
Figure 13:
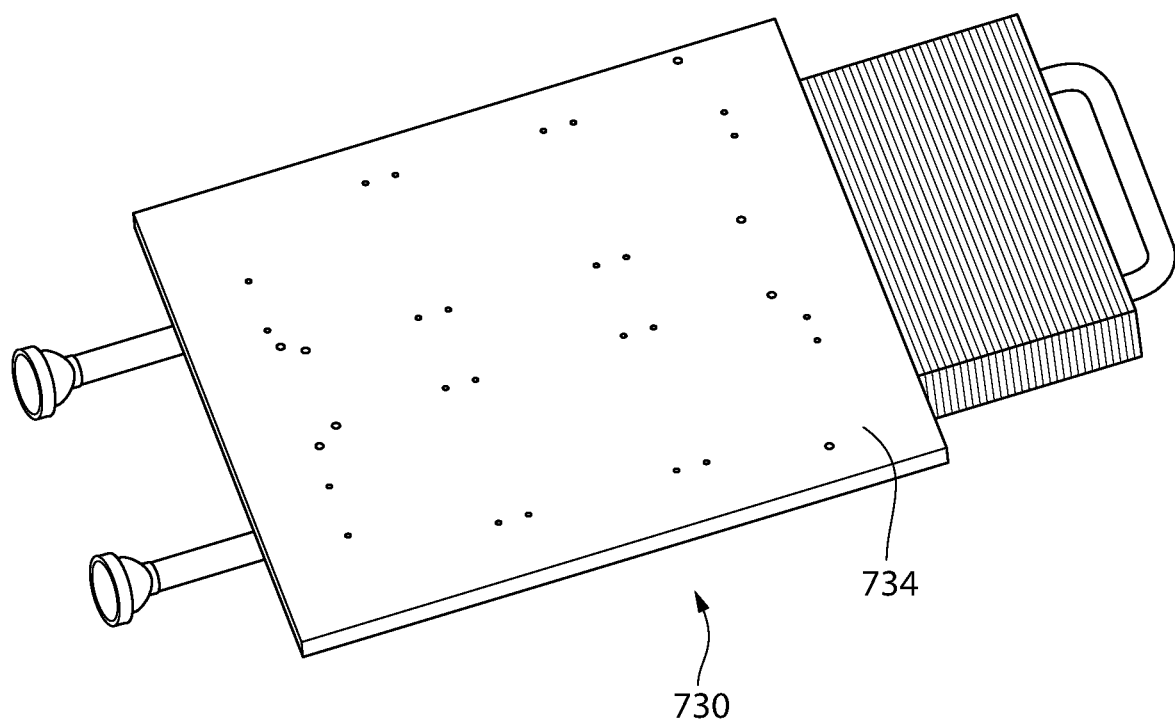
Figure 14:
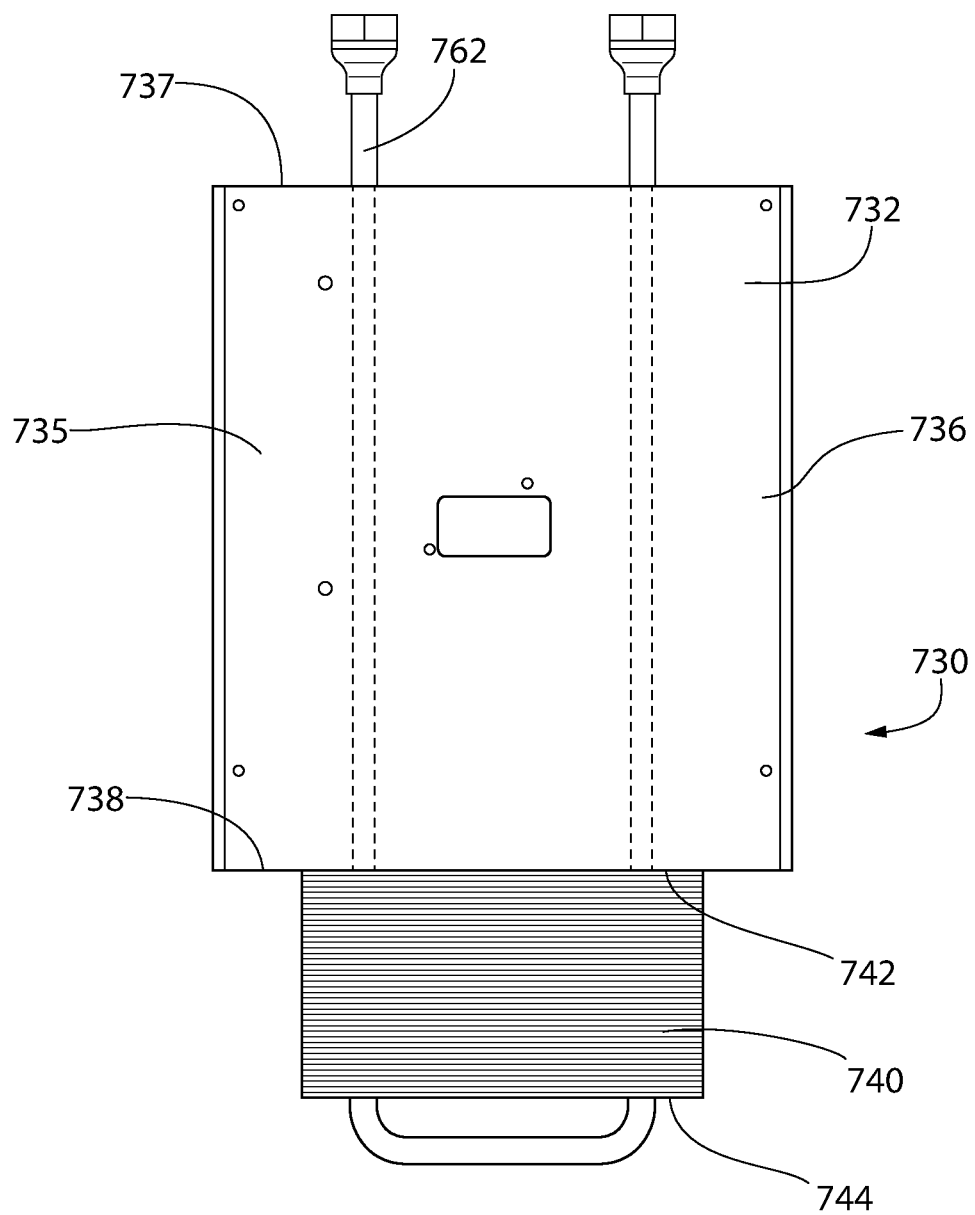

FIGS. 12-14 show the heat sink 730 apart from the enclosure 712 and the other components of the cooling system 720. FIG. 12 is a perspective bottom view of the heat sink 730. The heat sink 730 includes a main housing portion 732 and a heat exchanger portion 740.

The heat exchanger 740 can be affixed directly to the main housing 732 of the heat sink 730. In another embodiment, the heat exchanger can be created by cutting fins directly into the heat sink 730. Affixed fins can be, for example, die cast or molded. The heat exchanger 740 can be made of a material with a high rate of thermal conductivity (e.g., aluminum or copper). The geometry of the heat exchanger 740 increases the surface area of contact between the tube 738 (and the water it carries) and the heated air. This configuration pulls heat away from the air in the enclosure 712 at a high rate, cooling the air and, consequently, the electrical components 718. The geometry of the heat exchanger 740 can any geometry that effectively increases the surface area of the tube 738. As used herein, the term "heat exchanger" can refer to any device configured to transfer heat from one medium to another.

The main housing 732 can have a main housing surface 733 that can receive electrical components or rest against a surface that receives electrical components. The water flow W of the cool water in the tube 762 is shown. The tube 762 can extend into and out of the heat exchanger 740, the tube 762 configured to transport water through the heat exchanger 740. The tube 762 can also extend into and out of the main housing 732. In other embodiments, the main housing 732 can be omitted, and the tube 762 can extend through the heat exchanger 740.

FIG. 13 shows a perspective top view of the heat sink 730. In the exemplified embodiment, the main housing top surface 734 can be attached to the component shelf surface 716 (FIG. 11) such that the two surfaces 734, 716 are in contact with each other. The surfaces 734, 716 can comprise thermally conductive material. In another embodiment, the main housing surface (top 734 or bottom 733) can be configured to received electrical components directly on the main housing surface 734, 733.

FIG. 14 shows bottom view of the heat sink 730. The exemplified main housing 732 has a first edge 737 and a second edge 738 opposite the first edge 737. The heat exchanger 740 has a first edge 742 and a second edge 744 opposite the first edge 742. The main housing second edge 738 is adjacent the heat exchanger first edge 742. The tube 762 enters the main housing 732 at the main housing first edge 737. The tube 762 enters the heat exchanger 740 at the heat exchanger first edge 742. The tube 762 exits the heat exchanger 740 at the heat exchanger first edge 742. Further, the tube 762 exits the main housing 732 at the main housing first edge 737. The main housing 32 and the heat exchanger 40 are located side-by-side and contact each other along edges 28 and 42, respectively. In the exemplified heat sink, the tube 762 extends along a first side 35 of the main housing 32 and a second side 36 of the main housing 32 opposite the first side 35.

In other embodiments, other configurations can be utilized. For example, the main housing could be eliminated, or the tube could enter that heat exchanger before entering the main housing. Further, rather than entering along a first side and then exiting along a second, opposite side, the tube could proceed in any manner, such as zig-zagging back-and-forth between the two sides.

In addition to the foregoing, means can be provided inside the system to detect the fault and generate a fault signal that causes the removal of power from the system to prevent further damage. For example, a fault signal could cause the removal of power from the inputs of an RF generator and an RF matching network to prevent further damage. In one embodiment, the fault signal can be received by a control circuit, such as control circuit 45 (FIG. 1), which in turn causes the removal of power from the inputs. The unit can go to a safe condition and send an alarm to a host computer in a fab. This can be accomplished with a variety of sensors that monitor various conditions. For example, the sensors can include an ambient air temperature sensor and a heat sink temperature. Other features that can be monitored include a blocked fan, over dissipation, and/or a power supply failure. By monitoring such features and triggering a fault, the system can not only prevent the outgassing of gases from failed components, but can also restrict the amount of outgassing by terminating the power that feeds into the failure, thus limiting the damage, preventing more serious failure, and preventing the failure of other associated circuitry outside the enclosed system. In addition to or in place of the fault signal that is communicated to the semiconductor fabrication system, the RF generator or the RF matching network may open the system interlock, directly resulting in the shutdown of any power generation source connected to the inputs of the RF generator or the RF matching network.

Since the enclosure is completely enclosed, any humidity left in the enclosure may condense as the chamber is heated and cooled. Therefore, it may be necessary to either purge the enclosure with a small flow of clean dry air or Nitrogen ($N_2$) with a return port for exhausting this flow so as to maintain the integrity of the enclosure to the outside atmosphere. Alternatively, ports might be provided to purge the enclosure with Nitrogen to remove the humidity and then close the ports after sealing the enclosure.

Figure 15:
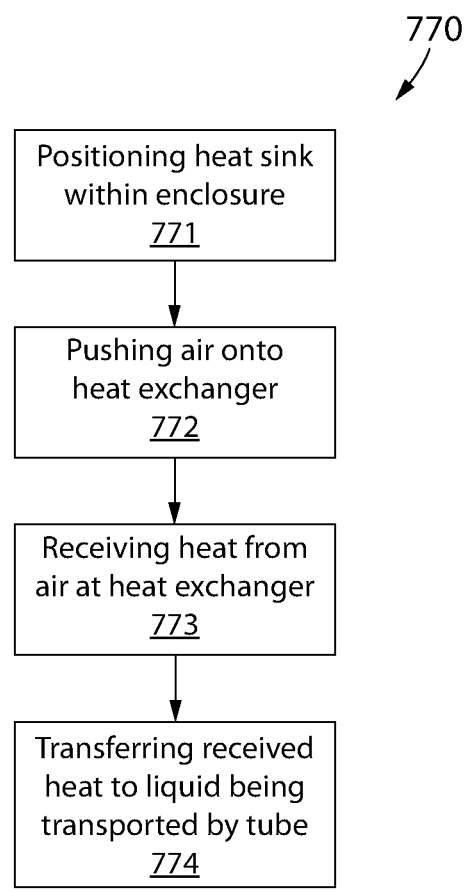
FIG. 15 is a flow chart for a method of cooling an enclosure according to one embodiment.

FIG. 15 is a flow chart for a method 770 of cooling an enclosure according to one embodiment. The exemplified method 770 cools an enclosure that encloses electrical components and is sealed to prevent air and exhaust from escaping the enclosure, though the invention is not so limited. The method 770 comprises positioning a heat sink at least partially within the enclosure (operation 771). Similar to above, the heat sink comprises a heat exchanger and a tube extending into and out of the heat exchanger, the tube configured to transport water through the heat exchanger. The method 770 further comprises, by a fan enclosed by the enclosure, pushing air heated by electrical components onto the heat exchanger (operation 772). The method 770 further comprises receiving, at the heat exchanger, heat from the pushed air (operation 773), and transferring, by the heat exchanger, the received heat to water being transported by the tube through the heat exchanger (operation 774).

In another embodiment, a method of manufacturing a semiconductor is utilized. The method includes operably coupling a matching network between an RF source and a plasma chamber, for example, as in FIG. 1 described above. The plasma chamber is configured to deposit a material layer onto the substrate or etch a material layer from the substrate, and electrical components of the matching network are enclosed by an enclosure (such as enclosure 712 discussed above) that is configured to prevent air and exhaust from escaping the enclosure. The method also includes positioning a heat sink (such as heat sink 730 discussed above) at least partially within the enclosure; placing a substrate in the plasma chamber; energizing plasma within the plasma chamber by coupling RF power from the RF source into the plasma chamber to perform a deposition or etching; by a fan enclosed by the enclosure, pushing air heated by electrical components onto the heat exchanger; receiving, at the heat exchanger, heat from the pushed air; and transferring, by the heat exchanger, the received heat to water being transported by the tube through the heat exchanger.

Some of the foregoing embodiments discuss use of cooling system for an RF system used in semiconductor manufacturing. It is noted, however, that the invention is not so limited, as the cooling systems and methods can be used with other systems that require cooling.

Controlling RF Generator

Figure 16:
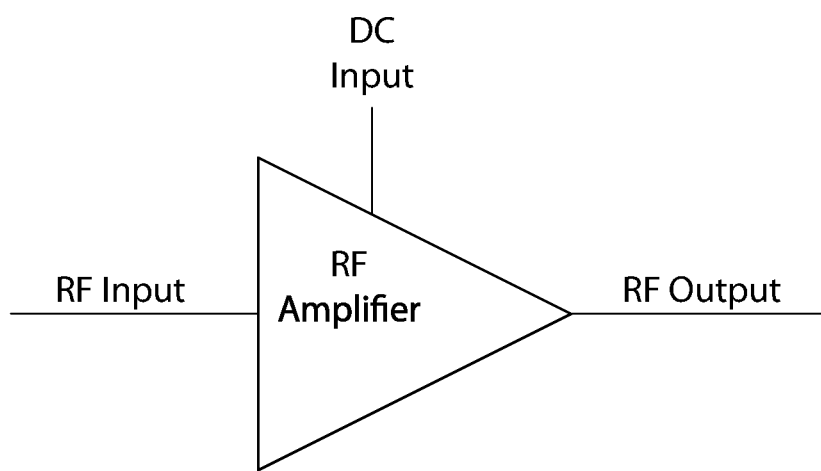
FIG. 16 is a block diagram of a prior art RF amplifier.

Radio frequency ("RF") generators are used in many applications, including telecommunication, broadcast, and industrial processing. An RF generator can be a closed loop system comprising of an RF amplifier, a DC power source, and associated closed loop circuitry. A block diagram of a typical RF amplifier is shown in FIG. 16. The RF amplifier can receive an RF signal at its RF input and a DC voltage at its DC input. Further, the RF amplifier can output an RF power at its RF output. The RF amplifier uses the RF signal to modulate the power received at the DC input to provide an RF power that is higher than the power at the RF input.

The efficiency of the RF amplifier is dependent upon several factors, including the value of the load connected to its output. As that load changes, so does the efficiency of the RF amplifier. The power dissipation of the RF amplifier (sometimes referred to herein as "PDISS") is generally understood as the difference between the RF output power and the DC input power or, more specifically, the power at the RF output minus the power reflected back to the RF amplified and the power at the DC input.

This power loss ($P_{dissipated}$) is dissipated as heat among the different components of the RF amplifier. Any heat generated in the components has a direct impact on the reliability of the components. As a result, in many applications, the RF amplifier is provided with protection schemes to protect the RF amplifier under conditions such as high dissipation. In most cases, the protection schemes are designed to limit the RF output power and, as a result, limit the DC input power.

While the protection schemes built into RF generators allow the RF generator to protect itself, the protection schemes also limit the RF output power. Limited RF output power can be problematic for systems that utilize RF generators, such as systems providing semiconductor plasma processing. In such a system, an RF generator is supplying power to enable semiconductor processing. Plasma processing involves energizing a gas mixture by imparting energy to the gas molecules by introducing RF energy into the gas mixture. This gas mixture is typically contained in a vacuum chamber (the plasma chamber), and the RF energy is typically introduced into the plasma chamber through electrodes. If the RF output power is decreased by the generator's protection schemes, the power delivered to the plasma chamber is reduced, thereby reducing the process yield for the semiconductor processing system. Further, certain plasma conditions may regularly present load conditions to the RF generator such that the RF amplifier's protection schemes are regularly enabled, thereby affecting the ability of the semiconductor to be processed. Thus, there is need for an RF generator and a method for controlling an RF generator that enables the RF generator to operate more efficiently and/or provide sufficient RF output power.

The method described herein controls an RF generator by adjusting the DC voltage (sometimes referred to as the DC rail) presented to the RF amplifier such that the RF amplifier can operate in a high efficiency mode. A control algorithm can enable the RF output power to reach a desired power (referred to herein as the power setpoint) and can alter the DC voltage to provide a comparable output power while minimizing power dissipation. This method will be described in greater detail below.

Figure 17:
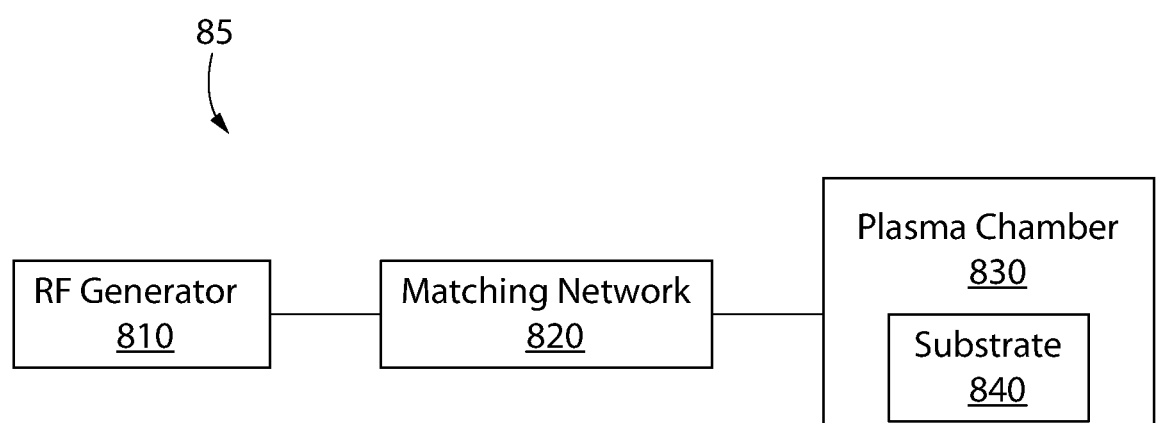
FIG. 17 is a block diagram of an embodiment of a semiconductor processing system.

Referring to FIG. 17, a semiconductor device processing system 5 utilizing an RF generator 810 is shown. The system 85 includes an RF generator 810, a matching network 820, and a plasma chamber 830. The semiconductor device can be a microprocessor, a memory chip, or other type of integrated circuit or device. A substrate 840 can be placed in the plasma chamber 830, where the plasma chamber 830 is configured to deposit a material layer onto the substrate 840 or etch a material layer from the substrate 840. Plasma processing involves energizing a gas mixture by imparting energy to the gas molecules by introducing RF energy into the gas mixture. This gas mixture is typically contained in a vacuum chamber (the plasma chamber 830), and the RF energy is typically introduced into the plasma chamber 830 through electrodes. Thus, the plasma can be energized by coupling RF power from an RF source 8105 into the plasma chamber 830 to perform deposition or etching.

In a typical plasma process, the RF generator 810 generates power at a radio frequency—which is typically within the range of 3 kHz and 300 GHz—and this power is transmitted through RF cables and networks to the plasma chamber 830. In order to provide efficient transfer of power from the RF generator 810 to the plasma chamber 830, an intermediary circuit is used to match the fixed impedance of the RF generator 810 with the variable impedance of the plasma chamber 830. Such an intermediary circuit is commonly referred to as an RF impedance matching network, or more simply as an RF matching network. The purpose of the RF matching network 820 is to transform the variable plasma impedance to a value that more closely matches the fixed impedance of the RF generator 810. Commonly owned U.S. patent application Ser. No. 14/669,568, the disclosure of which is incorporated herein by reference in its entirety, provides an example of such a matching network.

The semiconductor device processing system 85 is an example of a system that can utilize the RF generator 810. The RF generator 810, however, is not so limited, as it could be used in a variety of other applications that require RF energy. Such systems can include systems for telecommunication, broadcast, and industrial processing.

Figure 18:
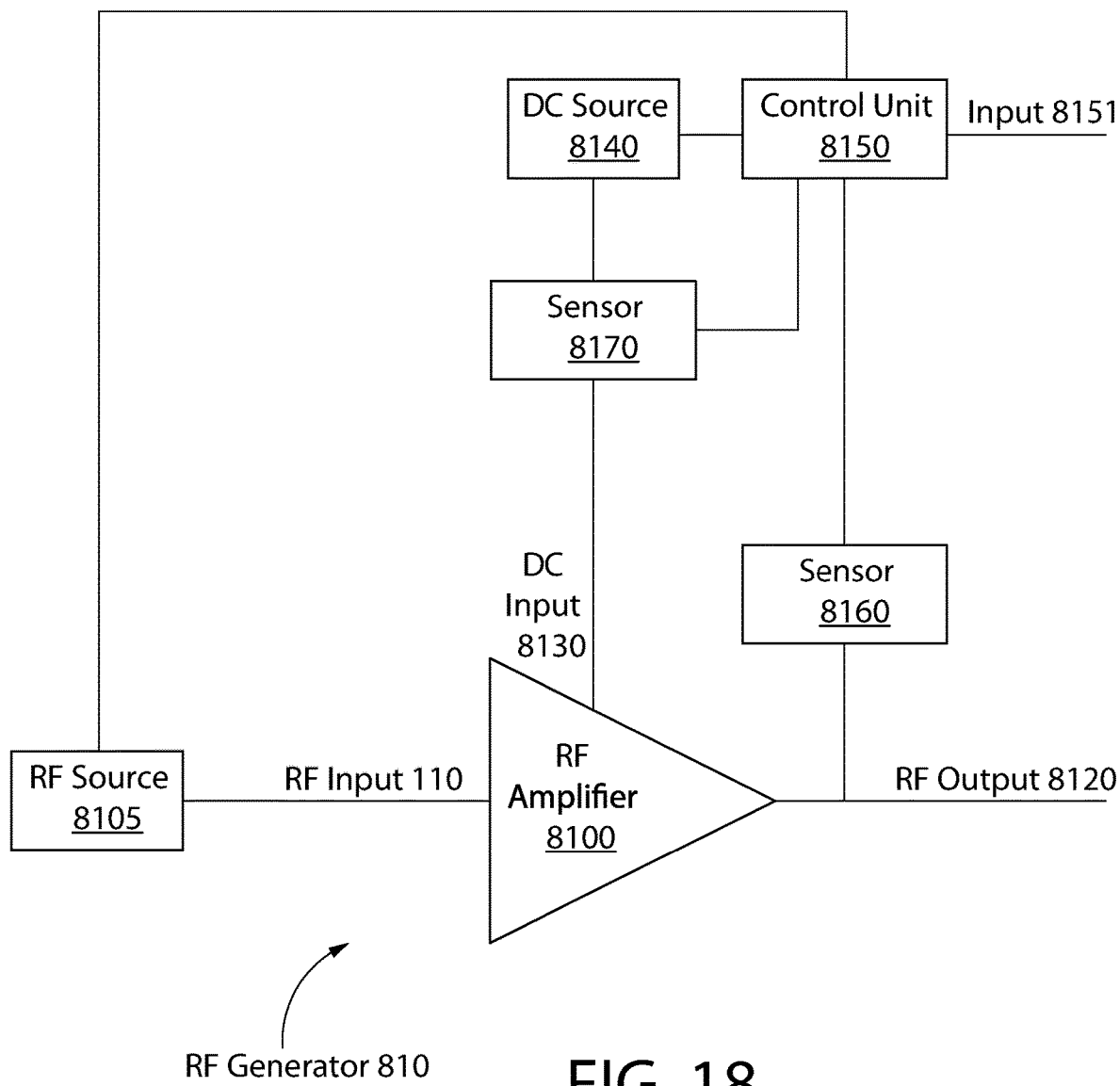
FIG. 18 is a block diagram of an embodiment of an RF generator.

Referring now to FIG. 18, a block diagram of an embodiment of an RF generator 810 is shown. The RF generator 810 includes an RF amplifier 8100 having an RF input 8110, a DC input 8130, and an RF output 8120. An RF source 8105 provides an RF signal to the RF amplifier 8100 at the RF input 8110. A DC source 8140 provides a DC voltage to the RF amplifier 8100 at the DC input 8130. The RF signal can modulate the power received at the DC input 8130 to provide an RF output power at the RF output 8120 that is higher than the power at the RF input 8110. The RF source can be any device capable of providing a sufficient RF signal for operation of an RF generator, and the DC source can be any device capable of providing a sufficient DC signal for operation of an RF generator.

A sensor 8160 is connected to the RF output 8120. The sensor 8160 is configured to detect an RF output parameter. The RF output parameter can be any parameter (or parameters) measurable at the RF output 8120, including a voltage, a current, a phase angle between the voltage and current, a forward or reflected power, or any parameter or parameters that can be used to determine RF power. In the exemplified embodiment, the sensor 8160 detects the voltage, the current, and the phase angle between the voltage and the current at the RF output 8120.

Another sensor 8170 is connected to the DC source 8140. This sensor 8170 is configured to detect a DC input parameter. The DC input parameter can be any parameter (or parameters) measurable at the DC input 8130, including a voltage or a current.

The RF generator 810 further includes a control unit 8150 that can be coupled to the RF source 8105, the DC source 8140, and the sensors 8160, 8170 of the RF generator 810. The control unit 8150 can provide several functions for the RF generator 810. The control unit 8150 can receive instructions from a user or a system at an input 8151. The control unit 8150 can receive the RF output parameter from sensor 8160 and determine the RF output power. Further, the control unit 8150 can receive the DC input parameter from sensor 8170 and determine the DC input power.

Further, the control unit 8150 can generate and transmit instructions to other components of the system 85. The control unit 8150 can send instructions to the DC source 8140 to alter the DC voltage provided to the RF amplifier 8100. Further, the control unit 8150 can send instructions to the RF source 8105 to alter the RF signal provided to the RF amplifier 8100. Instruction to the RF source 8105 can be sent as a PDAC signal. The PDAC signal (or "PDAC") can be any signal sent by the control unit 8150 to the RF source 8105 to alter the RF signal output of the RF source 8105. In the preferred embodiment, the PDAC is a DC signal that alters the amplitude of the RF signal. The PDAC can increase or decrease how hard the RF amplifier 8100 is working to increase the RF output power. The control unit 8150 can be programmed to know the proper PDAC value to send to produce the desired result for the RF amplifier 8100.

The control unit 8150 can be programmed to carry out one or more control algorithms for determining the instructions to send to the DC source 8140 and/or RF source 8105. Such algorithms will be discussed in further detail below.

The control unit 8150 is configured with an appropriate processor and/or signal generating circuitry to provide signals for controlling components of the RF generator 810, such as the DC source 8140 and RF source 8105. In the exemplified embodiment, the control circuit 8150 includes a processor. The processor may be any type of properly programmed processing device, such as a computer or microprocessor, configured for executing computer program instructions (e.g., code). The processor may be embodied in computer and/or server hardware of any suitable type (e.g. desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc. The processor of the exemplified embodiment is configured with specific algorithms to enable the RF generator 810 to operate as described herein.

Figure 19:
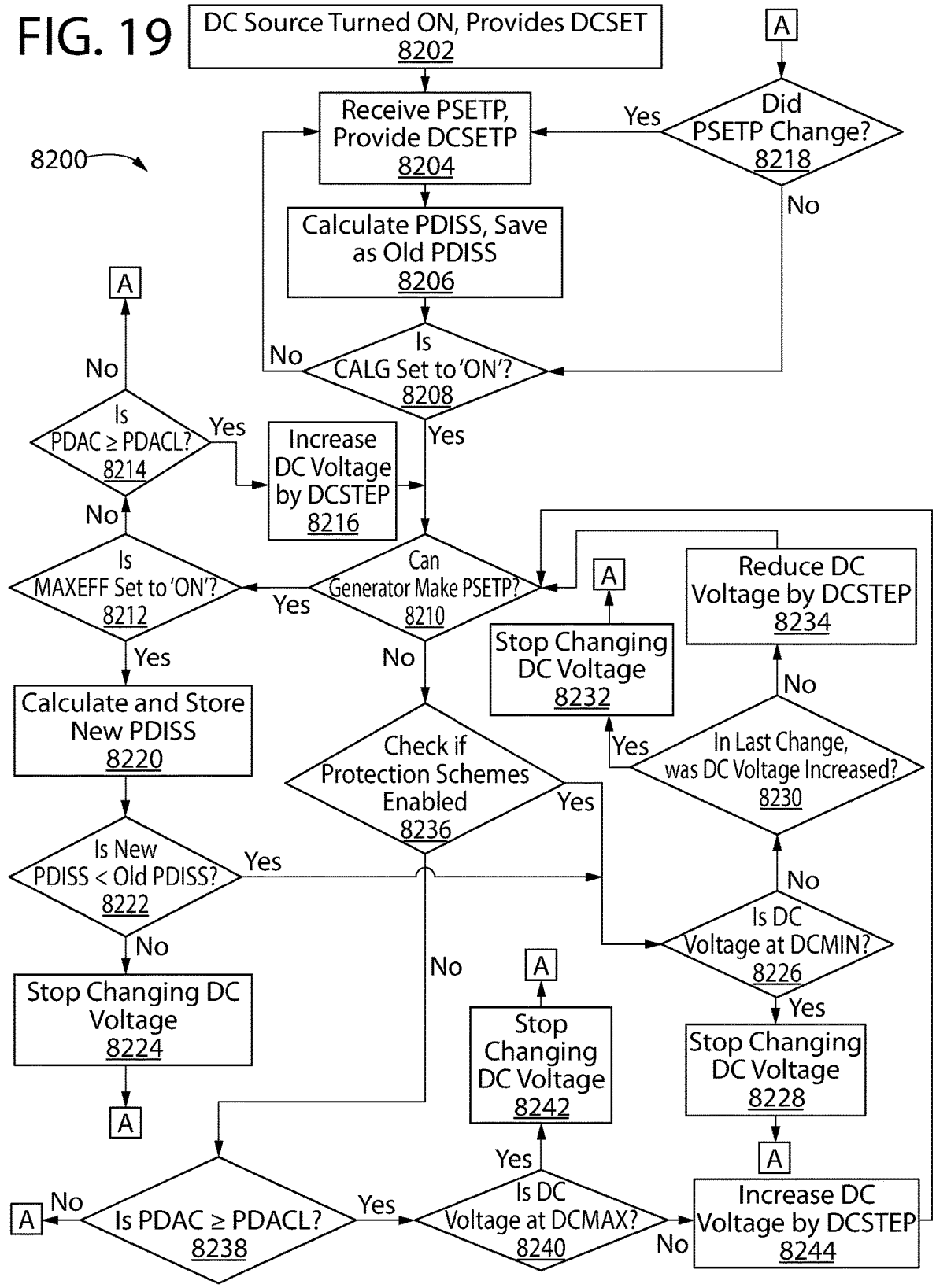
FIG. 19 is a flow chart of an embodiment of a DC control algorithm for an RF generator.

Referring now to FIG. 19, a flow chart of an embodiment of a DC control algorithm 8200 for an RF generator 810 is shown. It should be noted at the outset that the exemplified control algorithm 8200 (sometimes referred to herein simply as the "process") contains several routines, some of which can run independently of other routines. For example, the steps for ensuring maximum efficiency can be run independently of the steps for achieving an RF output power corresponding to the setpoint. In the exemplified embodiment, the control algorithm includes steps for achieving the power setpoint and steps for ensuring maximum efficiency at that setpoint. In alternative embodiments, the achievement of the power setpoint can be assumed and the control algorithm can refer simply to the steps for ensuring maximum efficiency at that setpoint. In yet other embodiments, the control algorithm can simply provide a process for achievement of the power setpoint. The exemplified embodiment is just one approach for carrying out the invention.

Table 1 below provides certain abbreviations used in the flow chart.

TABLE 1

| Abbreviation | Meaning |
| --- | --- |
| CALG | Control algorithm |
| DCSET | Startup DC setpoint |
| DCSETP | DC setpoint based on power setpoint (SETP) |
| PSETP | Power setpoint |
| DCMAX | Maximum DC voltage provided by DC source |
| DCMIN | Minimum DC voltage provided by DC source |
| DCSTEP | Predetermined amount by which DC voltage is increased or decreased |
| PDAC | Power signal to the RF source |
| PDACL | Limit on PDAC (maximum PDAC) |
| MAXEFF | Maximum efficiency mode |
| PDISS | Power dissipation of the amplifier |

The exemplified process 8200 for controlling the RF generator 810 allows the user to select whether to operate the RF generator 810 in maximum efficiency (MAXEFF) mode. The maximum efficiency option can be controlled by the user at the control unit 8150 by a switch or by any other known method for enabling a process. In alternative embodiments, the maximum efficiency steps can always be enabled when the DC source 8140 is turned ON.

The process 8200 also allows a user to set a maximum DC voltage provided by DC source (DCMAX), a minimum DC voltage provided by DC source 8140, and a startup DC setpoint (DCSET). The startup DC setpoint (DCSET) is the initial DC voltage provided by the DC source 8140 when the DC source 8140 is turned ON. In alternative embodiments, one or more of the DCMAX, DCMIN, and DCSET can be fixed values, or can be determined by a program.

The exemplified process 8200 for controlling the RF generator 810 begins by the DC source 8140 being turned ON (step 8202). In the exemplified embodiment, the DC source 8140 receives power from an AC power source and a switch enables a user to turn the DC source 8140 ON. When the DC source 8140 is initially turned ON, it provides the startup DC setpoint (DCSET). In other embodiments, the step of providing a startup DC setpoint can be omitted.

Next, a desired power at the RF output (PSETP) is received and, in response, a DC voltage (DCSETP) is provided (step 8204). In this step, the control unit 8150 can receive an instruction to have the RF generator 810 provide a specific RF output power. This desired RF output power is referred to as the power setpoint (PSETP). The power setpoint can be received from another system (e.g., a semiconductor processing system), a user input, or any other source. In response to the requested power setpoint, the control unit 8150 can instruct the DC source 8140 to provide a DC voltage (DC setpoint (DCSETP)) likely to result in the desired power setpoint. The control unit 8150 can be programmed in advance to instruct certain DC setpoints in response to certain received power setpoints. For example, a table of power setpoints can be provided along with corresponding DC setpoints.

Next, the control unit 8150 calculates the power dissipated by the RF amplifier 8100 (PDISS), and stores this value (Old PDISS) (step 8206). As stated above, the power dissipated (PDISS) can be calculated as follows:

$$P_{dissipated} = P_{RF\ output} - P_{reflected} - P_{DC\ input}$$

By sensor 8160 and the RF output parameters measured, the control unit 8150 can determine the RF output power ($P_{RF\ output}$) and the power reflected ($P_{reflected}$). In the exemplified embodiment, the sensor 8160 is a power sensor that measures voltage, current, and the phase angle between them at the RF output 8120. In alternative embodiments, the power sensor can be a directional coupler that couples signals representative of forward and reflected power from the main power path, or can be another type of sensor. By sensor 8170 and the DC input parameters measured, the control unit 8150 can determine the power at the DC input 8130. Using this information, the control unit 8150 can determine the power dissipated by the RF amplifier 8100 ($P_{dissipated}$ or PDISS). The control unit 8150 can then store this value (Old PDISS) in memory (not shown) for future use.

Next, the process 8200 determines whether the control algorithm (CALG) is turned ON (step 8208). The control algorithm can be controlled by the user at the control unit 8150 by a switch or by any other known method for enabling an algorithm. In alternative embodiments, the control algorithm can always be ON when the DC source 8140 is turned ON. If the control algorithm is not turned ON, then the DC source 8140 will simply provide the DC voltage of the DC setpoint, as discussed above.

Next, the process 8200 determines whether the RF generator 810 can make the predetermined power setpoint (PSETP) (step 8210). This step can be carried out by the sensor 8160 determining the RF output parameter and communicating this parameter to the control unit 8150. The control unit 8150 can then be programmed to determine the RF output power and whether it corresponds with the power setpoint. As used in this step, the term "make" refers to whether the RF output power can equal the power setpoint. The term make can also refer to exceeding the power setpoint, though such an occurrence is unlikely in such a system.

If the RF generator 810 can make the PSETP, the process 8200 next determines whether the maximum efficiency option (MAXEFF) has been turned ON (step 8212). If the maximum efficiency option (a further capability of the control algorithm) is not turned ON, then the process will determine whether the PDAC is greater than or equal to the PDACL (step 8214). The PDAC, discussed above, is sent by the control unit 8150 to the RF source 8105 and helps control how hard the RF amplifier 8100 is working to produce the desired RF output power. The PDACL is a predetermined limit on how hard the RF amplifier 8100 can be pushed.

If the PDAC has exceeded the PDACL, the process 8200 increases the DC voltage by a predetermined amount (DC-STEP) (step 8216). This can be carried out by the control unit 8150 sending such instructions to the DC source 8140. The increase of the DC voltage helps to ease the burden on the RF amplifier 8100, thereby decreasing the PDAC. The process then again determines whether the generator 810 can make the power setpoint (step 8210) and again determines whether the PDAC is greater than or equal to PDACL (step 8214). This process repeats until the PDAC is less than the PDACL. In alternative embodiments, the process can stop when the PDAC is less than or equal to the PDACL.

Once the PDAC is less than the PDACL, the process 8200 goes to point A, which requires determination of whether the power setpoint (PSETP) changed (step 8218). The power setpoint can change for a variety of reasons. For example, in a system 85 for the plasma processing of semiconductors, the system 85 will require different RF output powers at different stages of the processing. If the power setpoint has changed, the process returns to step 8204. If not, the process returns to step 8208.

Returning to the maximum efficiency option (MAXEFF), if this option is set to ON, the process again calculates and stores the power dissipation at the RF amplifier 8100 (PDISS) (step 8220). This calculation is carried out in a manner similar to that discussed with regard to step 8206.

The process 8200 then determines whether the New PDISS (calculated in step 8220) is less than the Old PDISS (calculated in step 8206) (step 8222) at the current voltage. The current voltage is sometimes referred to as the "intermediate voltage" if it is a voltage different from the initial voltage (DCSETP) and the final voltage. This step can be carried out by the control unit 8150. Several factors can cause the PDISS to change, such as a change to the load. If the New PDISS is less than the Old PDISS, then the power dissipation is increasing, and therefore the efficiency of the RF generator 810 is decreasing.

If it is determined that the New PDISS is not less than the Old PDISS (the New PDISS is greater than or equal to the Old PDISS), and therefore the PDISS is increasing, the process 8200 stops changing the DC voltage and becomes the final voltage. This step of the exemplified embodiment can enable the power dissipation to be a substantially minimum power dissipation (and therefore maximum efficiency) at which the output power is equal to the predetermined power setpoint.

The process 8200 then returns to point A and step 8218 of the process (step 8224). At those points in the exemplified embodiment when the process stops changing the DC voltage and returns to point A, the voltage is considered set at the final voltage. The final voltage is final in the sense that it is the DC voltage at which the DC source 8140 remains until the power setpoint (PSETP) or some other factor changes prompting a reassessment of the DC voltage and its effects, as occurs in step 8218. The term "final" does not mean that the voltage is permanent or cannot change. Note further that when the process determines whether a value is "less than" or "greater than" another value, in alternative embodiments this determination can be replaced with a determination of whether a value is "less than or equal to" or "greater than or equal to," respectively. Similarly, in alternative embodiments, "less than or equal to" and "greater than or equal to," can be replaced with "less than" and "greater than," respectively.

If it is determined that the New PDISS is less than the Old PDISS, the process 8200 determines whether the DC voltage is at its minimum (DCMIN) (step 8226). If it is, then the process stops changing the DC voltage and returns to point A and step 8218 of the process (step 8228).

If the DC voltage is not at its minimum (DCMIN), the 8200 process determines whether the DC voltage was increased at its most recent change (8230). The control unit 8150 can carry out this determination, where previous changes to the DC voltage are stored in a memory (not shown) connected to or part of the control unit 8150.

If it is determined that the DC voltage was increased at its most recent change (8230), then the process 8200 stops changing the DC voltage and returns to point A and step 8218 of the process (step 8232). If it is determined that the DC voltage was not increased at its most recent change (8230), then the DC voltage is decreased by DCSTEP (step 8234). The process then returns to step 8202 and determining whether the RF generator 810 can make the power setpoint at this newly decreased DC voltage. These steps of the exemplified embodiment enable the process to determine a substantially minimum DC voltage at which the output power is equal to the predetermined power setpoint.

If the RF generator 810 cannot make the power setpoint (PSETP), the process 8200 determines whether the RF amplifier's protection schemes have been enabled (step 8236). For example, a protection scheme can limit the voltage on the drain of a field-effect transistor (FET) in the generator 810. The voltage on the FET drain can be measured. If the measured drain voltage exceeds a predetermined value, the protection scheme can lower the RF output power to lower the drain voltage. This can prevent the generator 810 from failing, but can also reduce the RF output power below the requested power setpoint.

If it is determined that the RF amplifier's protection schemes have been enabled, the process 8200 proceeds to step 8226 and determines whether the DC voltage is at DC minimum. If it is determined that the RF amplifier's protection schemes have not been enabled, the process determines whether the PDAC is at its limit (PDACL), similar to step 8214 (step 8238). If it is not, the process returns to point A and step 8218 of the process.

If the PDAC is at its limit, the process 8200 determines whether the DC voltage is at its maximum (DCMAX) (step 8240). If it is, then the process stops changing the DC voltage and returns to point A and step 8218 of the process (step 8242). If the PDAC is not at its limit, the process increases the DC voltage by DCSTEP (step 8244) and then returns to step 8210 to determine whether the RF generator 810 can still make the power setpoint.

The foregoing DC control algorithm 8200 focuses on reducing dissipation. It can consider other factors, such as whether the RF generator can make the power setpoint (and increase the DC input to achieve the power setpoint) and whether the PDAC signal has reached its limit (and increase the DC input to ease the burden on the RF amplifier). But the exemplified DC algorithm does not directly control the RF signal sent by the RF source.

Such control of the RF signal can be exercised by a complementary RF control algorithm run by a control unit. Such an algorithm can, among other things, react to changes in the output power caused by changes to the DC input. The RF control algorithm can continuously monitor the output power, compare it to the power setpoint, and adjust the RF signal as necessary to enable the RF generator to achieve (or substantially achieve) the power setpoint. For example, if decreases to the DC input (caused by the DC algorithm) cause the output power to decrease below the power setpoint, the RF control algorithm can immediately recognize the discrepancy and increase the RF signal to enable the RF generator to achieve the power setpoint.

Figure 20:
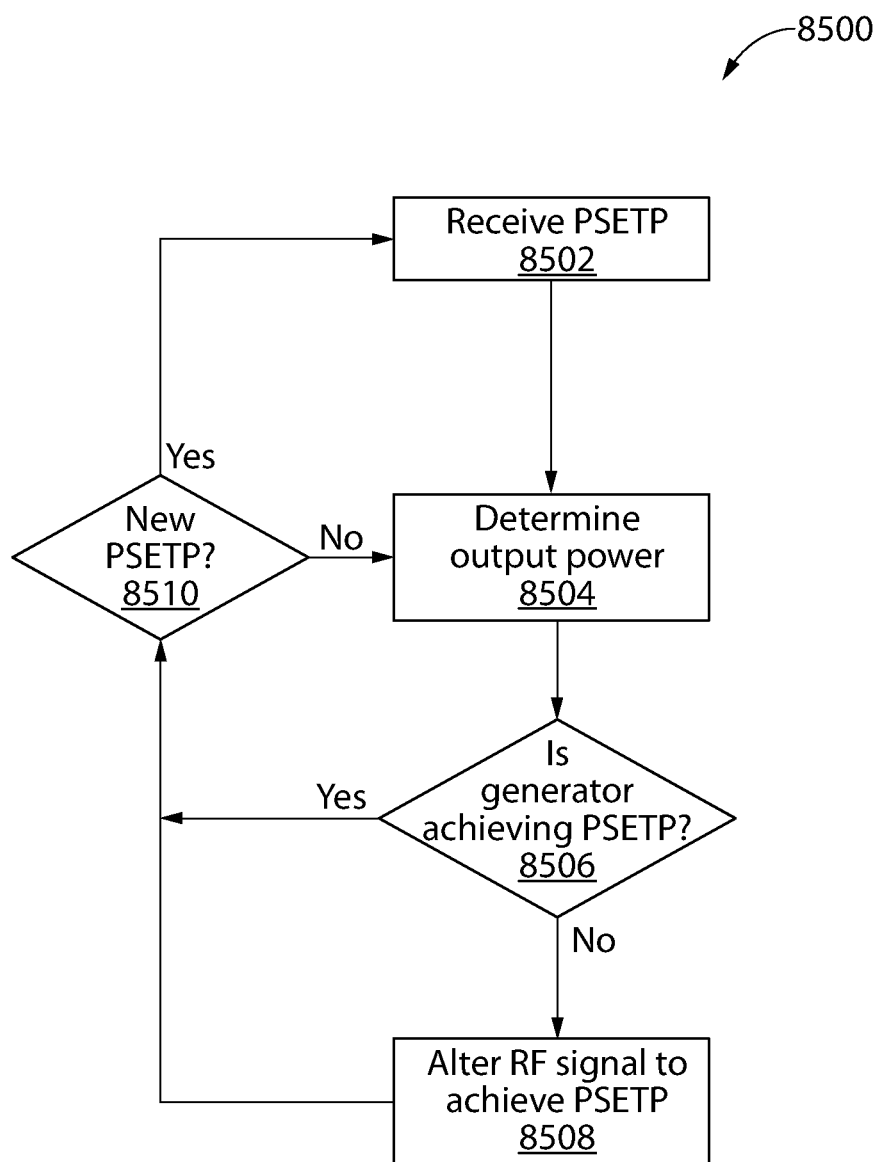
FIG. 20 is a flow chart of an embodiment of an RF control algorithm for an RF generator.

FIG. 20 shows a flow chart for an embodiment of an RF control algorithm 8500. The algorithm 8500 can receive the power setpoint (PSETP) (operation 8502). Further, the algorithm 8500 can determine the output power (operation 8504). For example, in the RF generator 810 of FIG. 18, control unit 8150 can use a sensor 8160 at the RF output 8120 to determine the output power. Further, the algorithm 8500 can determine whether the RF generator is achieving the PSETP (operation 8506).

If the RF generator is not achieving the PSETP, the algorithm 8500 can alter the RF signal to achieve the PSETP (operation 8508). This alteration can occur in a number of ways. In the exemplified embodiment, the RF signal is altered by altering the PDAC signal (discussed above) sent from the control unit to the RF source.

Various methods can be used to determine the required alteration of the RF signal to achieve the power setpoint. In the exemplified embodiment, the required alteration of the RF signal is calculated using a proportional-integral-derivative controller (PID controller). This PID controller uses the following equation to determine a control variable:

$$U = K_p E + K_i i_E + K_d d_E$$

In this equation, there are three configurable constants, namely, the proportional coefficient ($K_p$), the integral coefficient ($K_i$), and the derivative coefficient ($K_d$). In each step, error (E) is measured as the difference between the power setpoint and the actual output power. In each step, the algorithm also measures a difference ($d_E$) between the error in the previous step and the current error. The algorithm also adds errors to a sum ($i_E$). The control variable U indicates the amount of change required by the RF signal to enable the output power to substantially equal the power setpoint. In other embodiments, other means of determining the amount of signal modification can be used. For example, while the above PID controller is discrete, a continuous PID controller can be used. In other embodiments, an entirely different type of controller can be used.

Returning to FIG. 20, if, on the other hand, the RF generator is achieving the PSETP, the algorithm can determine whether there is a new PSETP (operation 8510). If so, the process can begin again, and if not, the algorithm can again determine the output power (operation 8504).

The exemplified RF control algorithm 8500 for controlling the RF signal runs separately from and in parallel to the exemplified DC control algorithm 8200 discussed above. In other embodiments, however, the algorithms for controlling the DC input and the RF signal (or portions thereof) can form part of a single algorithm operating together. Further, the algorithms can be run by the same or separate control units. Further, one or both algorithms can run continuously (e.g., every 100 μs). Further, the algorithms can be used together as part of a process for manufacturing semiconductors, or as part of another process utilizing an RF generator.

Controlling Plasma Chamber

As discussed above, the semiconductor device fabrication process uses plasma processing at different stages to make semiconductor devices. Plasma processing involves energizing a gas mixture by imparting energy to the gas molecules by introducing radio frequency (RF) energy into the gas mixture. This gas mixture is typically contained in a vacuum plasma chamber, and the RF energy is typically introduced into the plasma chamber through electrodes.

In a typical plasma process, the RF generator generates power at a radio frequency—which is broadly understood as being within the range of 3 kHz and 300 GHz—and this power is transmitted through RF cables and networks to the plasma chamber. In order to provide efficient transfer of power from the RF generator to the plasma chamber, an intermediary circuit is used to match the fixed impedance of the RF generator with the variable impedance of the plasma chamber. Such an intermediary circuit is commonly referred to as an RF impedance matching network, or more simply as an RF matching network.

In plasma applications, conditions can arise where voltage builds up within the plasma chamber such that an electric arc occurs inside the plasma chamber. The voltage buildup can occur between the electrodes or between any two surfaces within the plasma chamber. The electrical arc can result in damage to the surface of the material being processed or even cause damage to other surfaces inside the chamber. Methods have been employed to detect arcing and to either preventing arcing from occurring in the first place or to limit the damage caused by arcing, but these methods are slow and often fail to capture fast transients. Thus, there is need for a more reliable method of controlling the plasma chamber and the power provided thereto to prevent arcing and/or limit the damage caused by arcing.

Figure 21:
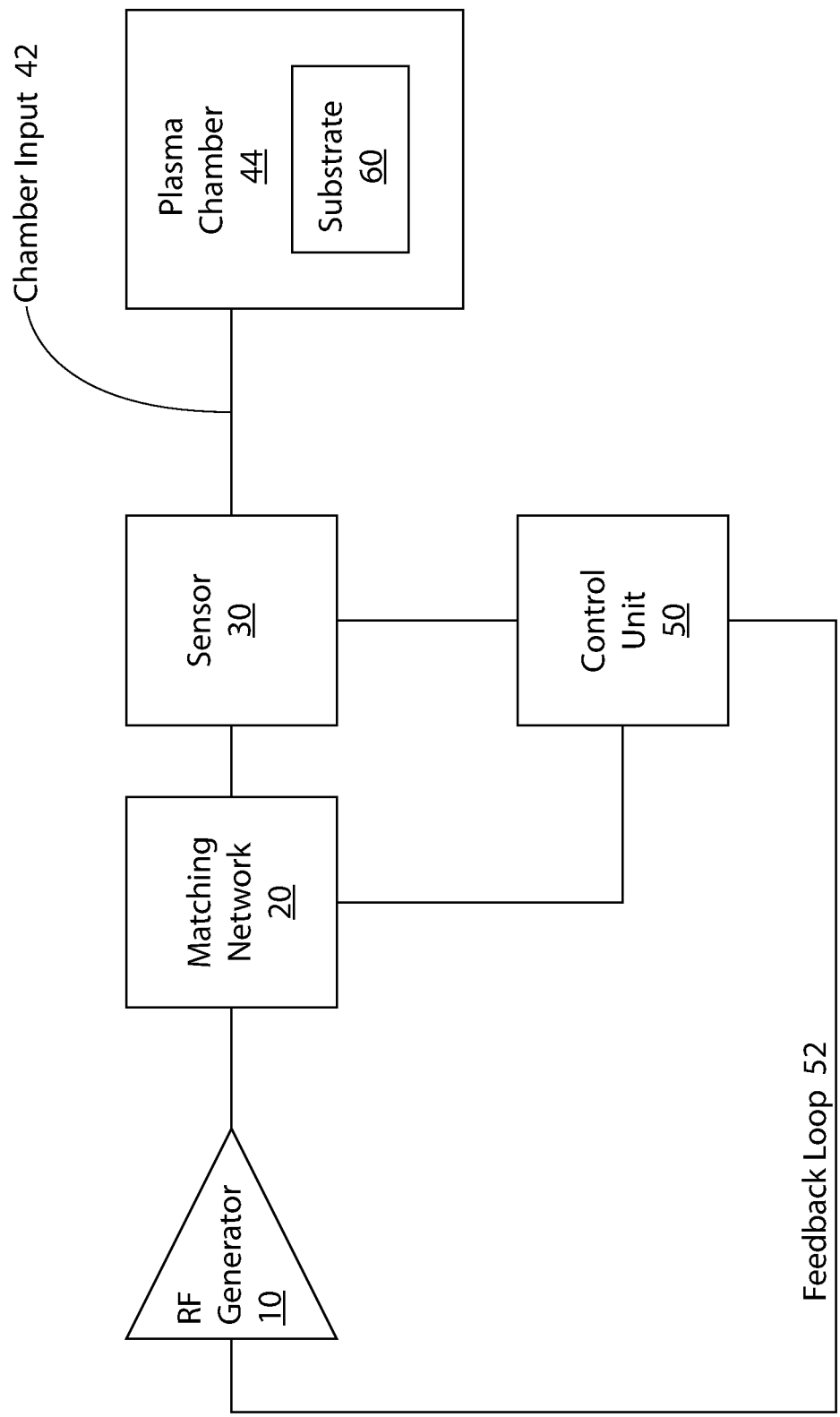
FIG. 21 is a block diagram of an embodiment of a system for controlling a plasma chamber.

Referring to FIG. 21, a block diagram of an embodiment of a system 5 for controlling a plasma chamber 44 is shown. In the exemplified embodiment, the plasma chamber 44 is configured to receive a substrate 60 for manufacturing a semiconductor. The semiconductor device can be a microprocessor, a memory chip, or other type of integrated circuit or device. The plasma chamber 44 can deposit a material layer onto the substrate 60 and/or etch a material layer from the substrate 60. While in the exemplified embodiment the plasma chamber 44 processes the substrate 60 for manufacture of a semiconductor device, in other embodiments, the plasma chamber 44 can be configured to process the surfaces of other devices, such as flat panel displays.

In the exemplified embodiment, the plasma chamber 44 is coupled to an RF generator 10. The RF generator 10 can be any device configured to generate an RF power that is provided to the plasma chamber 44 at chamber input 42. In the exemplified embodiment, the RF generator 10 includes an RF amplifier and a DC source. The RF amplifier can receive an RF signal at its RF input and a DC voltage at its DC input, and can output an RF power at its RF output. The RF amplifier uses the RF signal to modulate the power received at the DC input to provide an RF power that is higher than the power at the RF input. For manufacture of semiconductor devices, the RF power is typically within the range of 3 kHz and 300 GHz, though the invention is not so limited. The RF power can be transmitted through RF cables and networks to the plasma chamber 44.

In the exemplified embodiment, the RF power is transmitted to the plasma chamber 44 through an impedance matching network 20. The matching network 20 can help provide efficient transfer of power from the RF generator 10 to the plasma chamber 44. The matching network 20 can be any intermediary circuit used to help match the fixed impedance of the RF generator 10 with the variable impedance of the plasma chamber 44. Commonly owned U.S. patent application Ser. No. 14/669,568, the disclosure of which is incorporated herein by reference in its entirety, provides an example of such a matching network 20. In other embodiments, the matching network 20 can be omitted from the system 5.

The exemplified system 5 further includes a sensor or sensor component 30. The sensor 30 can be any device for measuring a parameter at the chamber input 42. The measured parameter can be any parameter (or parameters) measurable at the chamber input 42. In the exemplified embodiment, the sensor 30 detects the voltage and the current at the chamber input 42.

The exemplified system 5 further includes a control unit 50 that can be coupled to the sensor 30, matching network 20, and RF generator 10. In the exemplified embodiment, the control unit 50 can receive the sensor signal 301 from the sensor 30 and determine a phase angle between the voltage and the current of the RF signal. The control unit 50 can be configured to perform numerous other functions, which are described in more detail below.

The control unit 50 is configured with an appropriate processor and/or signal generating circuitry to provide signals for controlling the components of the system 5. In the exemplified embodiment, the control circuit 50 includes a processor. The processor may be any type of properly programmed processing device, such as a computer or microprocessor, configured for executing computer program instructions (e.g., code). The processor may be embodied in computer and/or server hardware of any suitable type (e.g. desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc. The processor of the exemplified embodiment is configured with specific algorithms to enable the system 5 to operate as described herein. The block diagrams of FIGS. 1 and 2 omit obvious components such as power supplies, as such components would be well known to a person of ordinary skill in the art.

Figure 22:
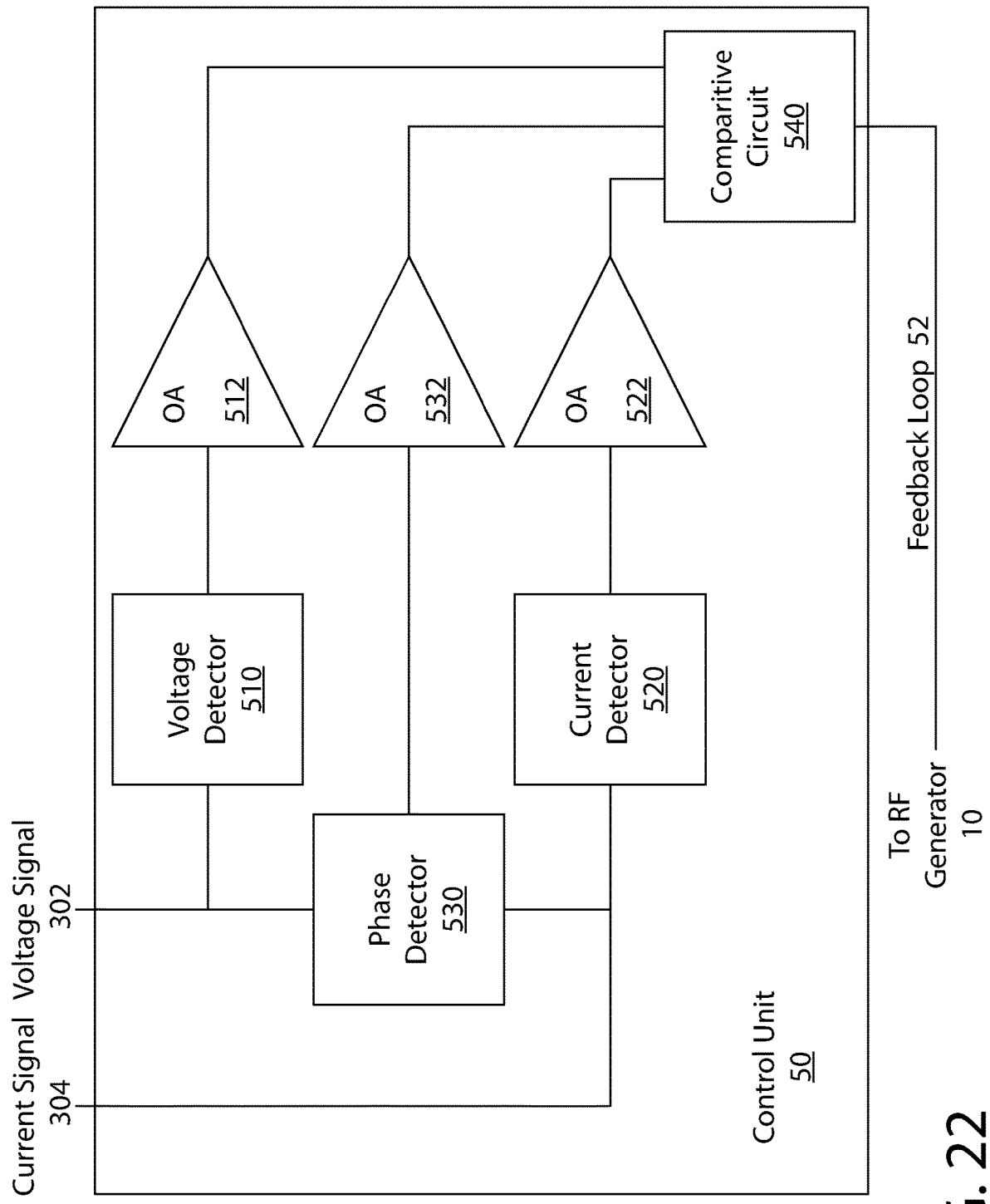
FIG. 22 is a block diagram of an embodiment of a control unit.

Referring now to FIG. 22, a block diagram of an embodiment of the control unit 50 is shown. The control unit 50 can be configured to receive a sensor signal 301 from the sensor 30, the sensor signal 301 being any signal or signals indicative of the measured parameter. In the exemplified embodiment, the sensor signal 301 includes two signals: (a) a voltage signal 302 (sometimes referred to as a first signal) that is indicative of the amplitude of the voltage of the RF signal at the chamber input 42 and (b) a current signal 304 (sometimes referred to as a second signal) that is indicative of the amplitude of the current of the RF signal at the chamber input 42.

The control unit 50 can include a voltage detector 510, a current detector 520, and a phase detector 530. The voltage detector 510 can receive the RF voltage signal 302 and convert it to an equivalent DC signal (the voltage DC signal). Similarly, the current detector 520 can receive the RF current signal 304 and convert it to an equivalent DC signal (the current DC signal). The phase detector 530 can receive both the RF voltage signal 302 and the RF current signal 304, determine the phase difference between the voltage and current, and output an equivalent DC signal (the phase DC signal).

The control unit 50 can further include operational amplifiers 512, 522, 532. These amplifiers can receive the DC signals from the voltage detector 510, current detector 520, and the phase detector 530 (the voltage DC signal, the current DC signal, and the phase DC signal), amplify these DC signals, and send the amplified DC signals to a comparative circuit 540.

The comparative circuit 540 can be any circuit capable of analyzing a measured parameter or a parameter based on the measured parameter. The analysis performed by the comparative circuit 540 of the control unit 50 will be discussed in further detail with regard to FIG. 23. Based on this analysis, the comparative circuit 540 can send a power control signal along a feedback loop 52 to the RF generator 10 to alter the power provided by the RF generator 10, thereby altering the power provided to the chamber input 42. In other embodiments, the feedback loop 52 and also (or alternatively) be coupled to the matching network 20 and can send a power control signal instructing the matching network 20 to alter the power provided to the chamber input 42. For example, if the matching network 20 used variable capacitors similar to those described in commonly owned U.S. patent application Ser. No. 14/669,568, one or more of the variable capacitors could alter its capacitance value to alter the RF signal provided at the chamber input 42. While the exemplified embodiment of FIG. 22 uses detectors, operational amplifiers, and a comparative circuit 540 to analyze the measured parameters, in other embodiments, alternative means can be used to perform this analysis.

Figure 23:
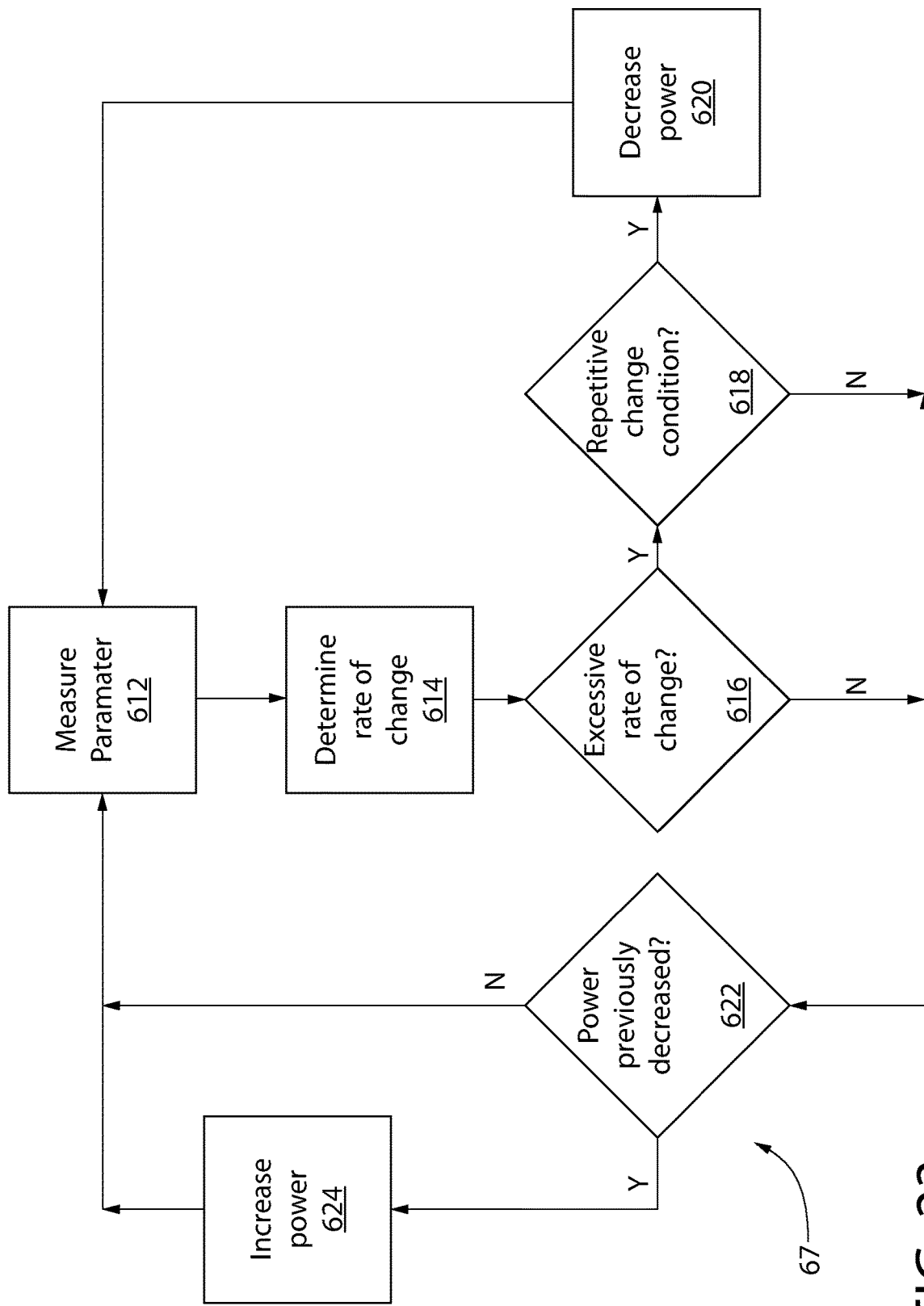
FIG. 23 is a flow chart of an embodiment of a method for controlling a plasma chamber.

Referring now to FIG. 23, a flow chart of an embodiment of a method 7 for controlling a plasma chamber 44 is shown. As indicated above, the sensor component 30 is configured to measure a parameter at the chamber input 42 and send a sensor signal 301 to the control unit 50, the sensor signal 301 indicative of the measured parameter (step 612). The measured parameter can be any parameter measurable at the chamber input 42. In the exemplified embodiment, the measured parameter is an amplitude of a voltage of the RF signal at the chamber input 42, and an amplitude of a current of the RF signal at the chamber input 42.

As plasma is ignited in a plasma chamber 44 by the introduction of RF power, the plasma characteristics change and the plasma presents a certain RF impedance at the chamber input 42. This impedance is a function of several parameters, including the amount of RF power delivered to the chamber, the type of gas in the chamber, the gas flow rate and the vacuum level in the chamber. As the voltages in the plasma rise to a sufficient level to cause an arc, the RF impedance presented at the chamber input 42 changes. As an arc occurs in the plasma chamber 44, it momentarily causes a short circuit in the local region in the plasma. This short circuit can result in one or more of the following: (a) an abrupt change in the amplitude of the RF voltage at the chamber input 42; (b) an abrupt change in the amplitude of the RF current at the chamber input 42; and (c) an abrupt change in the phase angle relationship between the RF voltage and RF current at the chamber input 42. Thus, such changes can be indicative of arcing in the plasma chamber 44.

Accordingly, the control unit 50 next determines a rate of change based on the measured parameter (step 614). The rate of change can be a rate of change of the measured parameter or a rate of change otherwise based on the measured parameter. In the exemplified embodiment, the control unit 50 determines the rate of change of the measured parameters (the voltage and current) and a rate of change of a parameter derived from the measured parameters (the phase angle). Specifically, the control unit 50 determines a rate of change of the amplitude of the voltage (the voltage rate of change), a rate of change of the amplitude of the current (the current rate of change), and a rate of change of the phase angle (the phase angle rate of change).

Next, the process detects an excessive rate of change condition (step 614). The excessive rate of change condition comprises the rate of change exceeding a reference rate of change. For example, in the exemplified embodiment, the control unit 50 determines the rate of change of the voltage (the voltage rate of change). The control unit 50 also receives a voltage reference rate of change, which is 1V/ms (or 1000V/s) in the exemplified embodiment. The voltage reference rate of change can represent a rate of change of the voltage that would not be regularly exceeded during normal (non-arcing) operation of the plasma chamber 44. Such reference rates of change can be used also for the current and phase angle, as well as for other measured parameters. In the exemplified embodiment, the excessive rate of change condition can comprise the voltage rate of change exceeding a reference voltage rate of change, the current rate of change exceeding a reference current rate of change, and/or the phase angle rate of change exceeding a reference phase angle rate of change. In other embodiments, other parameters and reference rates of change can be used.

Next, the process detects a repetitive change condition (step 618). The repetitive change condition can comprise a predetermined number of excessive rate of change conditions in a predetermined time. For example, in the exemplified embodiment, the control unit 50 monitors the voltage rate of change. The voltage rate of change will increase significantly when the RF generator 10 first begins providing an RF signal, or when the RF signal is discontinued, but these are isolated incidents. But if the voltage rate of change alters significantly several times over a predetermined period of time, this is indicative of arcing. The discussion of FIG. 24 provides an example of a repetitive change condition. In other embodiments, others predetermined numbers and predetermined times can be used based on the relevant system. In yet other embodiments, the repetitive change condition can be detected when the average rate of change over a predetermined time period exceeds a predetermined value.

If a repetitive change condition is detected, the process next decreases the power of the RF signal provided to the chamber input 42 (step 620), thereby reducing the voltage causing the arc. As discussed above, the control unit 50 can send a signal along a feedback loop 52 to the RF generator 10 and/or to the matching network 20 to alter the power provided to the chamber input 42). In other embodiments, the process can use alternative means to stop the occurrence of the arc in the chamber.

If an excessive rate of change condition is not detected (or a repetitive change condition was not detected), the process next determines whether the power was previously decreased (step 622). If it was not, the process returns to measuring the parameter (step 612). If, however, the power was previously decreased, and the repetitive change condition is no longer detected, the power can be increased back to the power used before the repetitive change condition was detected (step 624). In other embodiments, the process can use alternative means to alter the conditions at the chamber input 42 once arcing is no longer detected.

Referring now to FIG. 24, a graph showing evidence of arcing in a plasma chamber 44 is provided. The y-axis represents the voltage amplitude (in volts) of the RF signal at the chamber input 42. The x-axis represents time (in seconds). The graph shows two instances of the RF signal being turned ON and OFF, the first instance starting at approximately 5 seconds, and the second instance starting at approximately 45 seconds.

In the first instance (where there is no indication of arcing), the following occurs:

The RF signal is turned ON at approximately 5 seconds to 1V. It typically takes approximately 2 µs for the RF signal to increase from 0V to 1V. Thus, the voltage rate of change at this initial turning ON of the RF signal is 1V/2 µs or $5 \times 10^5$ V/s. In the exemplified embodiment, the reference rate of change is 1V/ms or 1000V/s.

Thus, the rate of change at turning ON exceeds the reference rate of change, thereby constituting an excessive rate of change condition.

Over the next 10 seconds of operation, the voltage gradually rises from 1V to 1.1V, corresponding to a rate of change of 0.1V/10s or 0.01 V/s ($1 \times 10^{-2}$ V/s). This rate of change is below the reference rate of change, and therefore would not constitute an excessive rate of change condition.

At 15 seconds, the voltage abruptly rises from 1.1V to 1.5V in approximately 2 µs. Thus, the rate of change at this stage is 0.4V/2 µs or $2 \times 10^5$ V/s. This abrupt rise in voltage can be due to many factors, such as a step in the plasma process requiring additional voltage. The rate of change is above the reference rate of change, and therefore would constitute an excessive rate of change condition.

Over the next 10 seconds of operation, the voltage gradually rises from 1.5 v to 1.55V, corresponding to a rate of change of 0.05V/10s or 0.005V/s ($5 \times 10^{-3}$ V/s). This rate of change is below the reference rate of change, and therefore would not constitute an excessive rate of change condition.

Finally, at 25 seconds the voltage abruptly decreases from 1.55V to 0V in approximately 2 µs due to the RF signal being turned OFF. Thus, the rate of change at this stage is 1.55V/2 µs or $7.75 \times 10^5$. The rate of change is above the reference rate of change, and therefore would constitute an excessive rate of change condition.

Thus, in the first instance of the RF signal being turned ON and OFF, there are three excessive rate of change conditions: when the RF signal is turned ON (at 5 seconds), when the voltage is deliberately increased (at 15 seconds), and when the RF signal is turned OFF (at 25 seconds). But these excessive rate of change conditions do not repeat in a short period of time, and therefore are not indicative of arcing. Specifically, in the exemplified embodiment, a repetitive change condition indicative of arcing is detected if four excessive rate of change conditions occur in 2 seconds. In this first instance, however, three excessive rate of change conditions occur over 20 seconds. Thus, the repetitive change condition is not met.

In the second instance of the RF signal being turned ON and OFF, there is indication of arcing. As with the first instance discussed above, there are three abrupt changes spaced 10 seconds apart: when the RF signal is turned ON (at approximately 45 seconds), when the voltage is increased (at approximately 55 seconds), and when the RF signal is turned OFF (at approximately 65 seconds). These are each excessive rate of change conditions that occur over approximately 20 seconds. Also similar to the first instance, there are gradual rates of changes between 45 and 50 seconds, and between 55 and 65 seconds.

At approximately 50 seconds, however, additional excessive rate of change conditions occur. They are shown in more detail in the expanded view provided in FIG. 24. As can be seen, there are three spikes that last approximately 3 milliseconds and are separated by approximately 6 milliseconds. Each spike has a rise and fall of 0.1V, each occurring over approximately 2 microseconds, thus corresponding with a rate of change of approximately 0.1V/2 µs or $0.5 \times 10^5$ V/s. Thus, each rise or fall constitutes an excessive rate of change. As stated previously, in the exemplified embodiment, an arc is detected if four excessive rate of change conditions occur in 2 seconds. In this example, there are six excessive rate of change conditions in approximately 21 milliseconds, and therefore a repetitive change condition is detected. Thus, the system can respond by lowering the voltage provided at the chamber input 42. In other embodiments, repetitive change condition can be found based on a different number of excessive rate of change conditions, or based on a different time duration. Note also that certain changes in the rate of change of a parameter can happen so quickly that the system may not identify it as an excessive rate of change condition. For example, when a spike occurs, the system may identify the rise in the rate of change, but not the fall. Regardless of whether each change is detected, the system can carry out the process of detecting rate of change conditions and excessive rate of change conditions to the best of its ability to control the plasma chamber.

Unlike some other processes that encounter arcing, when RF power is applied to a typical plasma chamber, the impedance of the plasma chamber can vary between essentially open and essentially short. When the plasma is not ignited, the impedance appears to be large (essentially open), and when the plasma is ignited, the impedance drops to almost a short. In such a system, where the impedance is typically varying between these ranges, the characteristics of the RF signal (such as voltage, current, and phase angle) are also changing very rapidly. Further, arcing in a plasma chamber occurs when the plasma is operating, so the plasma chamber is typically operating into low impedances. Determining a short condition from low impedances is difficult. For these reasons, it is not obvious to monitor a plasma chamber's rate of change of characteristics such as voltage, current, and phase angle. But as is shown above, with close monitoring of these characteristics, detection of arcing can be achieved.

While the inventions have been described with respect to specific examples including presently preferred modes of carrying out the inventions, those skilled in the art will appreciate that there are numerous variations and permutations of the above described systems and techniques. It is to be understood that other embodiments may be utilized and structural and functional modifications may be made without departing from the scope of the present inventions. Thus, the spirit and scope of the inventions should be construed broadly as set forth in the appended claims.

What is claimed is:

1. A radio frequency (RF) impedance matching circuit comprising:
    an RF input configured to operably couple to an RF source and to receive an RF signal at a first frequency from the RF source, the RF source having a fixed output impedance;
    an RF output configured to operably couple to a plasma chamber;
    a first electronically variable capacitor (EVC) coupled to the RF input to receive the RF signal from the RF source at the first frequency;
    a second EVC separate and distinct from the first EVC, the second EVC coupled to the RF input to receive the RF signal from the RF source at the first frequency, wherein the first EVC has two terminals, the second EVC has two terminals, and the two terminals of the first EVC are not both common to the two terminals of the second EVC; and a control circuit operably coupled to the first and second EVCs and configured to:
 determine a first parameter related to the plasma chamber, the matching circuit, or the RF source;
 determine, based on the first parameter, both:
  a first capacitance value or configuration (CVOC) for the first EVC; and
  a second CVOC for the second EVC; and
 generate one or more control signals to alter the first EVC to the first CVOC and the second EVC to the second CVOC;
wherein the alteration of the first EVC and the second EVC causes RF power reflected back to the RF source to decrease.

2. The RF impedance matching circuit of claim 1 wherein the first CVOC or the second CVOC is a capacitance value, the capacitance value being a numeric amount of capacitance.

3. The RF impedance matching circuit of claim 1:
wherein each of the first EVC and the second EVC comprises a plurality of fixed capacitors, each fixed capacitor having a corresponding switch to activate or deactivate the fixed capacitor; and
wherein the first CVOC or the second CVOC is a configuration, each configuration being indicative of an activated or deactivated state for each fixed capacitor.

4. The RF impedance matching circuit of claim 1 wherein the first EVC and the second EVC are not in parallel.

5. The RF impedance matching circuit of claim 1:
wherein the RF signal has a frequency; and
wherein the alteration of the first EVC and the second EVC causes RF power reflected back to the RF source to decrease while the first frequency of the RF signal from the RF source is not altered.

6. The RF impedance matching circuit of claim 1 wherein the determination of the first CVOC and the second CVOC comprises a determination that, of possible combinations of CVOCs for the first and second EVCs, the first CVOC and the second CVOC together are most likely to achieve an impedance match.

7. The RF impedance matching circuit of claim 1 wherein the alteration of the first EVC and the second EVC occur simultaneously.

8. The RF impedance matching circuit of claim 1 wherein the control circuit does not determine the first CVOC or the second CVOC based on an error value indicative of reflected power.

9. The RF impedance matching circuit of claim 1:
wherein the control circuit is further configured to repeat the determining the first and second CVOCs and generating the one or more control signals to alter the first and second EVCs to cause an impedance match; and
wherein the repeated determinations of the first and second CVOCs by the control circuit are not based on bringing an error signal indicative of reflected power to zero.

10. The RF impedance matching circuit of claim 1:
wherein the RF signal has a frequency;
wherein the alteration of the first EVC and the second EVC causes RF power reflected back to the RF source to decrease while the first frequency of the RF signal from the RF source is not altered; and
wherein the alteration of the first and second EVCs causes the RF power reflected back to the RF source to begin decreasing with 150 μsec of the determination of the first parameter.

11. The RF impedance matching circuit of claim 1:
wherein the RF signal has a frequency;
wherein the alteration of the first EVC and the second EVC causes RF power reflected back to the RF source to decrease while the first frequency of the RF signal from the RF source is not altered;
wherein the steps of determining the first and second CVOCs and generating the one or more control signals to alter the first and second EVCs are repeated to cause an impedance match; and
wherein the impedance match is caused in an elapsed time of 500 μsec or less.

12. The RF impedance matching circuit of claim 1:
wherein the second EVC comprises a plurality of fixed capacitors, each fixed capacitor having a corresponding switch to activate or deactivate the fixed capacitor; and
wherein each corresponding switch comprises a plurality of PiN or NiP diodes coupled in series.

13. The RF impedance matching circuit of claim 1 wherein the first parameter is determined using a look-up table.

14. The RF impedance matching circuit of claim 1 wherein the first parameter is a variable impedance of the plasma chamber.

15. The RF impedance matching circuit of claim 14 wherein the variable impedance of the plasma chamber is determined based on either a parameter detected by a sensor positioned at the RF input or a parameter detected by a sensor at the RF output.

16. The RF impedance matching circuit of claim 1 wherein the RF output is coupled directly to the plasma chamber.

17. The RF impedance matching circuit of claim 1 wherein there is no fixed impedance matching section coupled between the RF output and the plasma chamber.

18. A method for radio frequency (RF) impedance matching, the method comprising:
coupling an RF impedance matching circuit between an RF source having a fixed impedance and a plasma chamber, the matching circuit comprising:
 a first electronically variable capacitor (EVC) coupled to an RF input of the matching circuit to receive an RF signal from an RF source at a first frequency; and
 a second EVC separate and distinct from the first EVC, the second EVC coupled to the RF input to receive the RF signal from the RF source at the first frequency, wherein the first EVC has two terminals, the second EVC has two terminals, and the two terminals of the first EVC are not both common to the two terminals of the second EVC;
receiving, at the RF input of the matching circuit, the RF signal at the first frequency from the RF source;
determining a first parameter related to the plasma chamber, the matching circuit, or the RF source;
determining, based on the first parameter, both:
 a first capacitance value or configuration (CVOC) for the first EVC; and
 a second CVOC for the second EVC; and
generating one or more control signals to alter the first EVC to the first CVOC and the second EVC to the second CVOC;

wherein the alteration of the first EVC and the second EVC causes RF power reflected back to the RF source to decrease.

19. The method of claim 18 wherein the first CVOC or the second CVOC is a capacitance value, the capacitance value being a numeric amount of capacitance.

20. The method of claim 18:
wherein each of the first EVC and the second EVC comprises a plurality of fixed capacitors, each fixed capacitor having a corresponding switch to activate or deactivate the fixed capacitor; and
wherein the first CVOC or the second CVOC is a configuration, each configuration being indicative of an activated or deactivated state for each fixed capacitor.

21. The method of claim 18:
wherein the RF signal has a frequency; and
wherein the alteration of the first EVC and the second EVC causes RF power reflected back to the RF source to decrease while the frequency of the RF signal from the RF source is not altered.

22. The method of claim 18 wherein the determination of the first CVOC and the second CVOC comprises a determination that, of possible combinations of CVOCs for the first and second EVCs, the first CVOC and the second CVOC together are most likely to achieve an impedance match.

23. The method of claim 18 wherein the alteration of the first EVC and the second EVC occur simultaneously.

24. The method of claim 18 wherein the determination of the first CVOC and the second CVOC are not based on an error value indicative of reflected power.

25. The method of claim 18:
further comprising repeating the steps of determining the first and second CVOCs and generating the one or more control signals to alter the first and second EVCs to cause an impedance match; and
wherein the repeated determinations of the first and second CVOCs are not based on bringing an error signal indicative of reflected power to zero.

26. A semiconductor processing tool comprising:
a plasma chamber configured to deposit a material onto a substrate or etch a material from the substrate; and
an impedance matching circuit operably coupled to the plasma chamber, the matching circuit comprising:
an RF input configured to operably couple to an RF source and to receive an RF signal at a frequency from the RF source, the RF source having a fixed output impedance;
an RF output configured to operably couple to the plasma chamber;
a first electronically variable capacitor (EVC) coupled to the RF input to receiver the RF signal from the RF source at the first frequency;
a second EVC separate and distinct from the first EVC, wherein the first EVC, the second EVC coupled to the RF input to receive the RF signal from the RF source at the first frequency has two terminals, the second EVC has two terminals, and the two terminals of the first EVC are not both common to the two terminals of the second EVC; and
a control circuit operably coupled to the first and second EVCs and configured to:
determine a first parameter related to the plasma chamber, the matching circuit, or the RF source;
determine, based on the first parameter, both (a) a first capacitance value or configuration (CVOC) for the first EVC, and (b) a second CVOC for the second EVC; and
generate one or more control signals to alter the first EVC to the first CVOC and the second EVC to the second CVOC;
wherein the alteration of the first EVC and the second EVC causes RF power reflected back to the RF source to decrease.

27. The processing tool of claim 26 wherein the first CVOC or the second CVOC is a capacitance value, the capacitance value being a numeric amount of capacitance.

28. The processing tool of claim 26:
wherein each of the first EVC and the second EVC comprises a plurality of fixed capacitors, each fixed capacitor having a corresponding switch to activate or deactivate the fixed capacitor; and
wherein the first CVOC or the second CVOC is a configuration, each configuration being indicative of an activated or deactivated state for each fixed capacitor.

29. The processing tool of claim 26 wherein the first EVC and the second EVC are not in parallel.

30. The processing tool of claim 26:
wherein the RF signal has a frequency; and
wherein the alteration of the first EVC and the second EVC causes RF power reflected back to the RF source to decrease while the frequency of the RF signal from the RF source is not altered.

31. The processing tool of claim 26 wherein the determination of the first CVOC and the second CVOC comprises a determination that, of possible combinations of CVOCs for the first and second EVCs, the first CVOC and the second CVOC together are most likely to achieve an impedance match.

32. The processing tool of claim 26 wherein the alteration of the first EVC and the second EVC occur simultaneously.

33. The processing tool of claim 26 wherein the control circuit does not determine the first CVOC or the second CVOC based on an error value indicative of reflected power.

34. The processing tool of claim 26:
wherein the control circuit is further configured to repeat the determining the first and second CVOCs and generating the one or more control signals to alter the first and second EVCs to cause an impedance match; and
wherein the repeated determinations of the first and second CVOCs by the control circuit are not based on bringing an error signal indicative of reflected power to zero.

35. The processing tool of claim 26:
wherein the RF signal has a frequency;
wherein the alteration of the first EVC and the second EVC causes RF power reflected back to the RF source to decrease while the frequency of the RF signal from the RF source is not altered; and
wherein the alteration of the first and second EVCs causes the RF power reflected back to the RF source to begin decreasing with 150 μsec of the determination of the first parameter.

36. The processing tool of claim 26:
wherein the RF signal has a frequency;
wherein the alteration of the first EVC and the second EVC causes RF power reflected back to the RF source to decrease while the first frequency of the RF signal from the RF source is not altered;

wherein the steps of determining the first and second CVOCs and generating the one or more control signals to alter the first and second EVCs are repeated to cause an impedance match; and wherein the impedance match is caused in an elapsed time of 500 μsec or less.

37. The processing tool of claim 26:
wherein the second EVC comprises a plurality of fixed capacitors, each fixed capacitor having a corresponding switch to activate or deactivate the fixed capacitor; and
wherein each corresponding switch comprises a plurality of PiN or NiP diodes coupled in series.

38. The processing tool of claim 26 wherein the first parameter is determined using a look-up table.

39. The processing tool of claim 26 wherein the first parameter is a variable impedance of the plasma chamber.

40. The processing tool of claim 39 wherein the variable impedance of the plasma chamber is determined based on either a parameter detected by a sensor positioned at the RF input or a parameter detected by a sensor at the RF output.

41. The processing tool of claim 26 wherein the RF output is coupled directly to the plasma chamber.

42. The processing tool of claim 26 wherein there is no fixed impedance matching section coupled between the RF output and the plasma chamber.

* * * * *